(12) United States Patent
Chiu et al.

(10) Patent No.: US 12,349,413 B2
(45) Date of Patent: Jul. 1, 2025

(54) SEMICONDUCTOR DEVICE WITH OXIDE-BASED SEMICONDUCTOR CHANNEL

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Jih-Chao Chiu, New Taipei (TW); Song-Ling Li, Taoyuan (TW); Chee-Wee Liu, Taipei (TW)

(73) Assignees: TAIWAN SEMICONDUCTOR MANUFACTURING COMPANY, LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 385 days.

(21) Appl. No.: 17/829,773

(22) Filed: Jun. 1, 2022

(65) Prior Publication Data

US 2023/0395725 A1 Dec. 7, 2023

(51) Int. Cl.
| | |
|---|---|
| *H10D 30/67* | (2025.01) |
| *H01L 21/02* | (2006.01) |
| *H01L 21/465* | (2006.01) |
| *H10D 30/43* | (2025.01) |
| *H10D 62/10* | (2025.01) |
| *H10D 99/00* | (2025.01) |

(52) U.S. Cl.
CPC ... *H10D 30/6755* (2025.01); *H01L 21/02565* (2013.01); *H01L 21/02603* (2013.01); *H01L 21/02631* (2013.01); *H01L 21/465* (2013.01); *H10D 30/43* (2025.01); *H10D 30/6735* (2025.01); *H10D 30/6757* (2025.01); *H10D 62/121* (2025.01); *H10D 99/00* (2025.01)

(58) Field of Classification Search
CPC ........... H01L 29/42392; H01L 29/7869; H01L 21/02565
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |

(Continued)

OTHER PUBLICATIONS

Han et al., "First Demonstration of Oxide Semiconductor Nanowire Transistors: a Novel Digital Etch Technique, IGZO Channel, Nanowire Width Down to ~20 nm, and Ion Exceeding 1300 μA/μm", 2021 Symposium on VLSI Technology, IEEE, Total 3 pages.

(Continued)

*Primary Examiner* — Evren Seven
(74) *Attorney, Agent, or Firm* — Birch, Stewart, Kolasch & Birch, LLP

(57) ABSTRACT

A method includes forming a fin over a substrate, the fin comprising alternately stacking first oxide-based semiconductor layers and second oxide-based semiconductor layers, removing the second oxide-based semiconductor layers to form a plurality of spaces each between corresponding ones of the first oxide-based semiconductor layers, and depositing in sequence a gate dielectric layer and a gate metal into the plurality of spaces each between corresponding ones of the second oxide-based semiconductor layers.

20 Claims, 70 Drawing Sheets

(56) References Cited

U.S. PATENT DOCUMENTS

| | | |
|---|---|---|
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2020/0105751 A1* | 4/2020 | Dewey ............... H01L 21/8256 |

OTHER PUBLICATIONS

Kim et al., "Wet Chemical Etching of Zn-Containing Oxide and $HfO_2$ Films" Journal of The Electrochemical Society, 2010, vol. 157, No. 8, pp. D462-D465.

Min et al., "High-Performance Resistive Switching in Solution-Derived IGZO:N Memristors by Microwave-Assisted Nitridation", Nanomaterials, 2021, vol. 11, No. 1081, pp. 1-14.

Uhm et al., "A Two-Mask Process for Fabrication of Bottom-Gate IGZO-Based TFTs", IEEE Electron Device Letters, 2012, vol. 33, No. 4, pp. 543-545.

\* cited by examiner

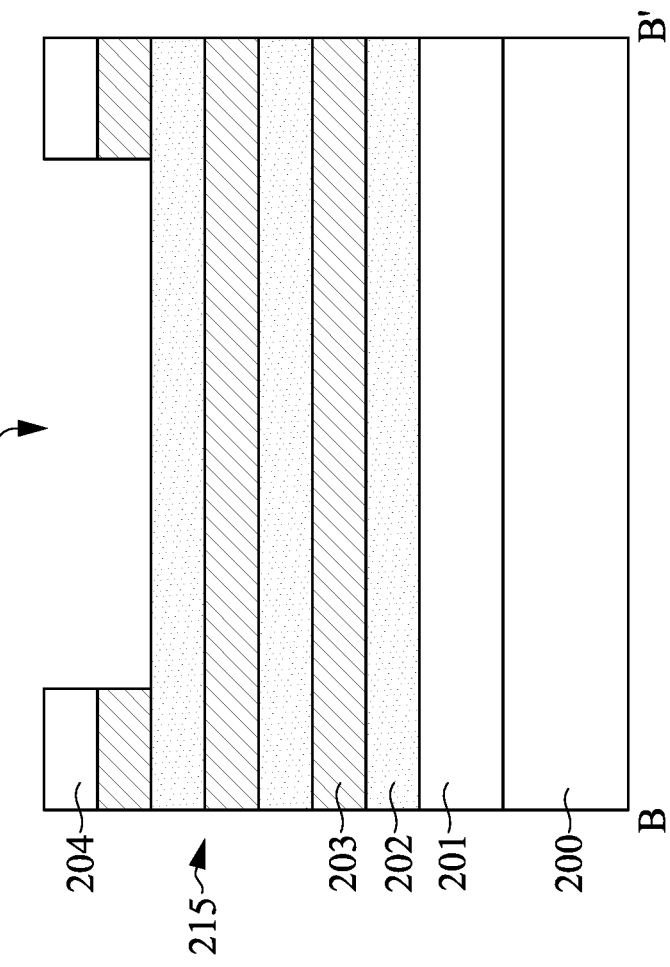
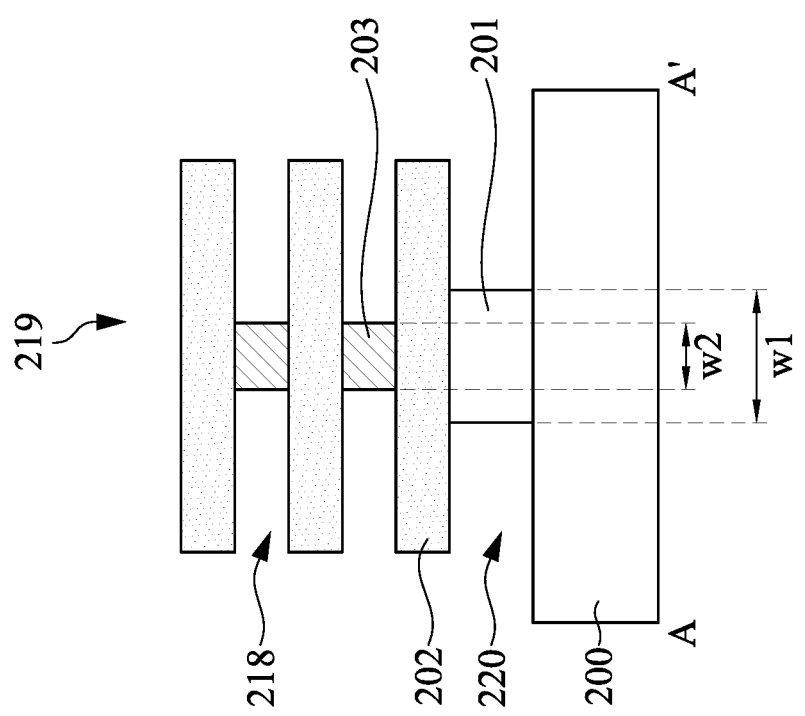
Fig. 22C
Fig. 22B

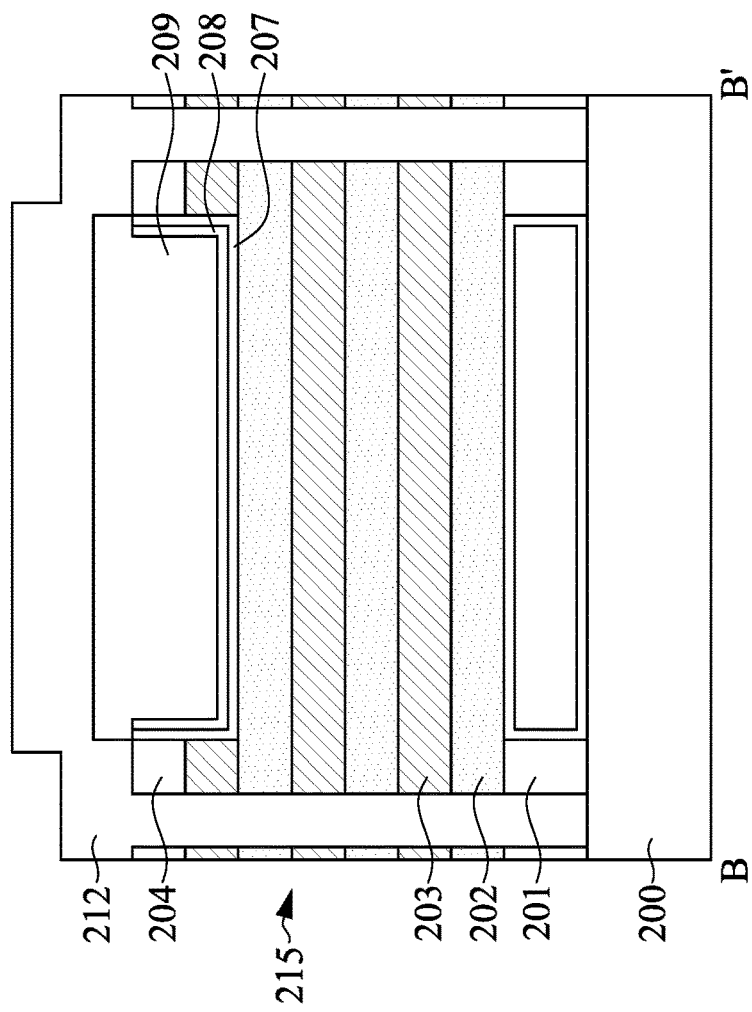
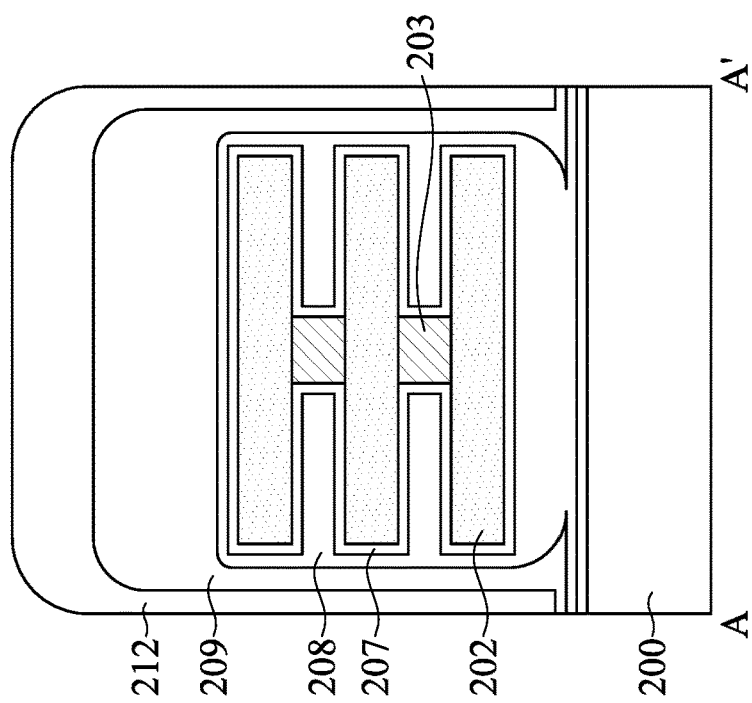
Fig. 33C
Fig. 33B

SEMICONDUCTOR DEVICE WITH OXIDE-BASED SEMICONDUCTOR CHANNEL

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 17B, 18B, 19B, 20B, 21B, 22B, 23B, 24B, 25B, 26B, 27B, 28B, 29B, 30B, 31B, 32B, 33B, 34B and 35B are cross-sectional views at intermediate fabrication stages, illustrating reference cross-section A-A' that extends through a gate region along a longitudinal axis of the gate region.

FIGS. 22C, 26C, 27C, 28C, 29C, 30C, 31C, 32C, 33C, 34C and 35C are cross-sectional views at intermediate fabrication stages, illustrating reference cross-section B-B' that extends through a fin along a longitudinal axis of the fin.

DETAILED DESCRIPTION

Figure 1A:
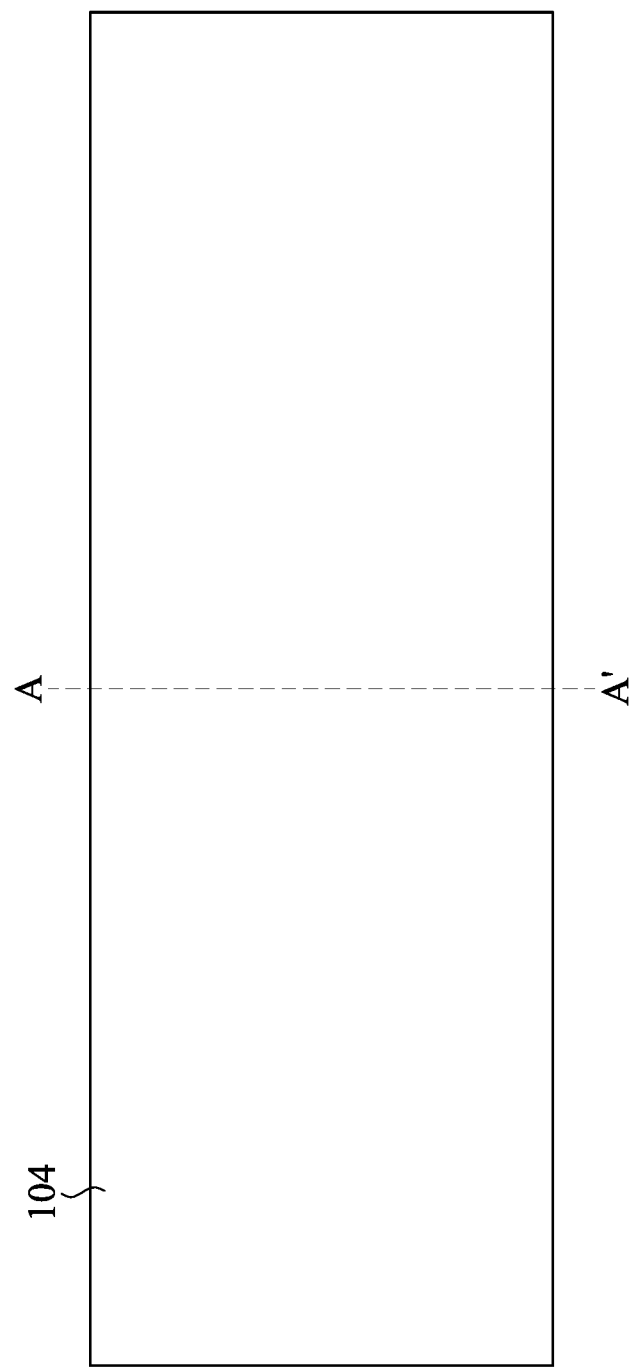
FIGS. 1A, 2A, 3A, 4A, 5A, 6A, 7A, 8A, 9A, 10A, 11A, 12A, 13A, 14A, 15A and 16A are top views of a GAA-FET (field-effect transistor) at intermediate fabrication stages in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 230 degrees or at other orientations) and the spatially relative descriptors used herein may likewise be interpreted accordingly. As used herein, "around," "about," "approximately," or "substantially" may generally mean within 20 percent, or within 10 percent, or within 5 percent of a given value or range. Numerical quantities given herein are approximate, meaning that the term "around," "about," "approximately," or "substantially" can be inferred if not expressly stated.

The present disclosure is generally related to integrated circuit (IC) structures and methods of forming the same, and more particularly to fabricating gate-all-around (GAA) transistors having semiconductor oxide-based channel layers. The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

It is also noted that the present disclosure presents embodiments in the form of multi-gate transistors. Multi-gate transistors include those transistors whose gate structures are formed on at least two-sides of a channel region. These multi-gate devices may include a p-type metal-oxide-semiconductor device or an n-type metal-oxide-semiconductor device. Specific examples may be presented and referred to herein as FinFET (field-effect transistor), on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), nanowire channel(s), and/or other suitable channel configuration. Presented herein are embodiments of devices that may have one or more channel regions (e.g., nanosheets) associated with a single, contiguous gate structure. However, one of ordinary skill would recognize that the teaching can apply to a single channel (e.g., single nanosheet) or any number of channels. One of ordinary skill may recognize other examples of semiconductor devices that may benefit from aspects of the present disclosure.

As scales of the fin width in fin field effect transistors (FinFET) decreases, channel width variations might cause mobility loss. GAA transistors, such as nanosheet transistors are being studied as an alternative to fin field effect transistors. In a nanosheet transistor, the gate of the transistor is made all around the channel (e.g., a nanosheet channel or a nanowire channel) such that the channel is surrounded or encapsulated by the gate. Such a transistor has the advantage of improving the electrostatic control of the channel by the gate, which also mitigates leakage currents.

The processing temperature of the channel depends on the material thereof. As compared to polysilicon channel layer, semiconductor oxide-based channel layer and amorphous silicon channel layer have lower processing temperature and thus are easier to fabricate back-end transistors over front-end transistors (e.g., lowermost CMOS transistors formed on substrate) without negatively influencing the front-end structures. As a result, transistors can be formed to "stack" in multiple tiers as a monolithic three-dimensional (3D) IC, wherein transistors in the bottom tier are CMOS transistors with semiconductor channels (e.g., elementary semiconductor, compound semiconductor, and/or alloy semiconductor), and transistors in upper tiers above the bottom tier are transistors with semiconductor oxide-based channels. The transistors with semiconductor oxide-based channel can be integrated at arbitrary metal levels in CMOS back-end-of-line (BEOL) platform. In particular, the semiconductor oxide-based channel layer has mobility higher than mobility of the amorphous silicon channel layer and has high uniformity. The channel layer affects an on-current ($I_{on}$) of the transistors. By using semiconductor oxide-based channel layer, GAA transistors can have an increased on-current. Therefore, the present disclosure in various embodiments forms GAA transistors with channel layers made of semiconductor oxide-based material. For example, the channel layer is indium gallium zinc oxide (IGZO), IGZO doped with nitrogen, ZnO, InAlZnO or $In_2O_3$.

FIGS. 1A, 2A, 3A, 4A, 5A, 6A, 7A, 8A, 9A, 10A, 11A, 12A, 13A, 14A, 15A and 16A are top views of a GAA-FET 10 (field-effect transistor) at intermediate fabrication stages in accordance with some embodiments and further illustrates a reference cross-section A-A' that is used in later figures. Cross-section A-A' is along a longitudinal axis of a gate metal and in a first direction, for example, perpendicular to the direction of current flow between the epitaxial source/drain regions of the GAA-FET. FIGS. 1B, 2B, 3B, 4B, 5B, 6B, 7B, 8B, 9B, 10B, 11B, 12B, 13B, 14B, 15B and 16B are cross-sectional views at intermediate fabrication stages, illustrating reference cross-section A-A'. FIGS. 6C, 7C, 8C, 9C, 10C, 11C, 12C, 13C, 14C, 15C and 16C are cross-sectional views at intermediate fabrication stages, illustrating reference cross-section B-B' that extends through a fin along a longitudinal axis of the fin.

Some embodiments discussed herein are discussed in the context of GAA-FET 20 formed using a gate-last process. In other embodiments, a gate-first process may be used. Also, some embodiments contemplate aspects used in planar devices, such as planar FETs or in FinFETs.

Figure 1B:
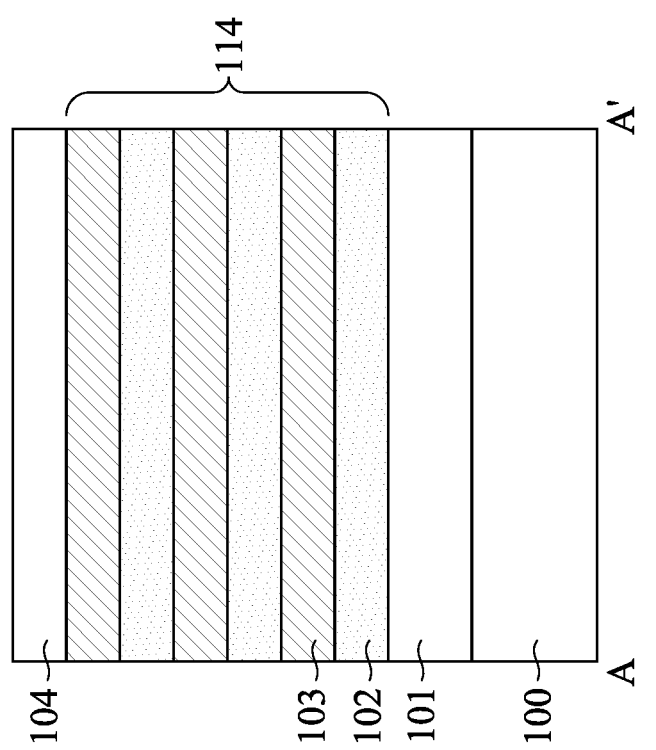
FIGS. 1B, 2B, 3B, 4B, 5B, 6B, 7B, 8B, 9B, 10B, 11B, 12B, 13B, 14B, 15B and 16B are cross-sectional views at intermediate fabrication stages, illustrating reference cross-section A-A' that extends through a gate region along a longitudinal axis of the gate region.

In FIGS. 1A-1B, a substrate 100 is provided. The substrate 100 may be a semiconductor substrate, such as a bulk semiconductor, a semiconductor-on-insulator (SOI) substrate, or the like, which may be doped (e.g., with a p-type or an n-type dopant) or undoped. The substrate 100 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 100 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

In some embodiments, the substrate 100 will go through a variety of cleaning, layering, patterning, etching and doping steps before forming subsequent semiconductor devices. The term "substrate" herein can be referred to a bulk substrate on which various layers and device elements are formed. In some embodiments, the bulk substrate includes, for example, silicon or a compound semiconductor, such as GaAs, InP, SiGe, or SiC. Examples of the layers include dielectric layers, doped layers, polysilicon layers or conductive layers. Examples of the device elements include transistors, resistors, and/or capacitors, which may be interconnected through an interconnect layer to additional integrated circuits.

At least one region in the substrate 100 may be used to form devices, such as logic devices. For example, the at least one region can be for forming n-type devices, such as NMOS (n-type metal oxide semiconductor) transistors, e.g., n-type GAA-FETs, or be for forming p-type devices, such as PMOS (p-type metal oxide semiconductor) transistors, e.g., p-type GAA-FETs.

A sacrificial layer 101, a multi-layer stack 114 and a capping layer 104 are formed over the substrate 100 in sequence. The sacrificial layer 101 may include silicon oxide and has a thickness in a range from 1 nm to 1 μm. The multi-layer stack 114 includes alternating layers of first metal oxide-based semiconductor layers 102 and second metal oxide-based semiconductor layers 103. For purposes of illustration and as discussed in greater detail below, the second metal oxide-based semiconductor layers 103 will be removed and the first metal oxide-based semiconductor layers 102 will be patterned to form channel regions of GAA-FETs. In some embodiments, the first metal oxide-based semiconductor layers 102 and the second metal oxide-based semiconductor layers 103 may each have a thickness in a range from 1 nm to 1 μm.

The multi-layer stack 114 is illustrated as including three layers of each of the first metal oxide-based semiconductor layers 102 and the second metal oxide-based semiconductor layers 103 for illustrative purposes, not intending to be limiting. In some embodiments, the multi-layer stack 114 may include any number of the first metal oxide-based semiconductor layers 102 and the second metal oxide-based semiconductor layers 103. For example, the numbers of the first metal oxide-based semiconductor layers 102 and the second metal oxide-based semiconductor layers 103 can be from 1 to 100. Each of the layers of the multi-layer stack 114 may be grown using a process such as sputtering, chemical vapor deposition (CVD), solution deposition, or atomic layer deposition (ALD). In various embodiments, the first metal oxide-based semiconductor layers 102 may be formed of a semiconductor material suitable for serving as channel regions of GAA-FETs.

The first metal oxide-based semiconductor layers 102 have an etch selectivity different from the second metal oxide-based semiconductor layers 103 and the sacrificial layer 101. As such, the second metal oxide-based semiconductor layers 103 and the sacrificial layer 101 may be removed without significantly removing the first metal oxide-based semiconductor layers 102, thereby allowing the first metal oxide-based semiconductor layers 102 to serve as channel regions of GAA-FETs. In some embodiments, the first metal oxide-based semiconductor layers 102 include a first metal oxide-based semiconductor material, such as InGaZnO (IGZO) doped with nitrogen, InGaZnO, InAlZnO, ZnO, $In_2O_3$, or the like. In some embodiments, the second metal oxide-based semiconductor layers 103 include a second metal oxide-based semiconductor material, such as InGaZnO, InAlZnO, ZnO, $In_2O_3$, InZnO (IZO), or the like. In some other embodiments, the second metal oxide-based semiconductor layers 103 can be replaced with $SiO_2$. In some embodiments, the sacrificial layer 101, the first metal oxide-based semiconductor layers 102 and the second metal oxide-based semiconductor layers 103 are amorphous layers. The amorphous metal oxide-based semiconductor has no grain boundary and has high mobility as compared to amorphous silicon and high uniformity. For example, the amorphous IGZO may have mobility in a range from 1 $cm^2$/V-s to 100 $cm^2$/V-s, such as 20 $cm^2$/V-s. The deposition temperatures of the first and second metal oxide-based semiconductor layers 102 and 103 are in a range from 100 K to 1000 K. Due to the low deposition temperatures thereof; the metal oxide-based semiconductor layers 102, 103 can be deposited over front-end transistors with no or negligible impact on front-end transistors.

In some embodiments, the first metal oxide-based semiconductor layers 102 include amorphous IGZO doped with nitrogen, and the second metal oxide-based semiconductor layers 103 include amorphous IGZO with no nitrogen or less nitrogen concentration than the first metal oxide-based semiconductor layers 102. The nitrogen concentration difference results in etch rate difference between the first metal oxide-based semiconductor layers 102 and the second metal oxide-based semiconductor layers 103. For example, the second metal oxide-based semiconductor layers 103 without nitrogen or with less nitrogen concentration than the first metal oxide-based semiconductor layers 102 can be etched at a faster etch rate than the first metal oxide-based semiconductor layers 102 in a subsequent channel release process.

In some embodiments where the first metal oxide-based semiconductor layers 102 are made of IGZO doped with nitrogen, the first metal oxide-based semiconductor layers 102 may be formed using a sputtering method by sputtering IGZO in an $Ar/O_2/N_2$ gas mixture ambient. In some embodiments where the second metal oxide-based semiconductor layers 103 are made of IGZO, the second metal oxide-based semiconductor layers 103 may be formed using a sputtering method by sputtering IGZO in an $Ar/O_2$ gas mixture ambient.

In some other embodiments where the first metal oxide-based semiconductor layers 102 are made of IGZO, the second metal oxide-based semiconductor layers 103 are made of ZnO or IZO. The material difference from IGZO results in an etch rate difference between the first metal oxide-based semiconductor layers 102 and the second metal oxide-based semiconductor layers 103. For example, ZnO or IZO can be etched at a faster etch rate than IGZO, so that the second metal oxide-based semiconductor layers 103 can be etched at a faster etch rate than the first metal oxide-based semiconductor layers 102 in a subsequent channel release process. In some embodiments, the capping layer 104 may include SiN and have a thickness in a range from 1 nm to 1 μm.

Figure 2A:
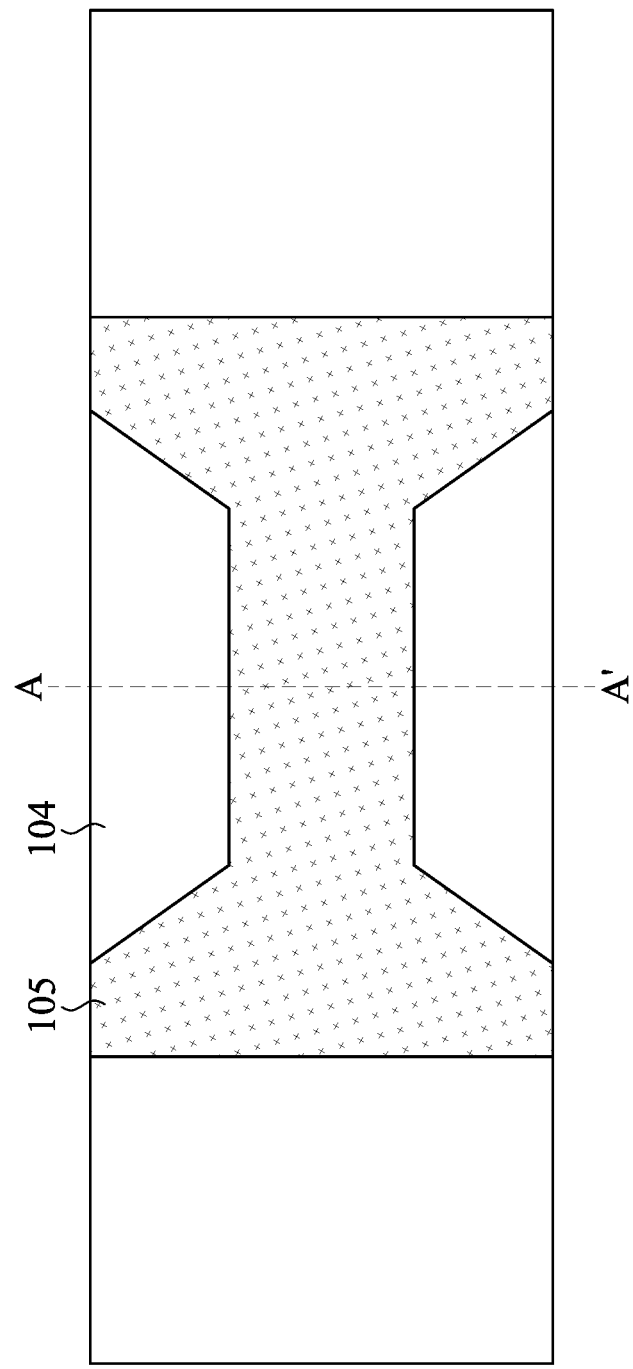
Figure 2B:
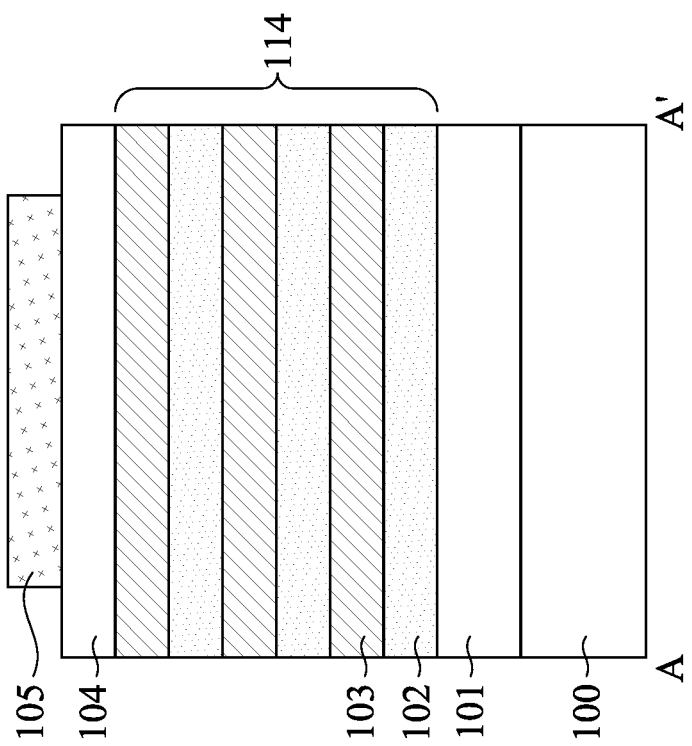

Referring to FIGS. 2A-2B, a photoresist 105 or other masks including $SiN_x$ (not separately illustrated) is formed over the capping layer 104. The photoresist 105 can be formed by using a spin-on technique and can be patterned using acceptable photolithography techniques.

Figure 3A:
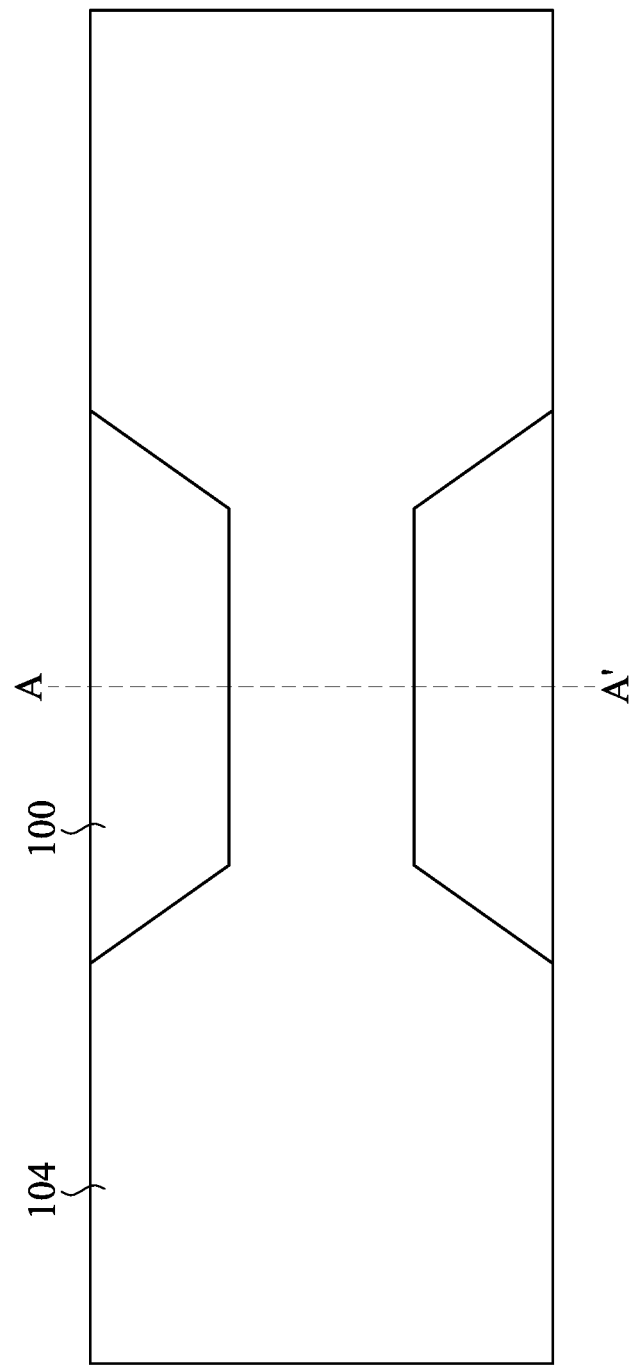
Figure 3B:
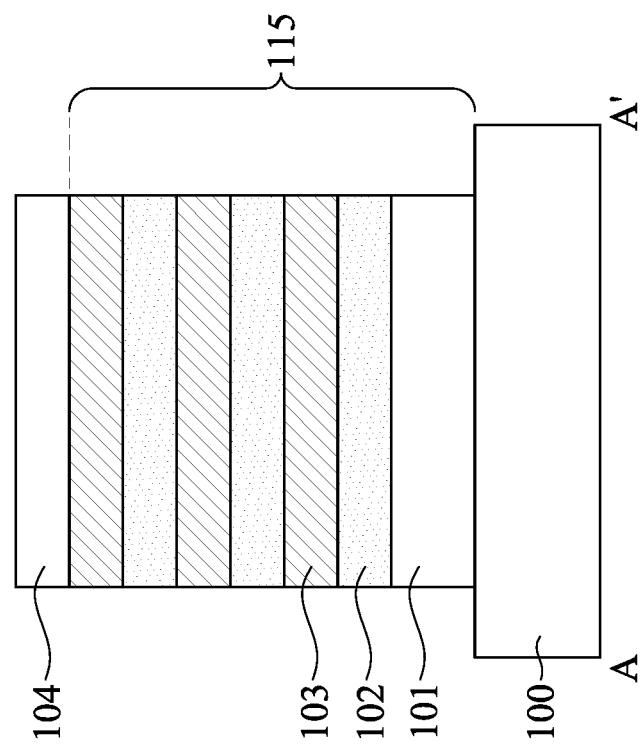

Referring now to FIGS. 3A-3B, a fin structure 115 is formed in the multi-layer stack 114 and the sacrificial layer 101 by etching trenches in the multi-layer stack 114 and the sacrificial layer 101. In an alternative embodiment, the fin structure 115 may be formed in the substrate 100. The etching may be any acceptable etch process, such as a reactive ion etch (RIE), neutral beam etch (NBE), the like, or a combination thereof. The etching may be anisotropic. After forming the fin structure 115, the photoresist 105 may be removed, such as by an acceptable ashing process.

The fin structure 115 may be patterned by any suitable method. For example, the fin structures 115 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures 115.

Further, while the fin structure 115 is illustrated as having a consistent width throughout, in other embodiments, the fin structure 115 may have tapered sidewalls such that a width of the fin structure 115 continuously increases in a direction towards the substrate 100. In such embodiments, the fin structure 115 may have a different width and be trapezoidal in shape.

Figure 4A:
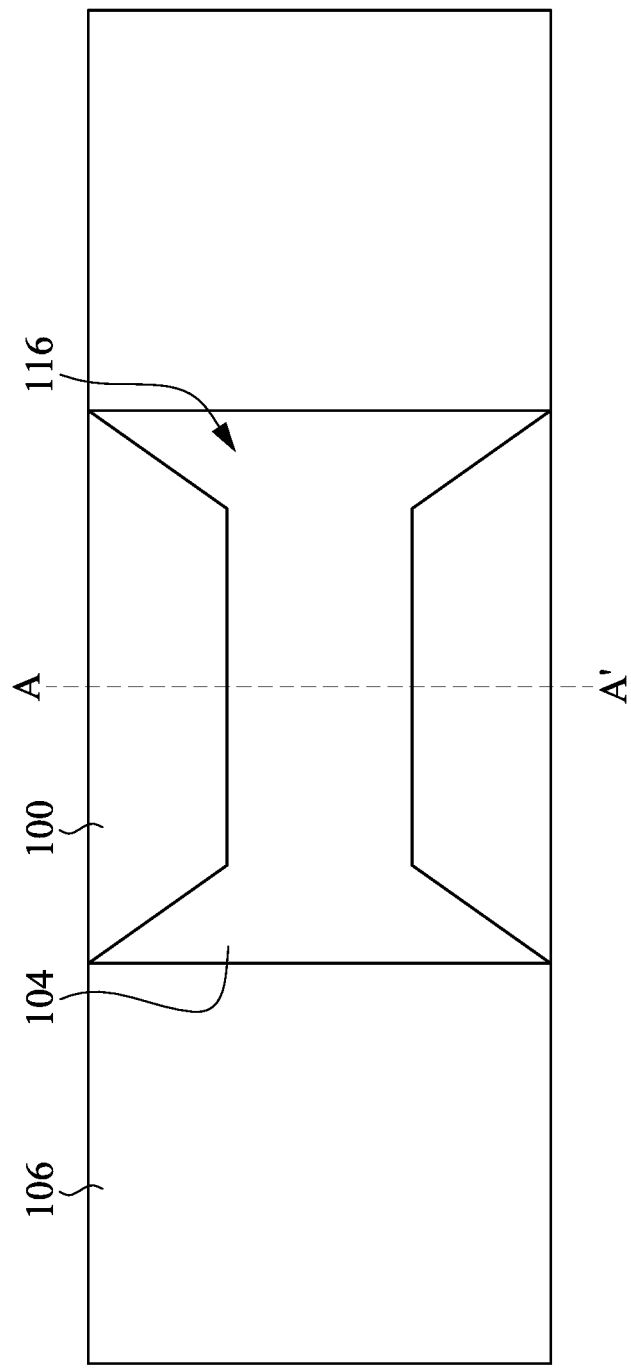
Figure 4B:
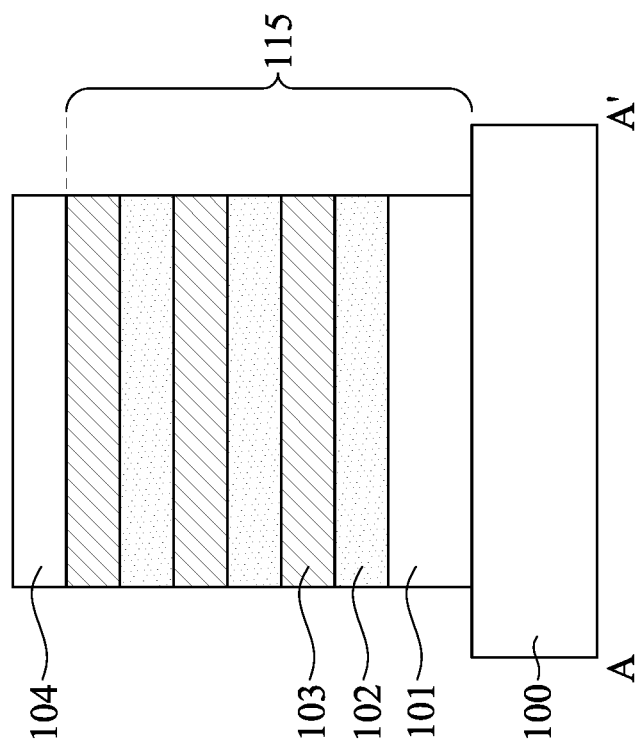

Referring to FIGS. 4A-4B, a photoresist 106 or other masks including $Si_x$ (not separately illustrated) is formed over the capping layer 104. The photoresist 105 can be formed by using a spin-on technique and can be patterned using acceptable photolithography techniques, forming an opening 116 in the photoresist 106.

Figure 5A:
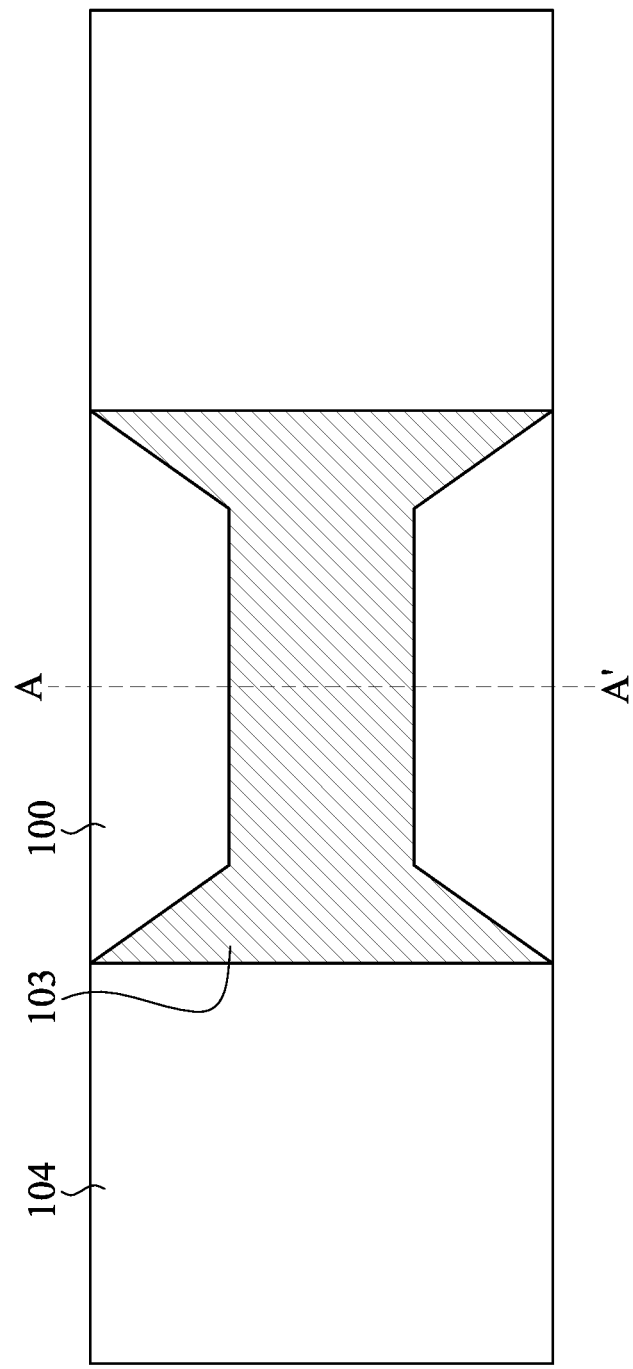
Figure 5B:
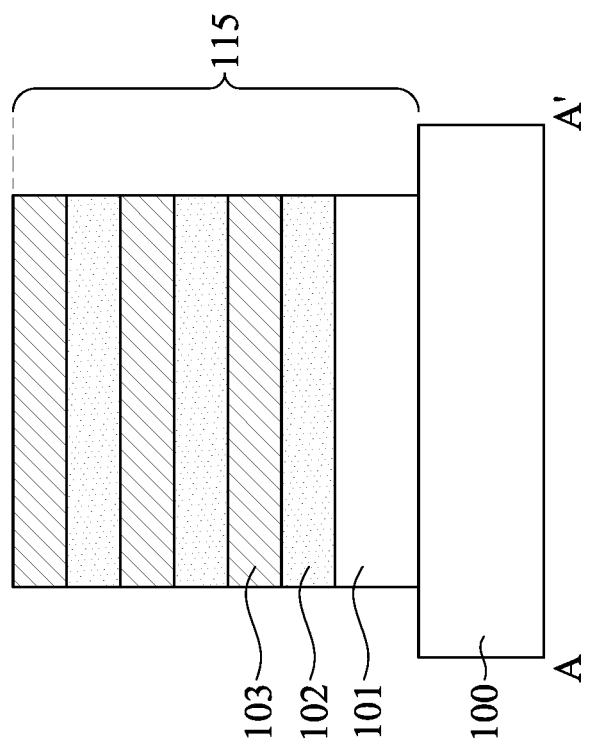

In FIGS. 5A-5B, the capping layer 104 is etched through the opening 116 in the photoresist 106 to expose the underlying fin structure 115. After etching the capping layer 104, the photoresist 106 may be removed, such as by an acceptable ashing process.

Figure 6A:
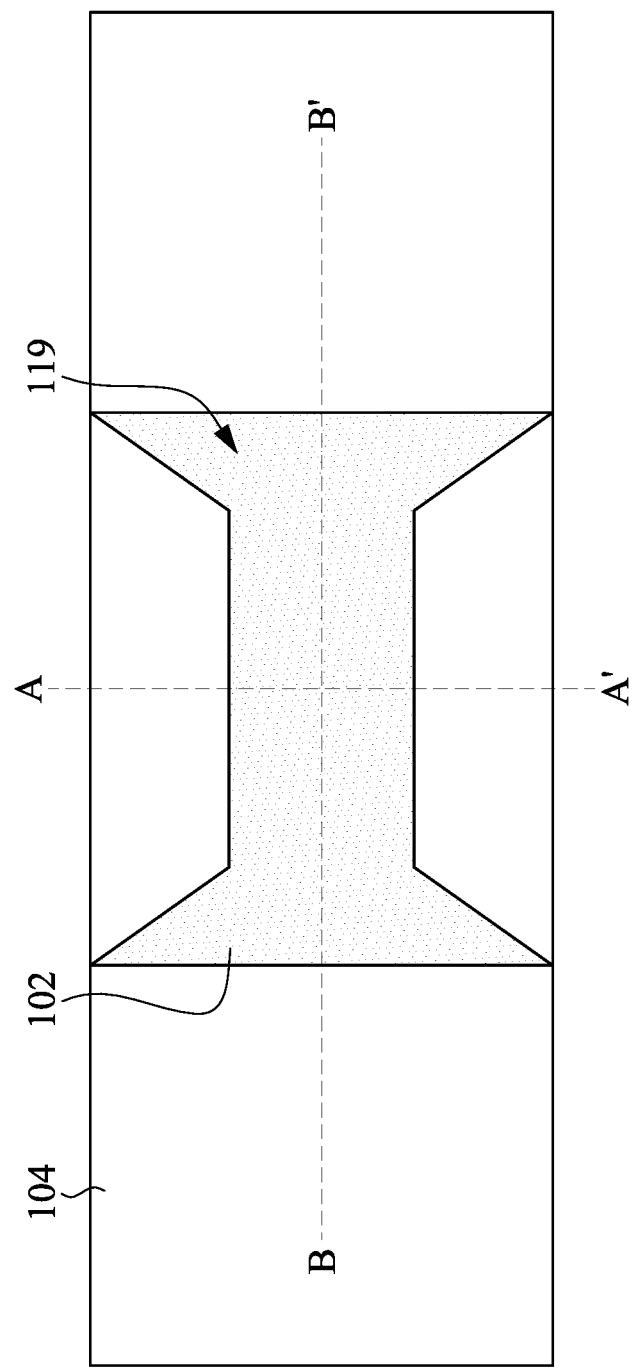
Figure 6C:
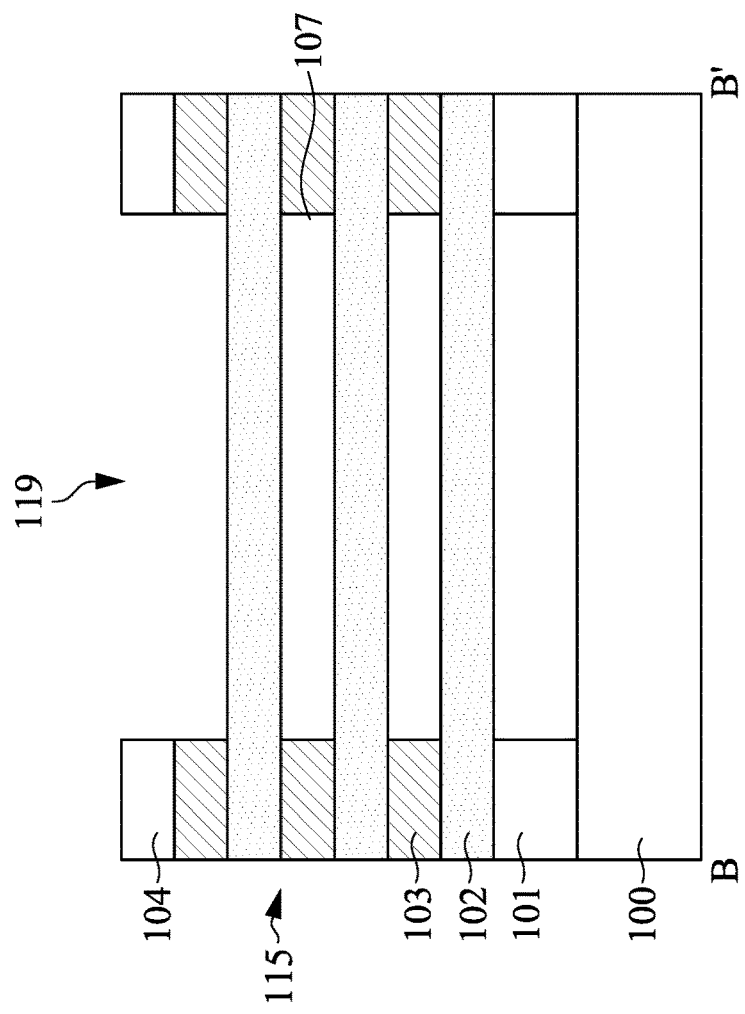
FIGS. 6C, 7C, 8C, 9C, 10C, 11C, 12C, 13C, 14C, 15C and 16C are cross-sectional views at intermediate fabrication stages, illustrating reference cross-section B-B' that extends through a fin along a longitudinal axis of the fin.
Figure 6B:
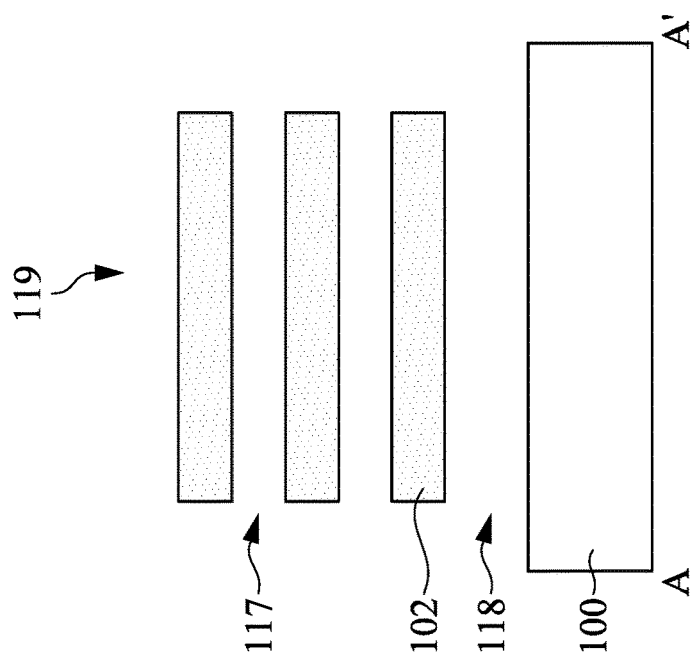
Figure 7A:
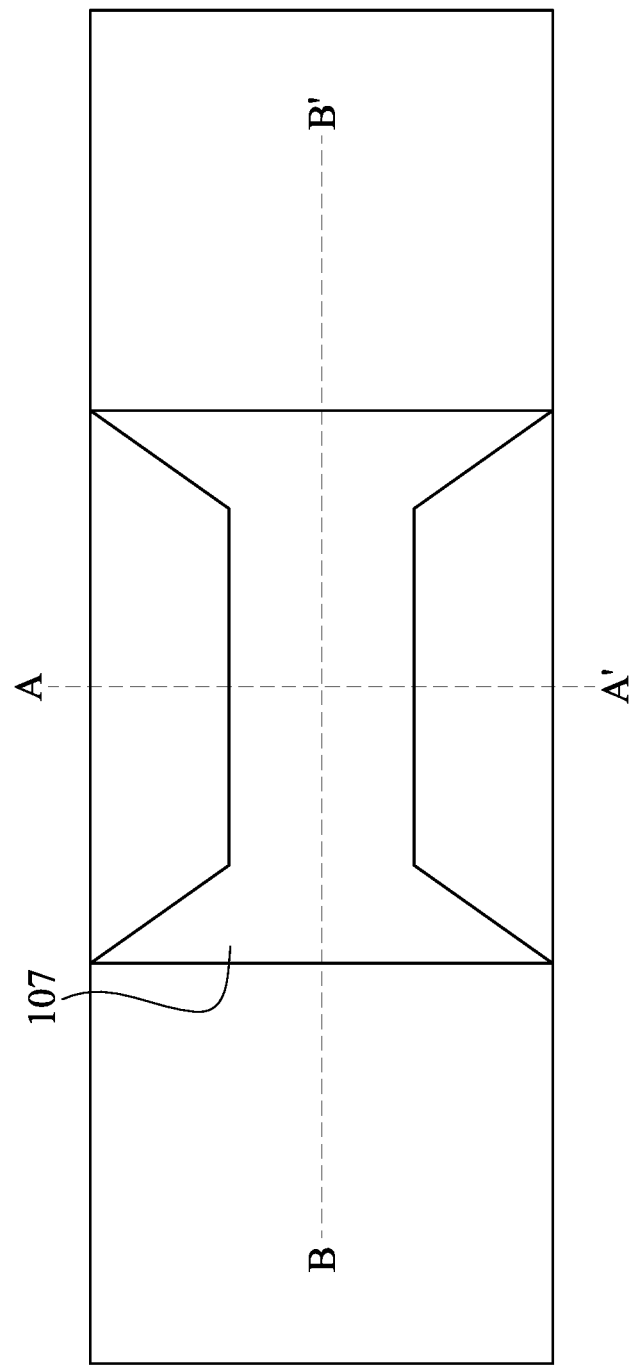
Figure 7C:
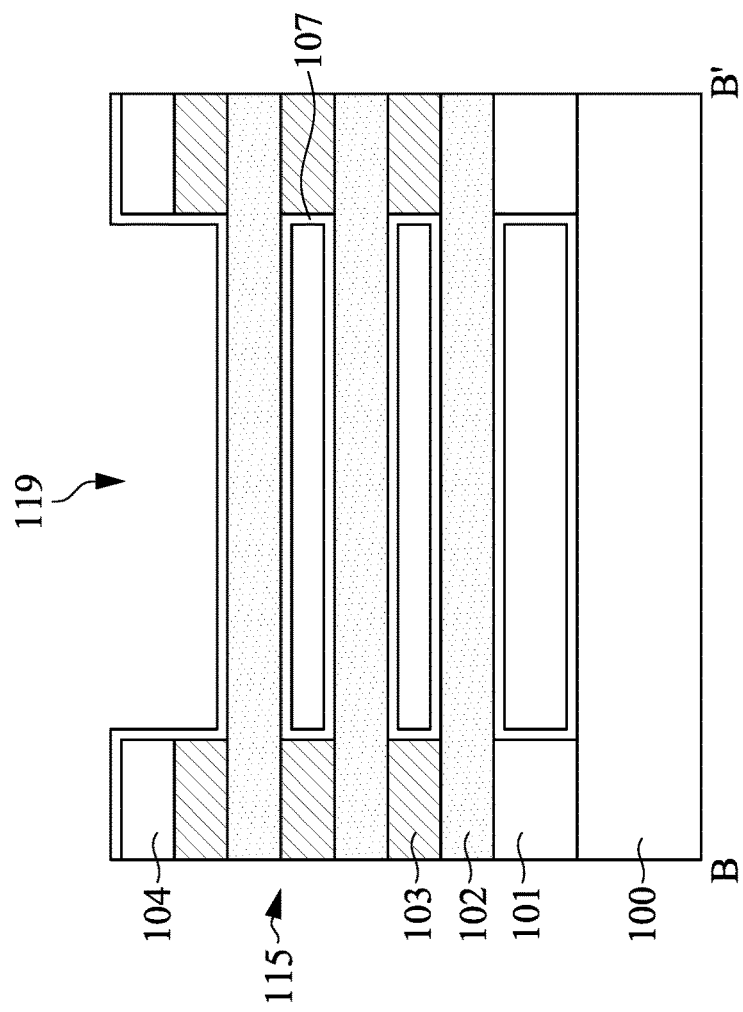
Figure 7B:
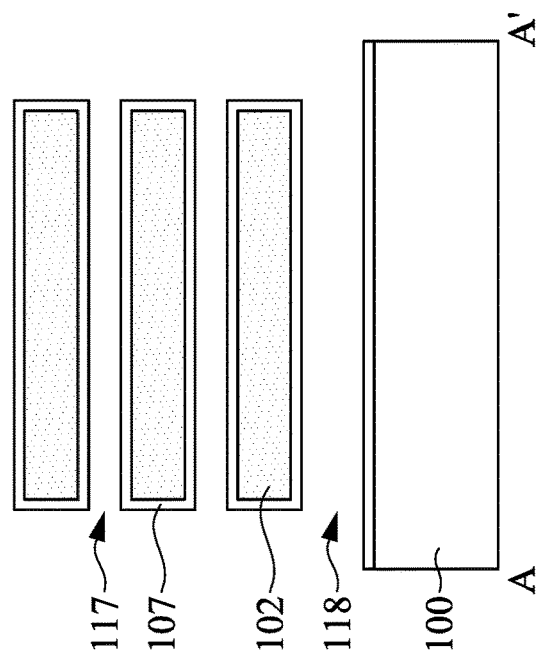

In FIGS. 6A-6C, the second metal oxide-based semiconductor layers 103 are removed by a selective etching process to form a gate trench 119 having gaps 117 between corresponding first metal oxide-based semiconductor layers 102, a gap 118 between the substrate 100 and a bottommost one of the first metal oxide-based semiconductor layers 102. The selective etching may be an isotropic etching process such as wet etching using etchants selective to the materials of the second metal oxide-based semiconductor layers 103. Stated differently, the second metal oxide-based semiconductor layers 103 are removed by using a selective etching process that etches the second metal oxide-based semiconductor layers 103 at a faster etch rate than it etches the first metal oxide-based semiconductor layers 102, thus forming a gate trench 119 having gaps 117 between the first metal oxide-based semiconductor layers 102 (also referred to as sheetsheet spaces if the first metal oxide-based semiconductor layers 102 are nanosheets). This step can be referred to as a channel release process. The isotropic etching process also etches the sacrificial layer 101 at a faster etch rate than etching the first metal oxide-based semiconductor layers 102, and thus the sacrificial layer 101 is removed in the channel release process as well, thus forming the gap 118 between the bottommost layer 102 and the substrate 100. At this interim processing step, the gate trench 119, including the gaps 117, 118, may be filled with ambient environment conditions (e.g., air, nitrogen, etc). In some embodiments, the first metal oxide-based semiconductor layers 102 can be referred to as nanosheets, nanowires, nanoslabs, nanorings having nano-scale size (e.g., a few nanometers), depending on their geometry. For example, in some embodiments the first metal oxide-based semiconductor layers 102 be trimmed to have a substantial rounded shape (i.e., cylindrical). In that case, the resultant first metal oxide-based semiconductor layers 102 can be called nanowires or nanosheets.

In embodiments in which the first metal oxide-based semiconductor layers 102 include IGZO doped with nitrogen, and the second metal oxide-based semiconductor layers 103 include IGZO with no or negligible nitrogen, a wet etch process using a mixture of buffered oxide etch (BOE), which comprises ammonium fluoride ($NH_4F$) and hydrofluoric acid, and de-ionized (DI) water may be used to remove the second metal oxide-based semiconductor layers 103 and the sacrificial layer 101. For example, the ratio of the BOE and the DI water is about 1:30. In the wet etch process using a mixture of BOE and de-ionized water as etchant, the etch rate of the first metal oxide-based semiconductor layers 102 is much lower than the etch rate of the second metal oxide-based semiconductor layers 103. For example, the etch rate of the first metal oxide-based semiconductor layers 102 is about 8 nm/min and the etch rate of the second metal oxide-based semiconductor layers 103 is about 172 nm/min. Accordingly, when the second metal oxide-based semiconductor layers 103 are removed by the wet etching process, the profile of the first metal oxide-based semiconductor layers 101 are substantially unchanged.

In some embodiments where the first metal oxide-based semiconductor layers 102 are IGZO and the second metal oxide-based semiconductor layers 103 are ZnO, a wet etch process using an oxalic acid-containing etchant (e.g., a mixture of oxalic acid and DI water) or a formic acid-containing etchant (e.g., a mixture of formic acid and DI water) is performed to remove the second metal oxide-based semiconductor layers 103. When the mixture of oxalic acid and DI water is used, the concentration of the oxalic acid is in a range from 0.001 mol/L to 1 mol/L, such as 0.05 mol/L. In the wet etch process using oxalic acid, the etch rate of the first metal oxide-based semiconductor layers 202 is much lower than the etch rate of the second metal oxide-based semiconductor layers 103. For example, the etch rate of the first metal oxide-based semiconductor layers 102 is less than 1 nm/min and the etch rate of the second metal oxide-based semiconductor layers 103 is about 578 nm/min. When the mixture of formic acid and DI water is used, the concentration of the formic acid is in a range from to 99%, such as 85%. In the wet etch process using the mixture of formic acid and DI water, the etch rate of the first metal oxide-based semiconductor layers 102 is much lower than the etch rate of the second metal oxide-based semiconductor layers 103. For example, the etch rate of the first metal oxide-based semiconductor layers 102 is less than 1 nm/min and the etch rate of the second metal oxide-based semiconductor layers 103 is about 590 nm/min.

In some embodiments where the first metal oxide-based semiconductor layers 102 are IGZO and the second metal oxide-based semiconductor layers 103 are IZO, a wet etch process using a mixture of formic acid and de-ionized water as an etchant is used to remove the second metal oxide-based semiconductor layers 103. When the mixture of formic acid and de-ionized water is used, the ratio of the formic acid and the de-ionized water is in a range from 1:1 to 1:100, such as 1:50. In the wet etch process using mixture of formic acid and de-ionized water, the etch rate of the first metal oxide-based semiconductor layers 202 is much lower than the etch rate of the second metal oxide-based semiconductor layers 204. For example, the etch rate of the first metal oxide-based semiconductor layers 102 is less than 1 nm/min and the etch rate of the second metal oxide-based semiconductor layers 103 is about 150 nm/min.

A high-k/metal gate structure is then formed. For example, in FIGS. 7A-7C, a gate dielectric layer 107 is formed (e.g., conformally) in the gate trench 119 and in the gaps 117 and 118. The gate dielectric layer 107 wraps around the first metal oxide-based semiconductor layers 102, and extends along an upper surface of the substrate 100. In accordance with some embodiments, the gate dielectric layer 107 includes silicon oxide, silicon nitride, or multi-layers thereof. In some embodiments, the gate dielectric layer 107 includes a high-k dielectric material, and in these embodiments, the gate dielectric layer 107 may have a dielectric constant greater than about 7.0, and may include a metal oxide or a silicate of Hf, Al, Zr, Si, La, Mg, Ba, Ti, or Pb, or combinations thereof. The formation methods of the gate dielectric layer 107 may include Molecular-Beam Deposition (MBD), ALD, PECVD, and the like and have a thickness in a range from 1 nm to 1 μm. In some embodiments, the gate dielectric layer 107 is an $Al_2O_3$ layer deposited using ALD.

In an alternative embodiment, an interfacial layer (not shown) is formed between the gate dielectric layer 107 and the first metal oxide-based semiconductor layers 102, and may be formed of silicon oxide or silicon oxynitride grown by a thermal oxidation process. For example, the interfacial layer can be grown by a rapid thermal oxidation (RTO) process or by an annealing process using oxygen.

Figure 8A:
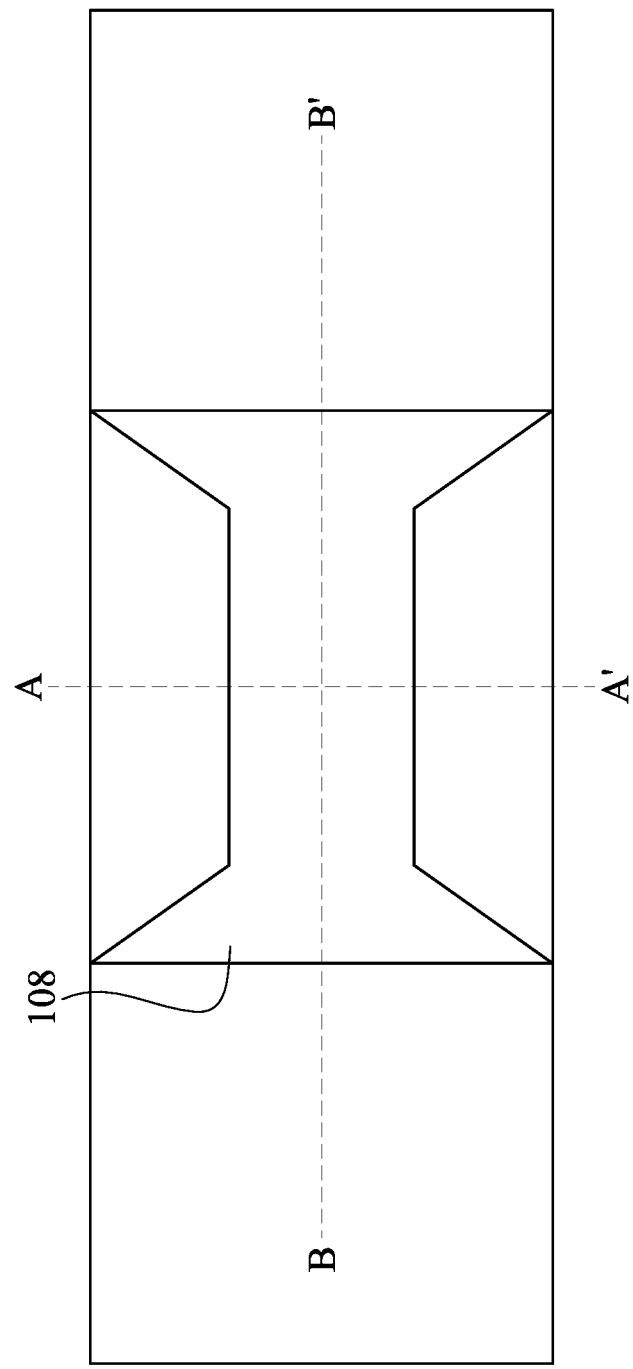
Figure 8C:
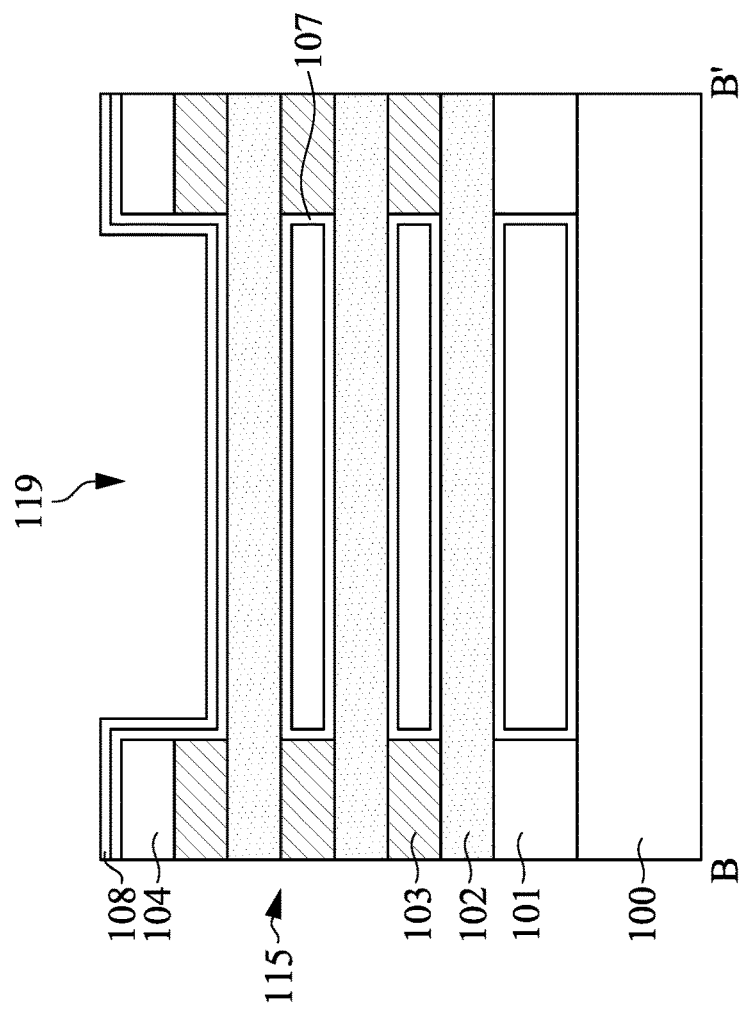
Figure 8B:
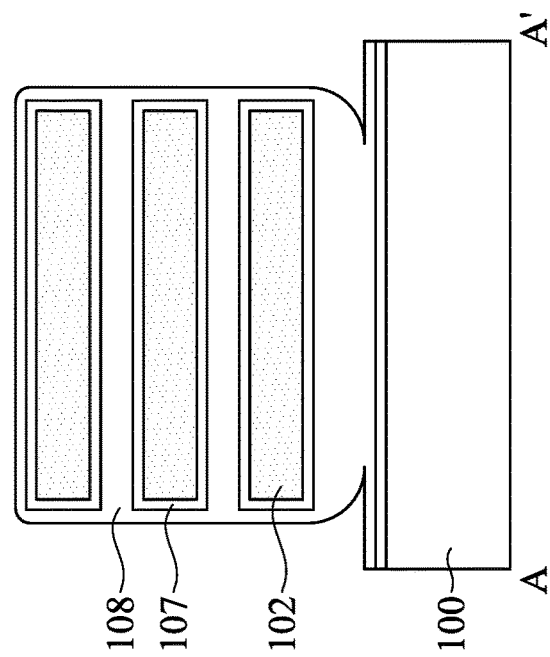

Referring to FIGS. 8A-8C, next, a first gate metal 108 is formed in the gate trench 119 and in the gaps 117 and 118. The first gate metal 108 lines the gate trench 119 and fills remaining portions of the gaps 117 and 118. The first gate metal 108 includes titanium nitride and may be deposited to surround each of the first metal oxide-based semiconductor layers 102 by ALD in some embodiments. The first gate metal 108 may have a thickness in a range from 1 nm to 1 μm. A portion of the first gate metal 108 is formed vertically between adjacent first metal oxide-based semiconductor layers 102 and fills the gaps 117, 118 between adjacent first metal oxide-based semiconductor layers 102.

In other embodiments, the first gate metal 108 may include one or more work function metal layers. The one or more work function metal layers can provide a suitable work function for the high-k/metal gate structure. For an n-type GAA FET, the one or more work function metal layers may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type GAA FET, the one or more work function metal layers may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

Figure 9A:
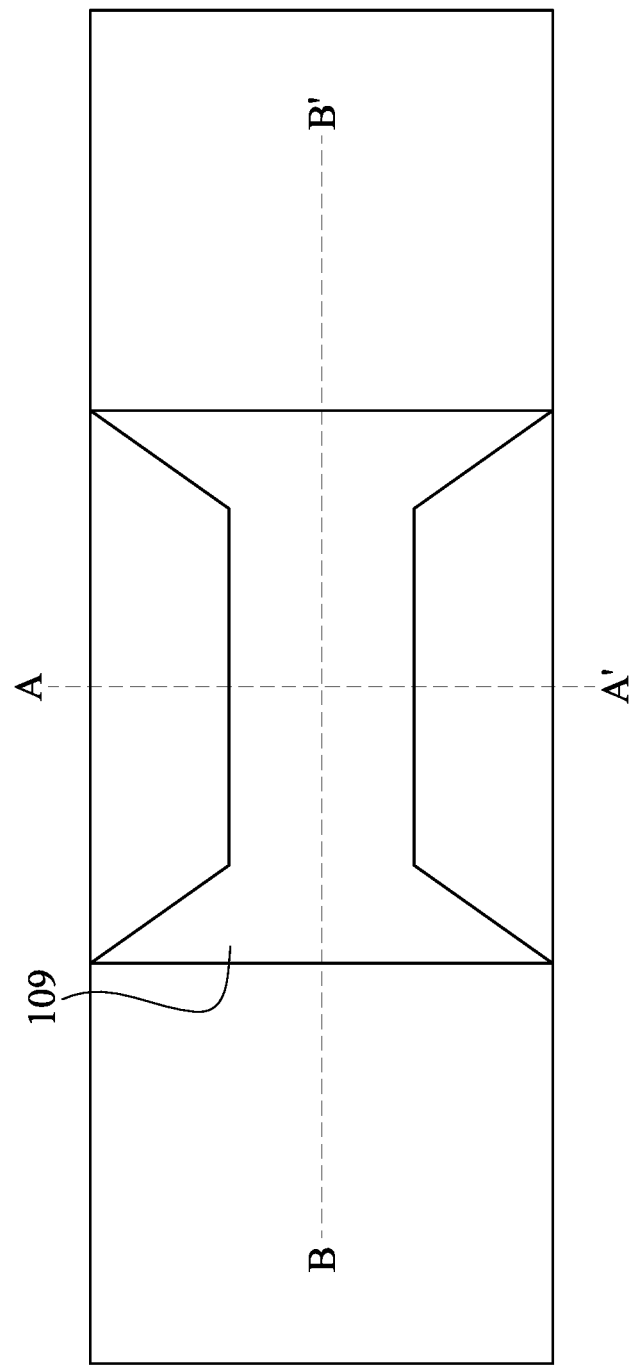
Figure 9C:
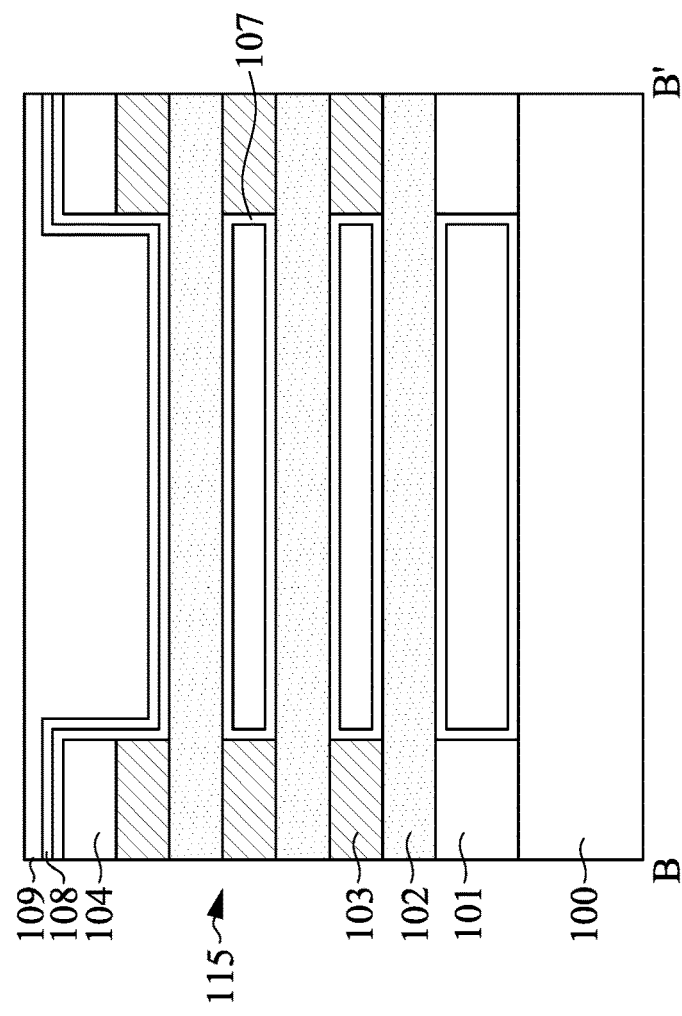
Figure 9B:
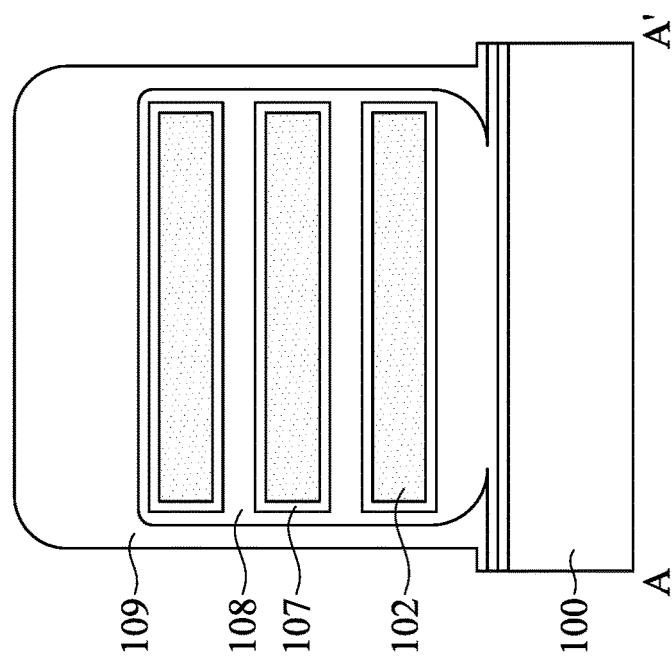

Referring to FIGS. 9A-9C, a second gate metal 109 is formed over the first gate metal 108. The second gate metal 109 fills a remaining portion of the gate trench 119 (see FIG. 8C). In some embodiments, the second gate metal 109 is a titanium nitride layer deposited using sputtering and have a thickness is a range from 1 nm to 1 µm. In other embodiments, the second gate metal 109 may include tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Figure 10A:
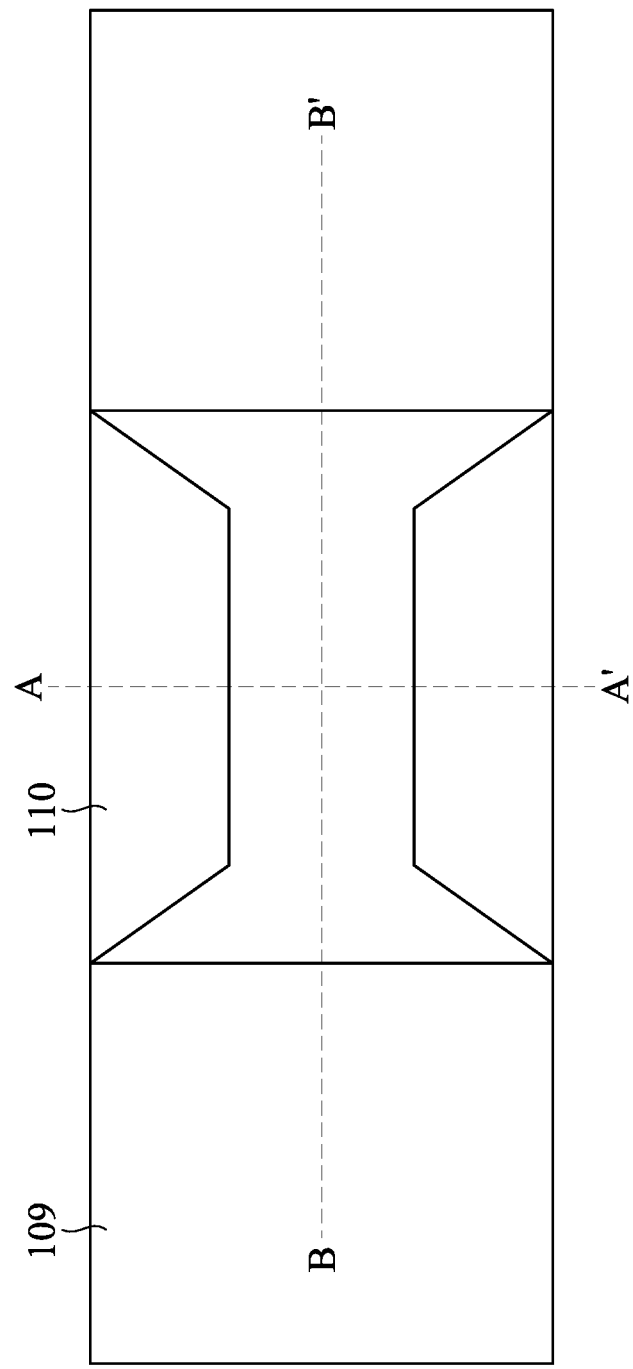
Figure 10C:
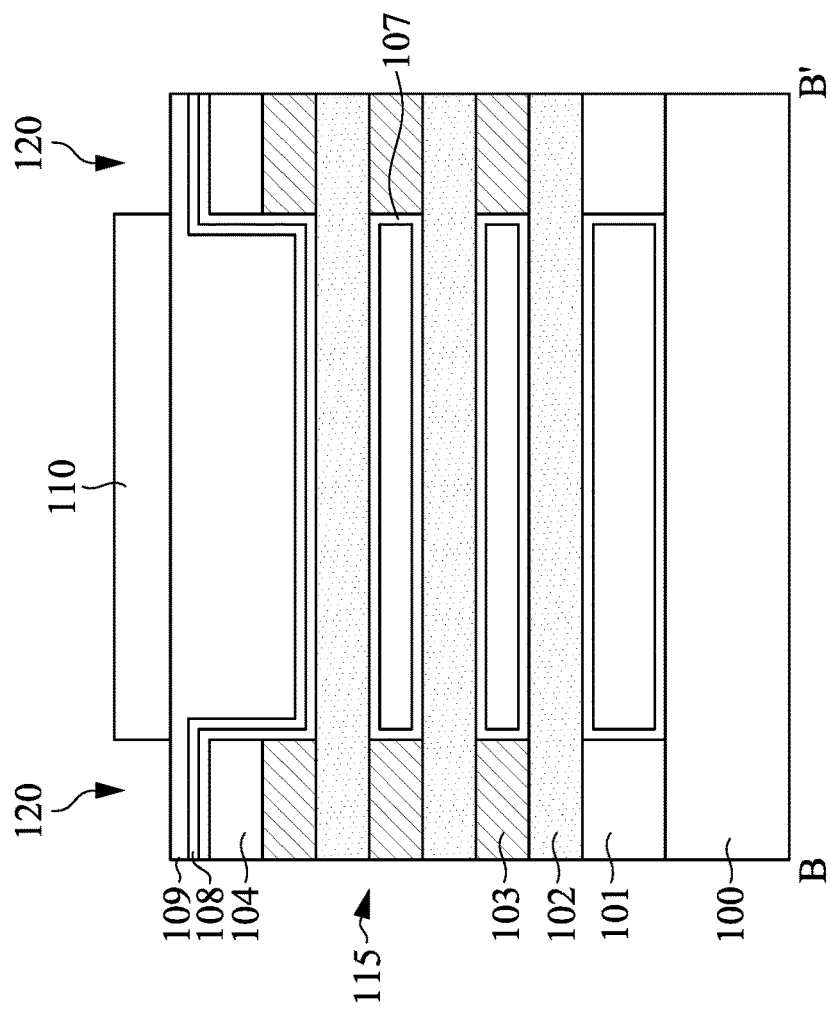
Figure 10B:
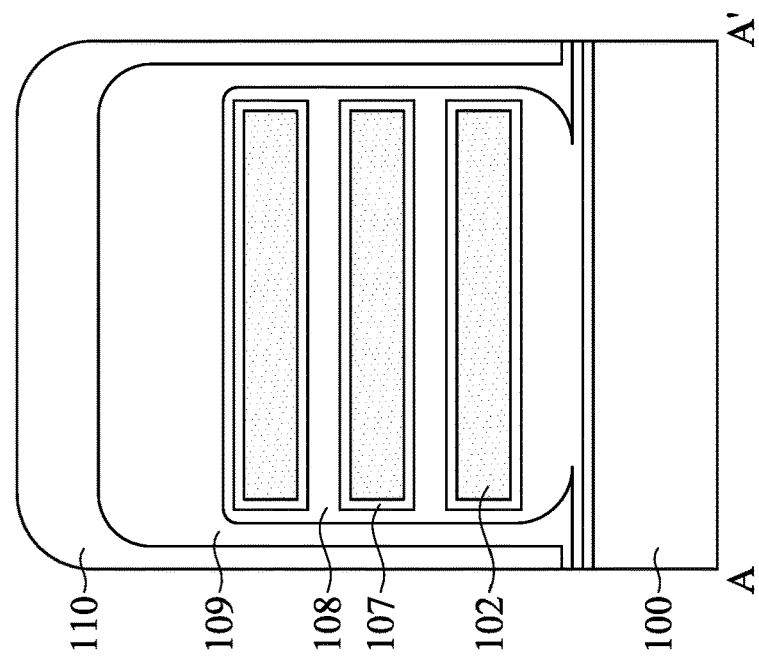

In FIGS. 10A-10C, a photoresist 110 or other masks including $SiN_x$ (not separately illustrated) is formed over the second gate metal 109. The photoresist 110 can be formed by using a spin-on technique and can be patterned using acceptable photolithography techniques, forming openings 120 in the photoresist 110. The second gate metal 109 is exposed by the openings 120.

Figure 11A:
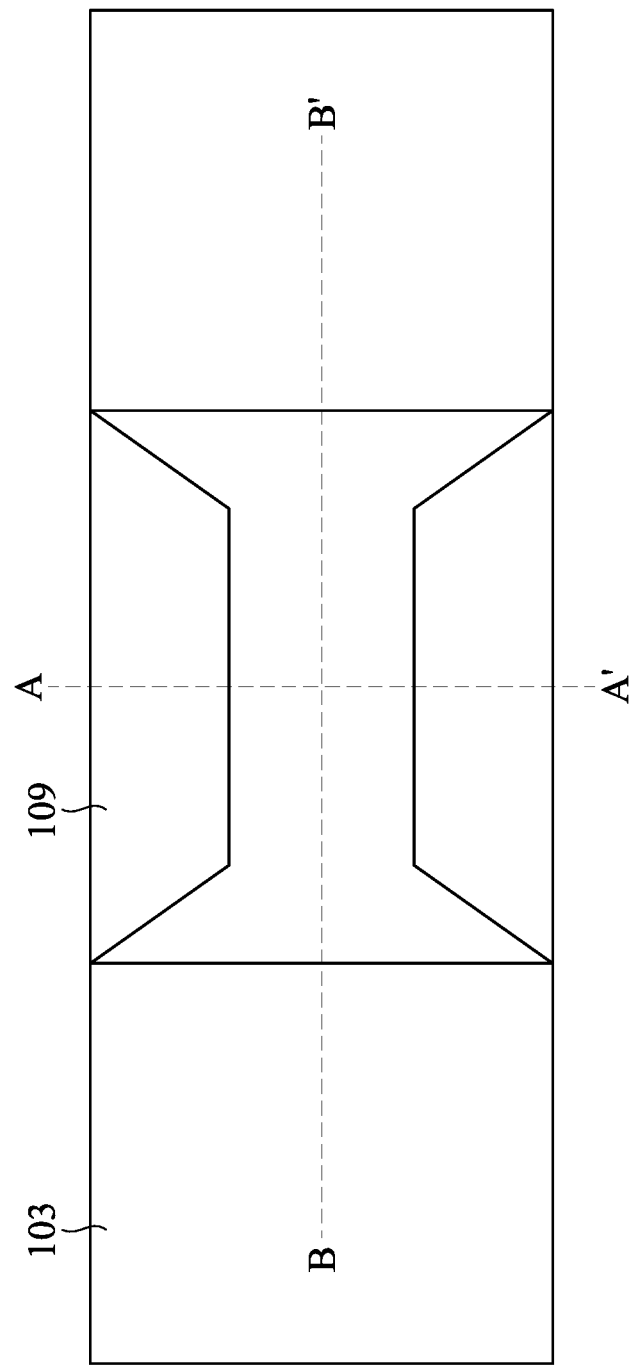
Figure 11C:
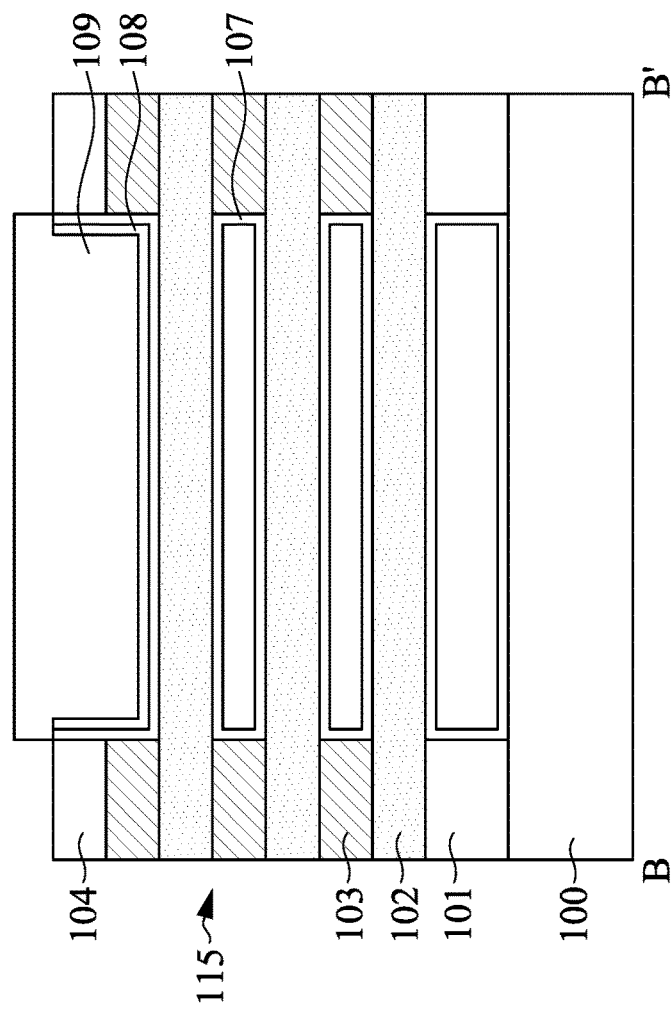
Figure 11B:
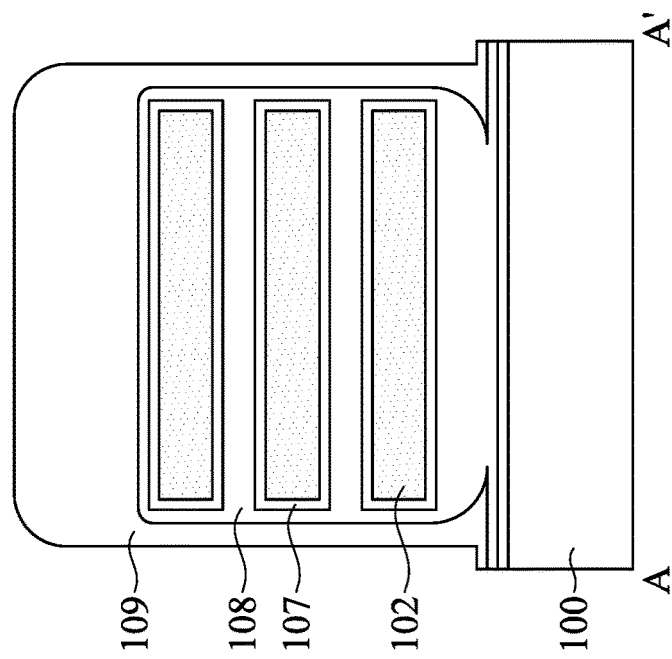

The second gate metal 109 and the underlying first gate metal 108 and the gate dielectric layer 107 are removed through the openings 120 by an etch process such that the underlying capping layer 104 is exposed, as shown in FIGS. 11A-11C. The photoresist 110 may then be removed, such as by an acceptable ashing process.

Figure 12A:
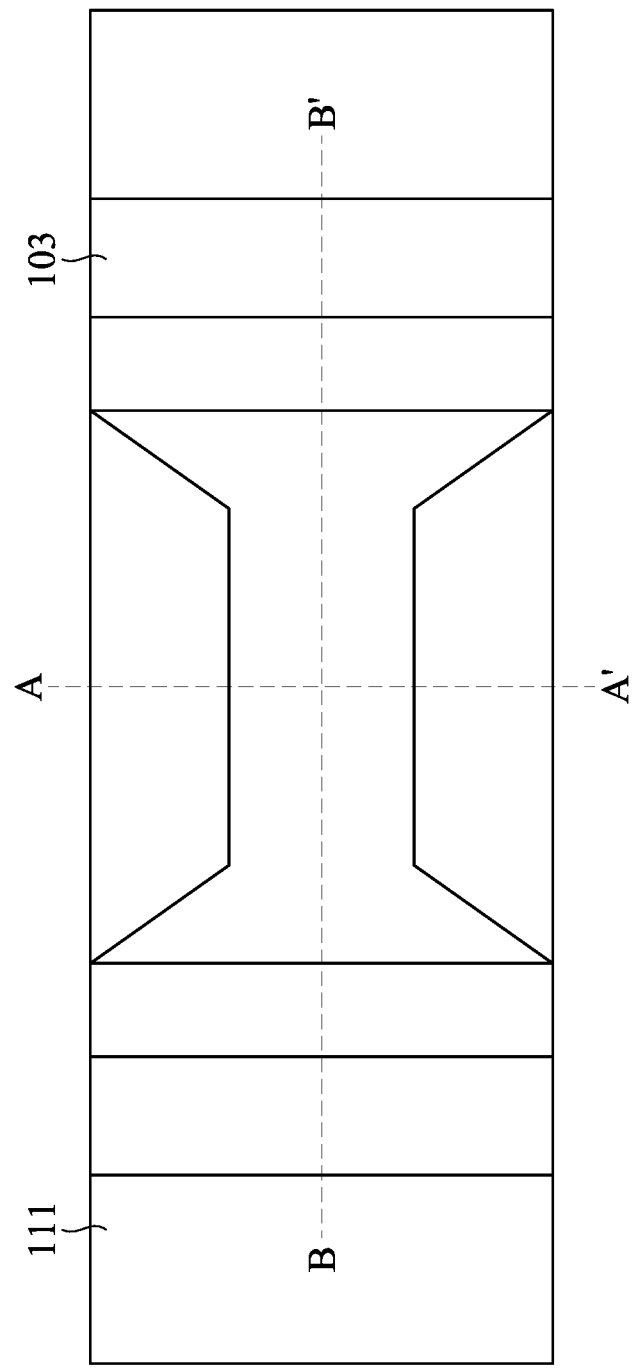
Figure 12C:
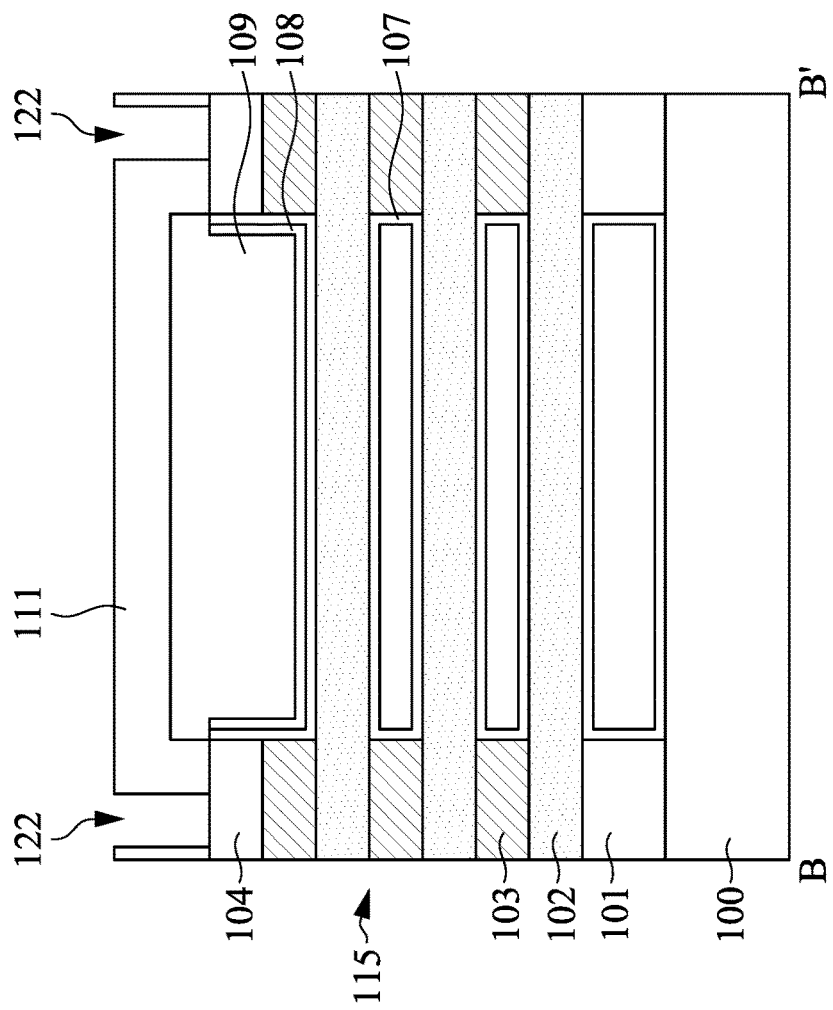
Figure 12B:
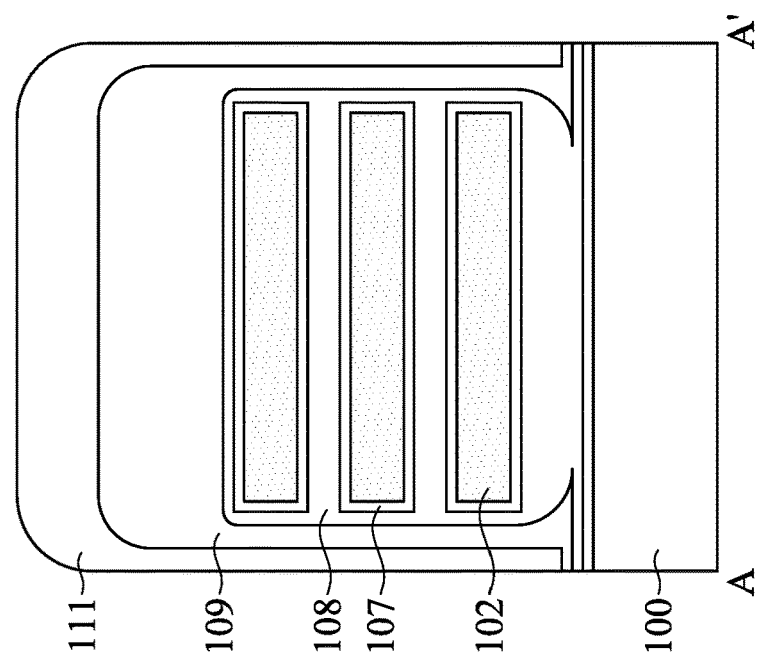

In FIGS. 12A-12C, a photoresist 111 or other masks including $SiN_x$ (not separately illustrated) is formed over the second gate metal 109 and the capping layer 104. The photoresist 111 can be formed by using a spin-on technique and can be patterned using acceptable photolithography techniques, forming openings 122 in the photoresist 111. The capping layer 104 on opposite sides of the second gate metal 109 are exposed by the openings 122.

Figure 13A:
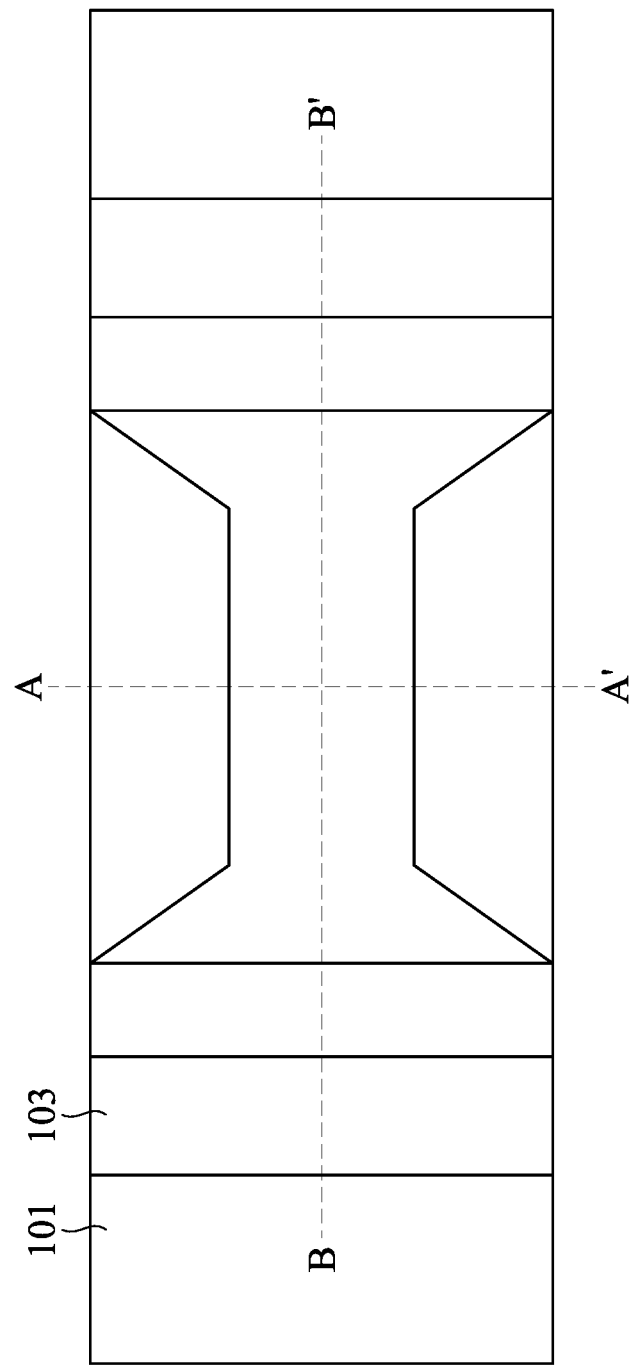
Figure 13C:
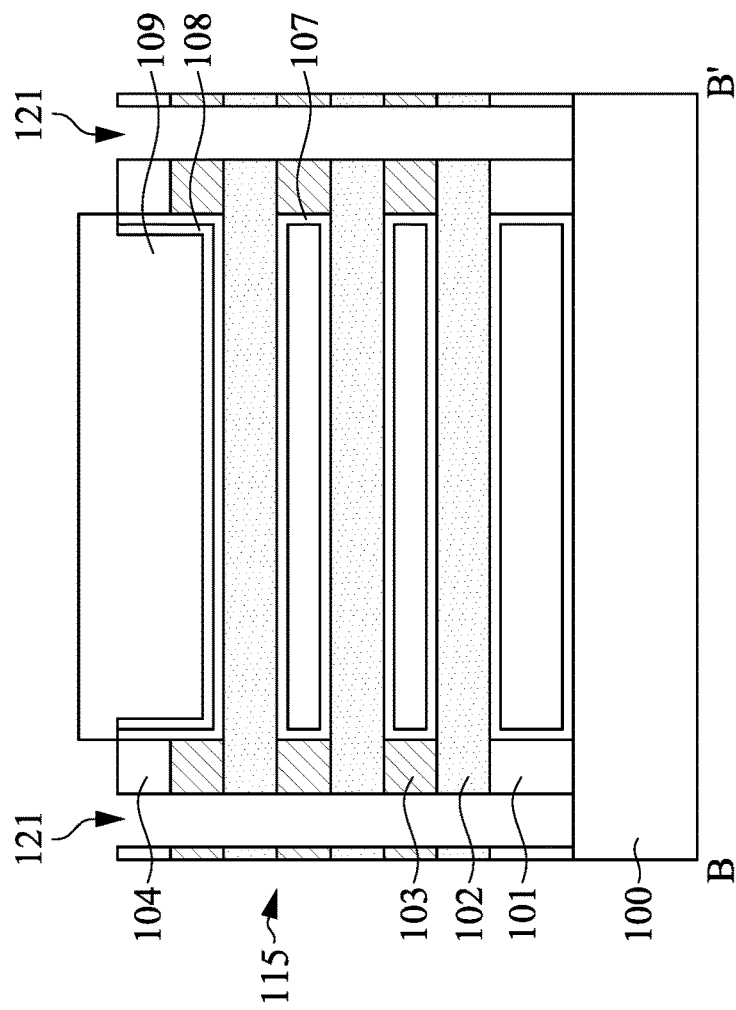
Figure 13B:
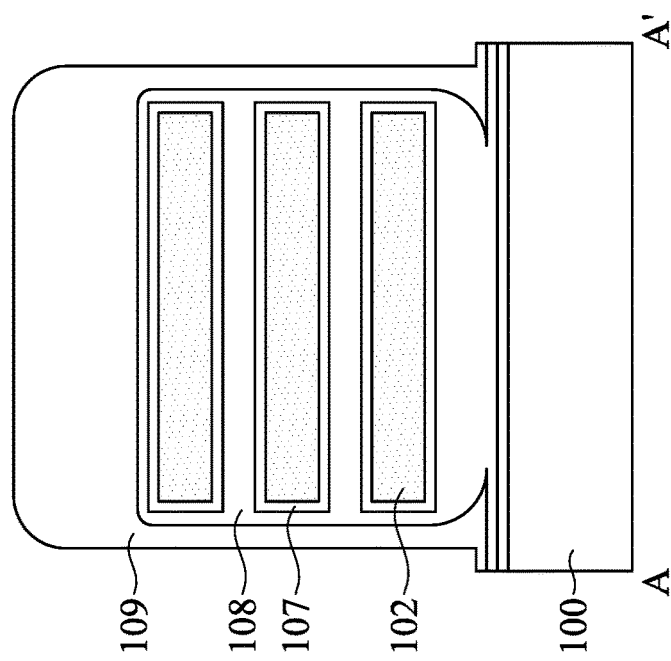

In FIGS. 13A-13C, the capping layer 104, the fin structure 115 and the sacrificial layer 101 are etched through the openings 122 by an etch process such that the underlying substrate 100 is exposed, forming trenches 121. After etching the fin structure 115 and the sacrificial layer 101, the photoresist 111 may be removed, such as by an acceptable ashing process.

Figure 14A:
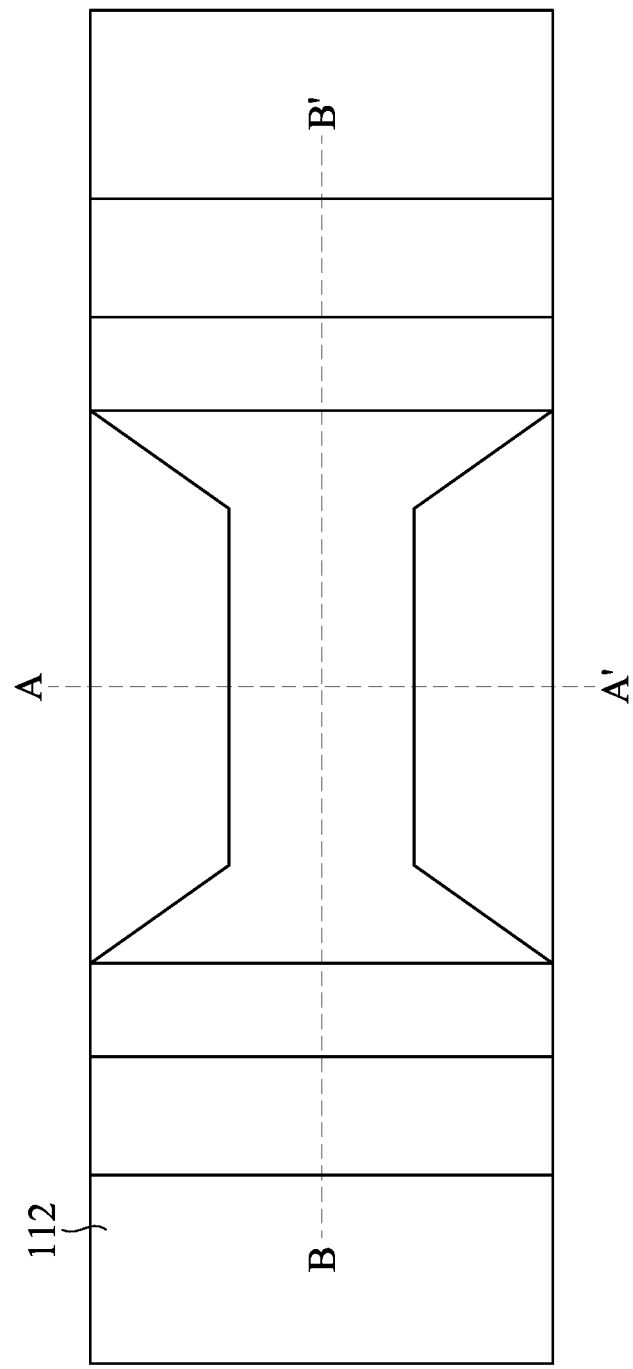
Figure 14C:
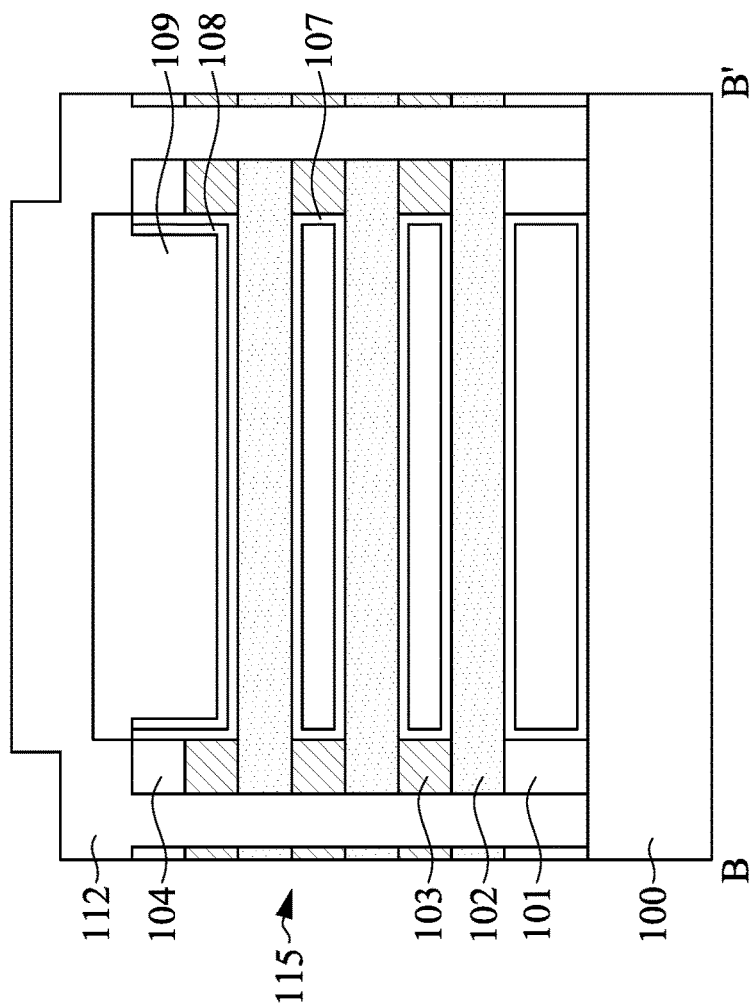
Figure 14B:
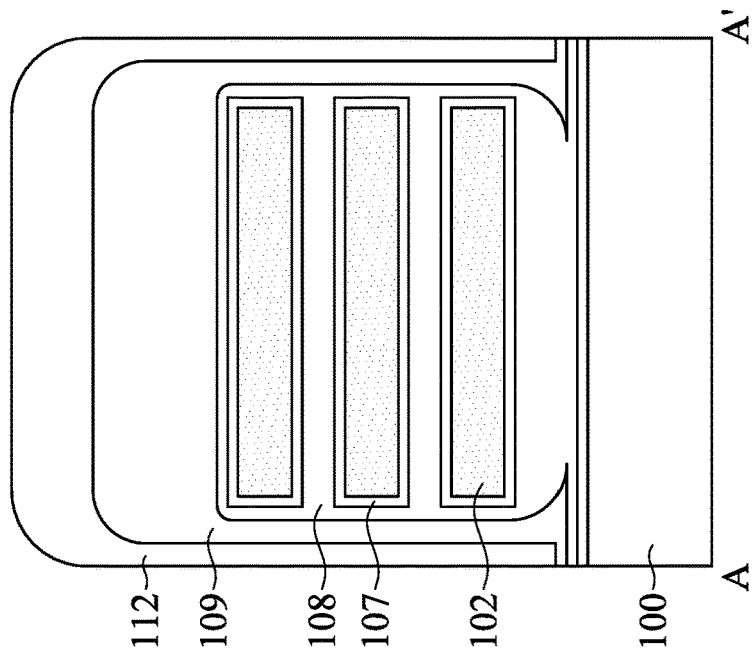

In FIGS. 14A-14C, a conductive material 112 is deposited on the second gate metal 109 and the capping layer 104, and fills the trenches 121 (see FIG. 13C). In some embodiments, the conductive material 112 may include titanium nitride, tungsten, or the like and have a thickness in a range from 1 nm to 1 µm.

Figure 15A:
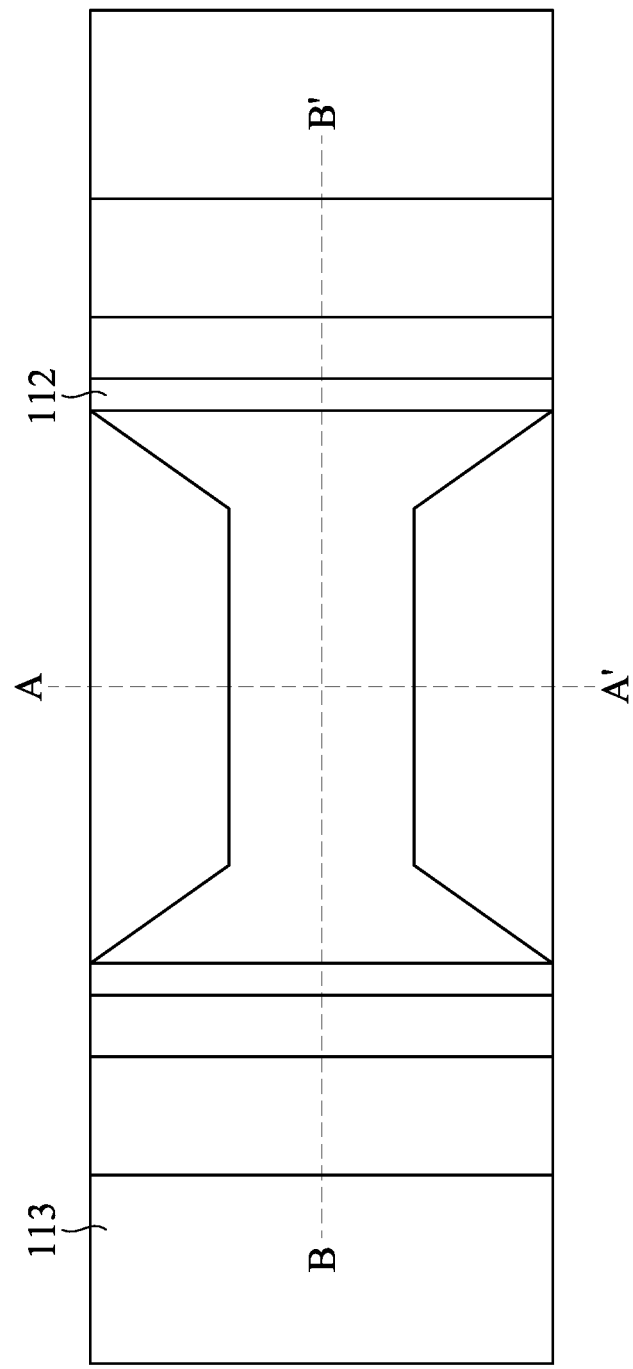
Figure 15C:
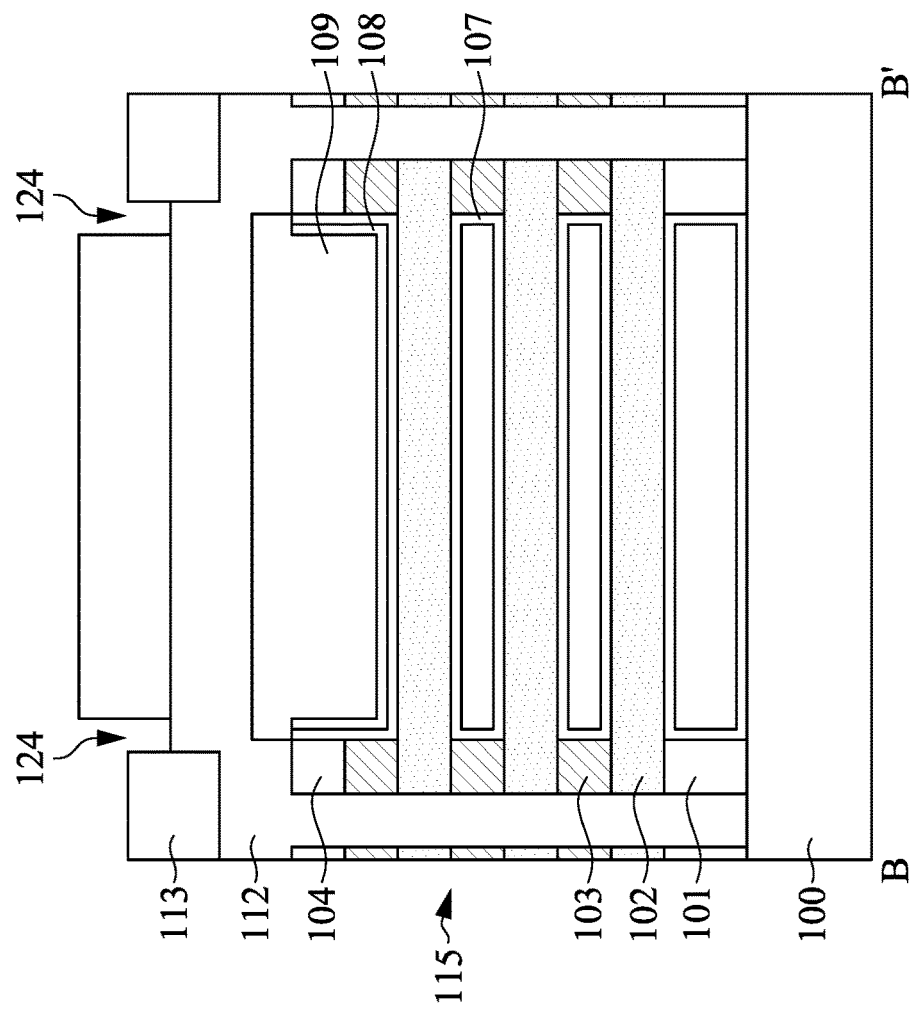
Figure 15B:
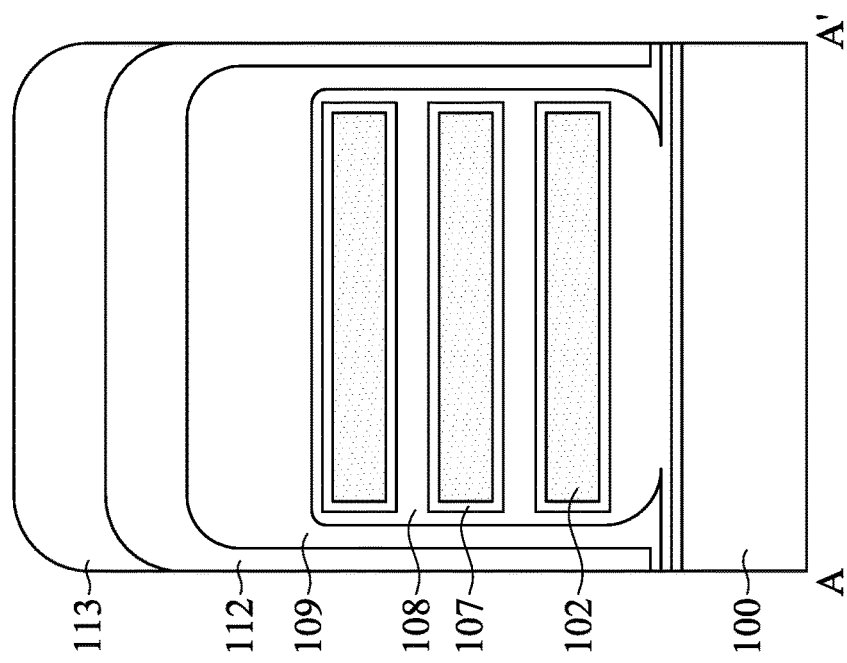

In FIGS. 15A-15C, a photoresist 113 or other masks including $SiN_x$ (not separately illustrated) is formed over the conductive material 112. The photoresist 113 can be formed by using a spin-on technique and can be patterned using acceptable photolithography techniques, forming openings 124 in the photoresist 113.

Figure 16A:
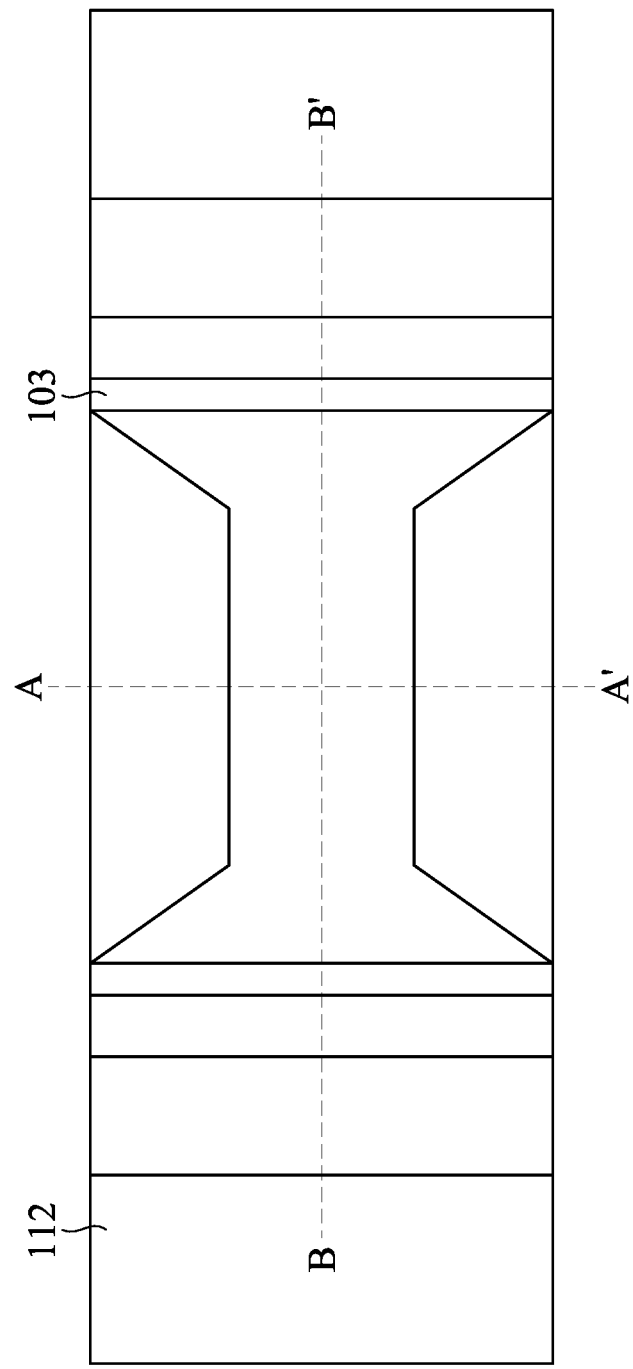
Figure 16C:
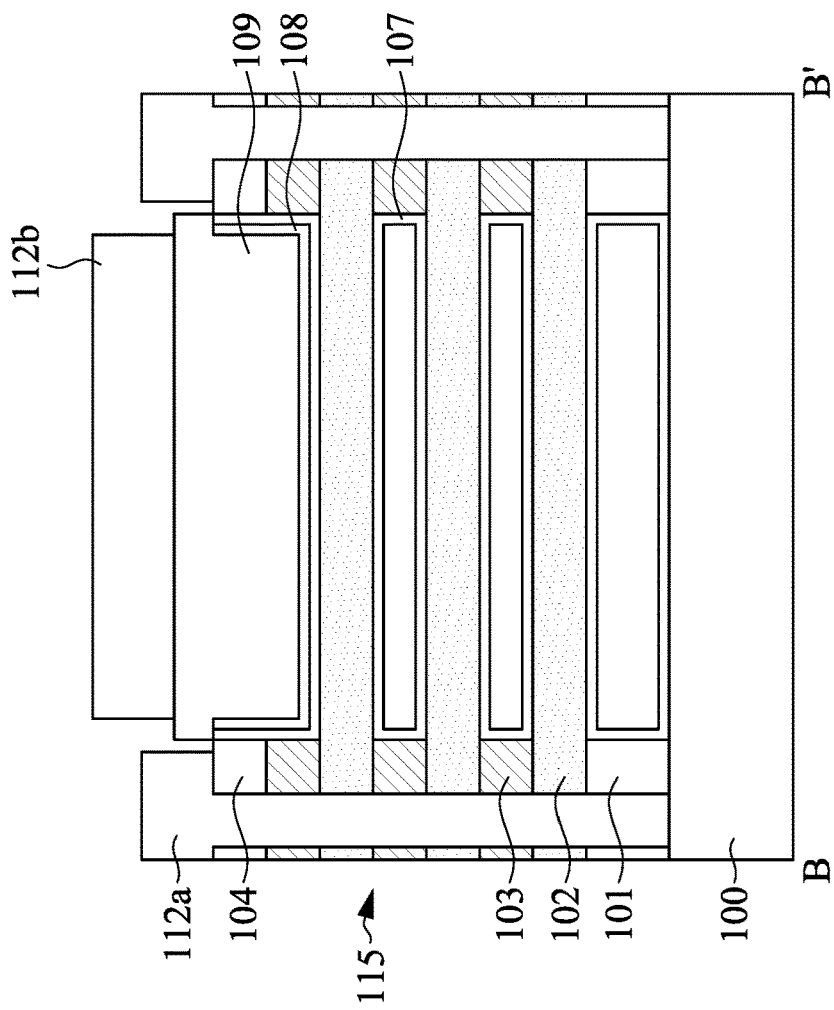
Figure 16B:
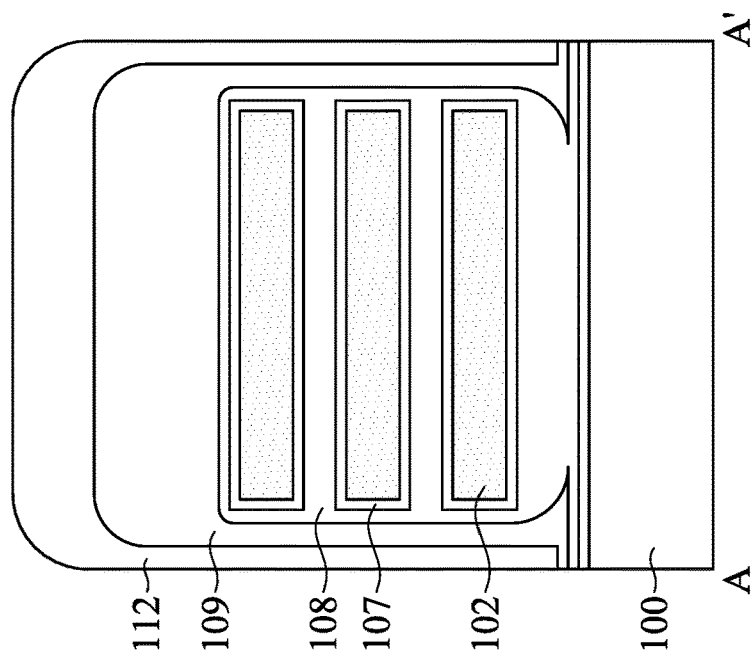

In FIGS. 16A-16C, the conductive material 112 is etched through the openings 124 to expose the capping layer, the gate dielectric layer 107 and the first gate metal 108, forming source/drain electrodes 112a and a gate electrode 112b. In particular, the conductive material 112 can form ohmic contact with opposite sides of the metal oxide-based semiconductor layers 120, and thus opposite sides of the metal oxide-based semiconductor layers 120 can serve as source/drain regions without n-type or p-type dopant as required in bulk silicon of CMOS transistors.

FIGS. FIGS. 17A, 18A, 19A, 20A, 21A, 22A, 23A, 24A, 25A, 26A, 27A, 28A, 29A, 30A, 31A, 32A, 33A, 34A and 35A are top views of a GAA-FET 20 (field-effect transistor) at intermediate fabrication stages in accordance with some embodiments and further illustrates a reference cross-section A-A' that is used in later figures. Cross-section A-A' is along a longitudinal axis of a gate metal and in a first direction, for example, perpendicular to the direction of current flow between the epitaxial source/drain regions of the GAA-FET. FIGS. 17B, 18B, 19B, 20B, 21B, 22B, 23B, 24B, 26B, 27B, 28B, 29B, 30B, 31B, 32B, 33B, 34B and 35B are cross-sectional views at intermediate fabrication stages, illustrating reference cross-section A-A'. FIGS. 22C, 26C, 27C, 28C, 29C, 30C, 31C, 32C, 33C, 34C and 35C are cross-sectional views at intermediate fabrication stages, illustrating reference cross-section B-B' that extends through a fin along a longitudinal axis of the fin.

Some embodiments discussed herein are discussed in the context of GAA-FET formed using a gate-last process. In other embodiments, a gate-first process may be used. Also, some embodiments contemplate aspects used in planar devices, such as planar FETs or in FinFETs.

Figure 17A:
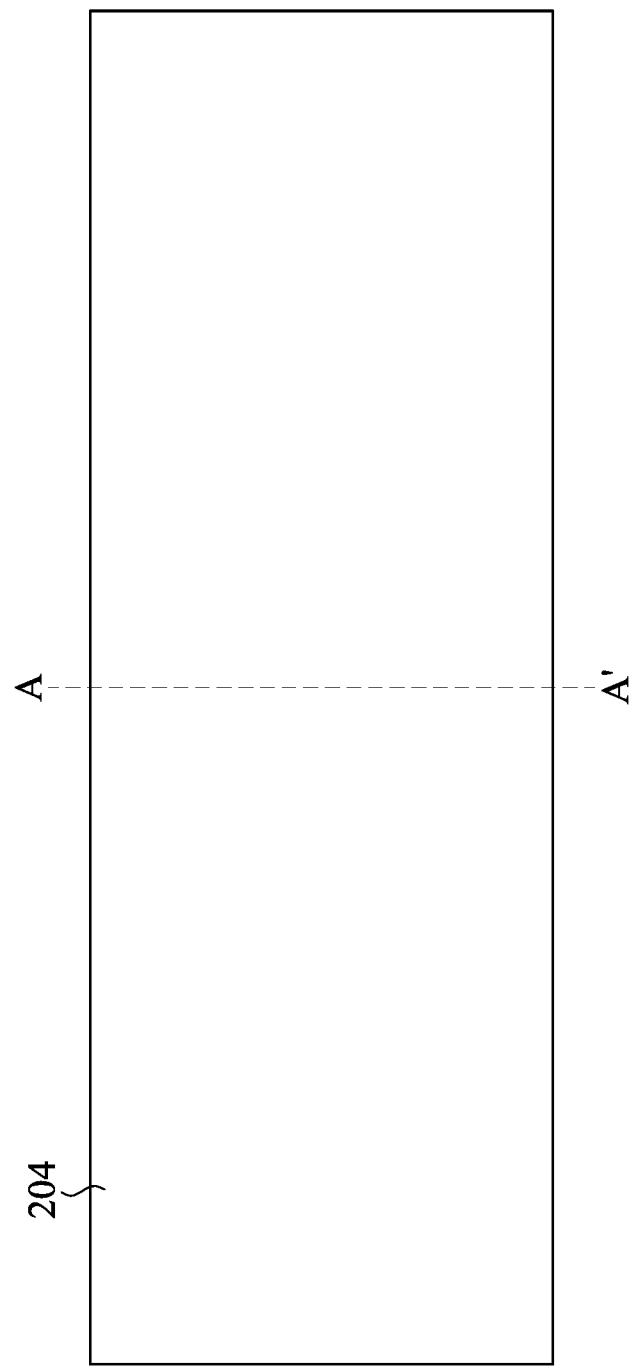
FIGS. 17A, 18A, 19A, 20A, 21A, 22A, 23A, 24A, 25A, 26A, 27A, 28A, 29A, 31A, 32A, 33A, 34A and 35A are top views of a GAA-FET (field-effect transistor) at intermediate fabrication stages in accordance with some embodiments.
Figure 17B:
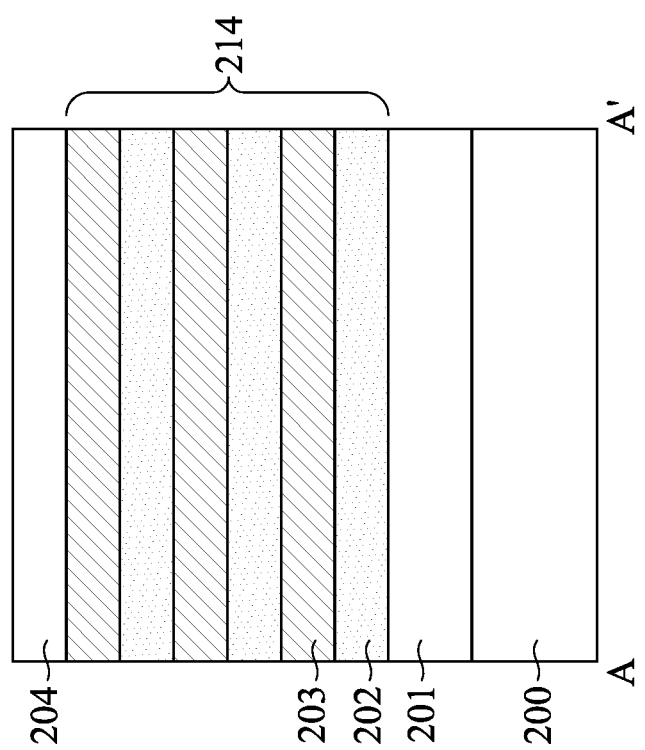

In FIGS. 17A-17B, a substrate 200 is provided. The substrate 200 may have a composition similar to a composition of the substrate 100, and thus the description thereof is omitted. A sacrificial layer 201, a multi-layer stack 214 and a capping layer 204 are formed over the substrate 200 in sequence. The compositions, formation methods, dimensions of the sacrificial layer 201, the multi-layer stack 214 and the capping layer 204 are similar to the compositions, formation methods, dimensions of the sacrificial layer 101, the multi-layer stack 114 and the capping layer 104, and thus the description thereof is omitted herein.

Figure 18A:
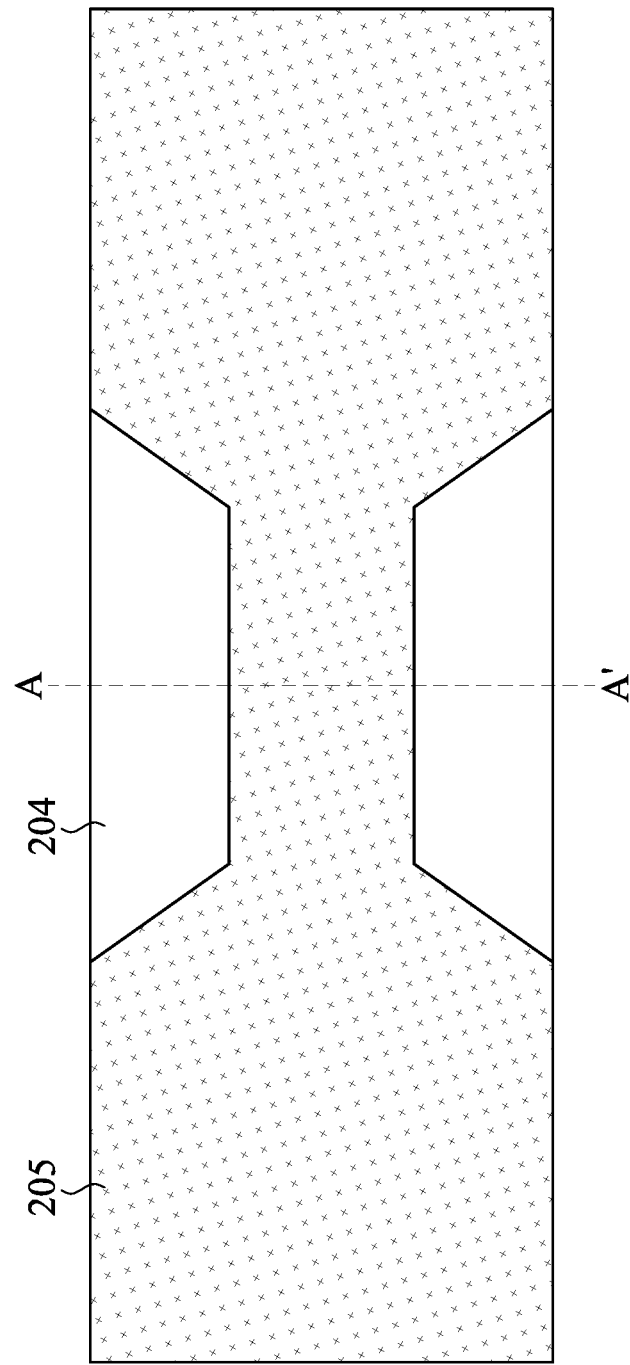
Figure 18B:
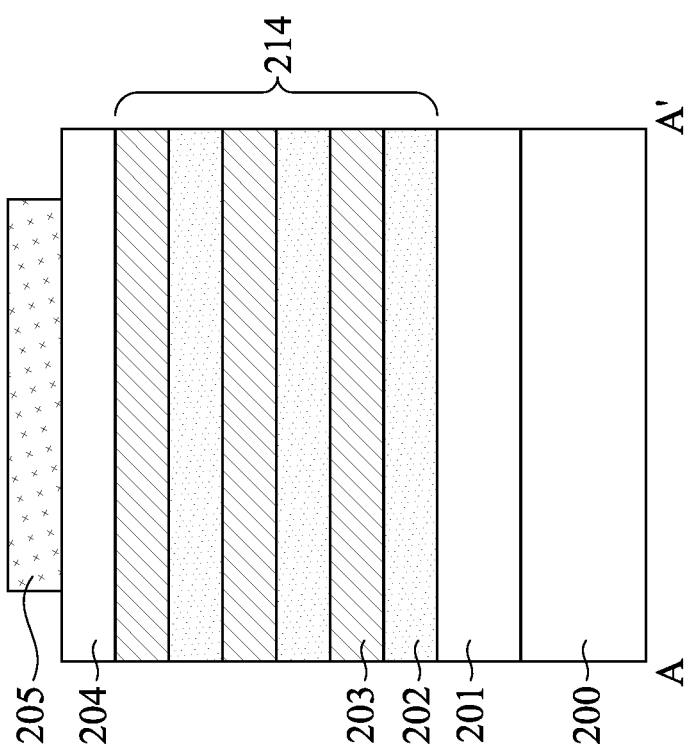

Referring to FIGS. 18A-18B, a photoresist 205 or other masks including $SiN_x$ (not separately illustrated) is formed over the capping layer 204. The photoresist 205 can be formed by using a spin-on technique and can be patterned using acceptable photolithography techniques.

Figure 19A:
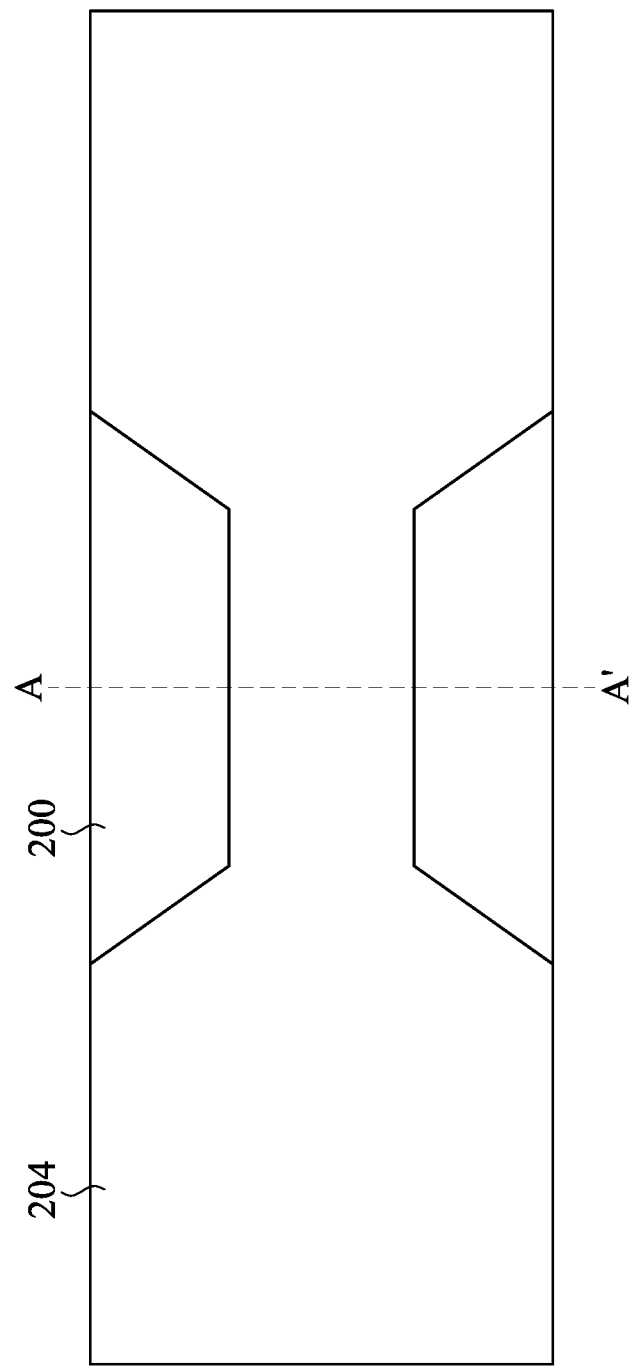
Figure 19B:
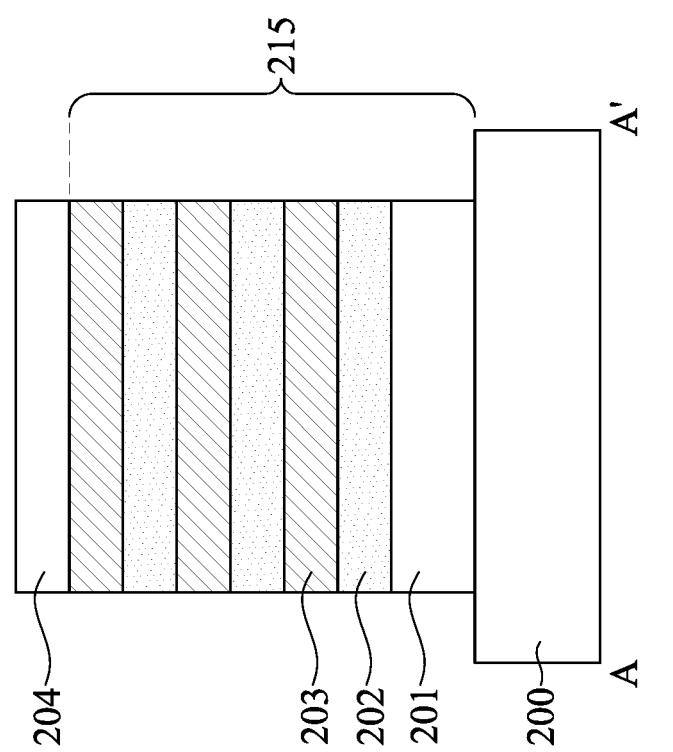

Referring now to FIGS. 19A-19B, a fin structure 215 is formed in the multi-layer stack 214 and the sacrificial layer 201 by etching trenches in the multi-layer stack 214 and the sacrificial layer 201. In an alternative embodiment, the fin structure 215 may be formed in the substrate 200. The etching may be any acceptable etch process, such as a reactive ion etch (RIE), neutral beam etch (NBE), the like, or a combination thereof. The etching may be anisotropic. After forming the fin structure 215, the photoresist 205 may be removed, such as by an acceptable ashing process.

Figure 20A:
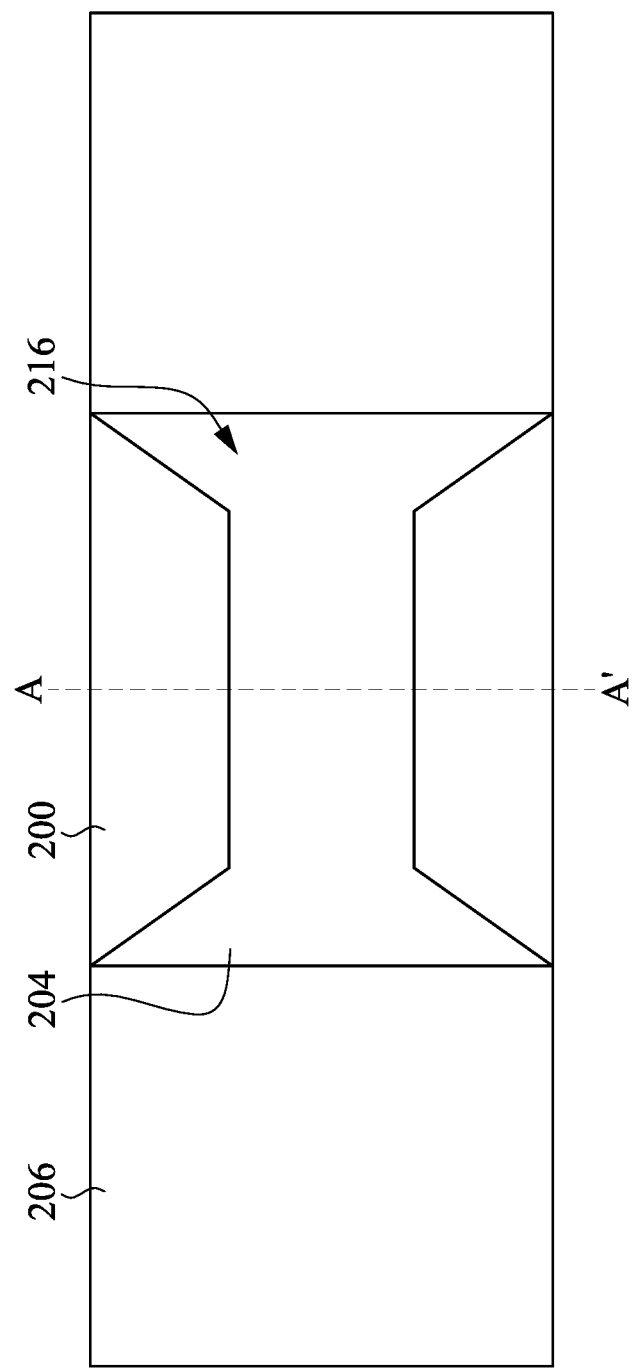
Figure 20B:
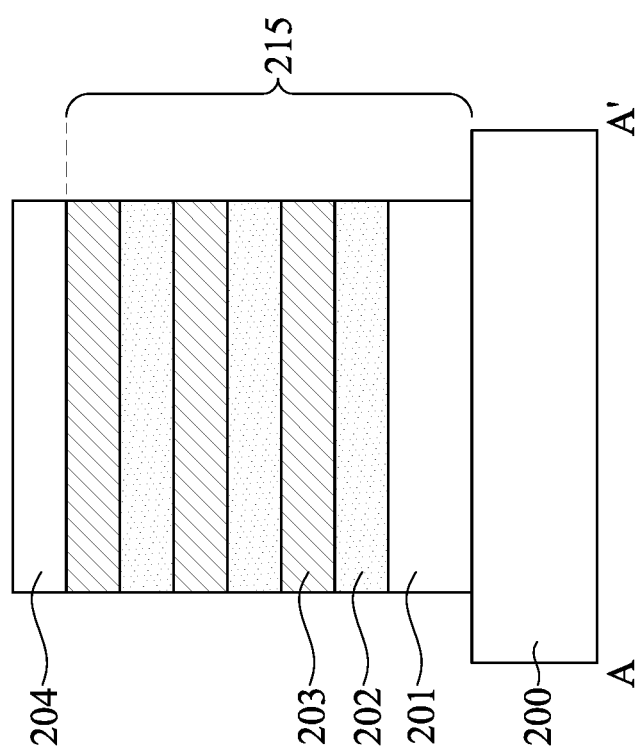

Referring to FIGS. 20A-20B, a photoresist 206 or other masks including $SiN_x$ (not separately illustrated) is formed over the capping layer 204. The photoresist 206 can be formed by using a spin-on technique and can be patterned using acceptable photolithography techniques, forming an opening 216 in the photoresist 206.

Figure 21A:
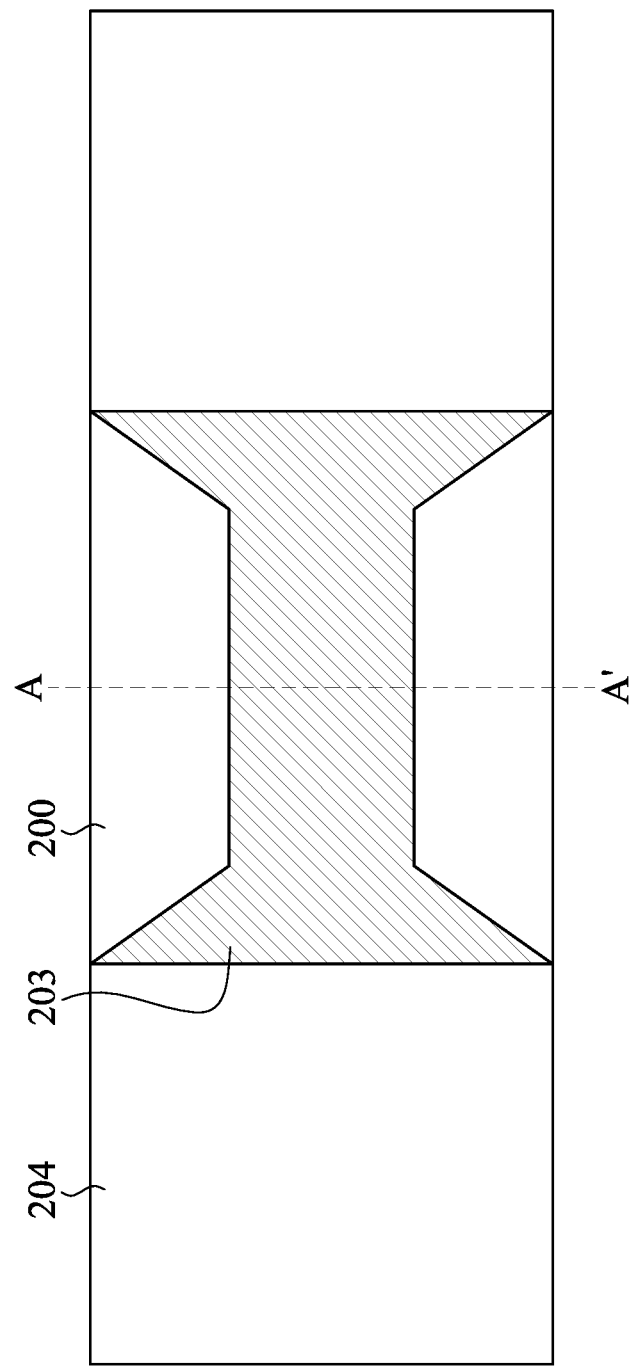
Figure 21B:
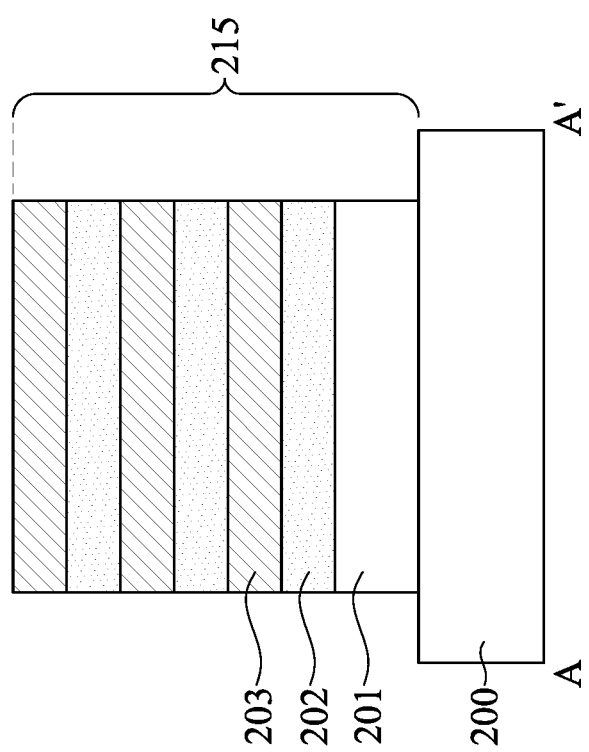

In FIGS. 21A-21B, the capping layer 204 is etched through the opening 216 to expose the underlying fin structure 215. After etching the capping layer 204, the photoresist 206 may be removed, such as by an acceptable ashing process.

Figure 22A:
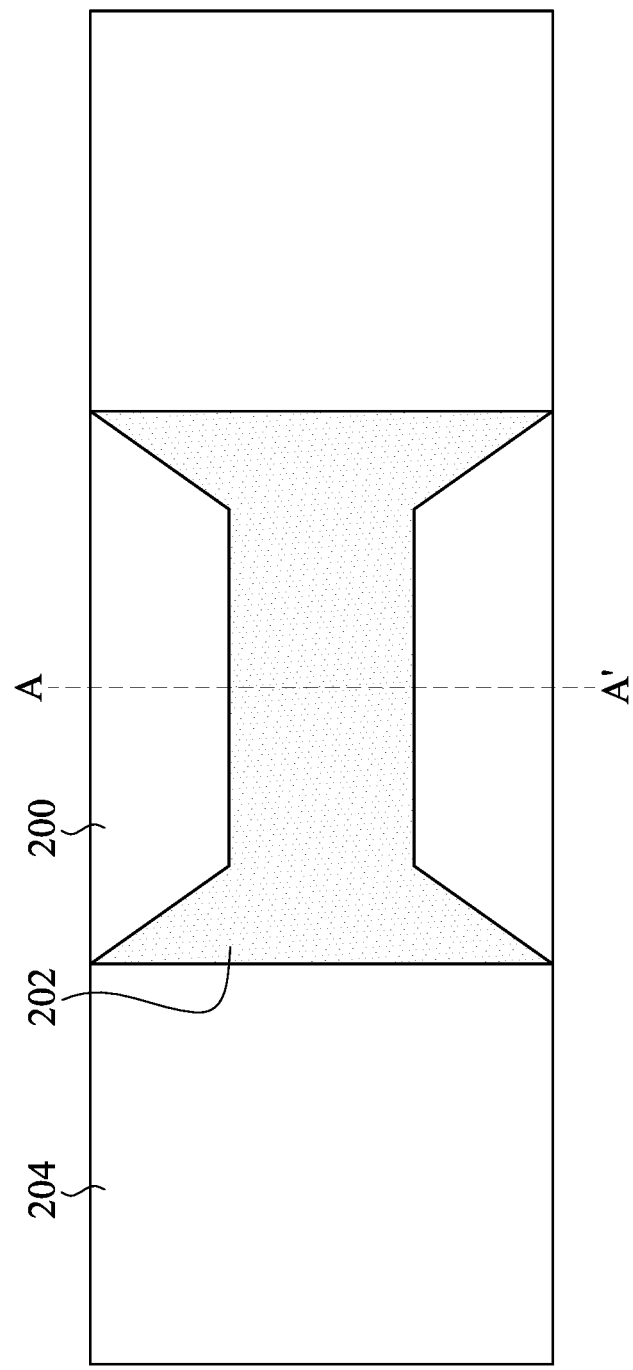

In FIGS. 22A-22B, the second metal oxide-based semiconductor layers 203 and the sacrificial layer 201 are partially removed by an isotropic etching process such as wet etching or the like using etchants which are selective to the materials of the second metal oxide-based semiconductor layers 203. By controlling the duration of the etching process, the second metal oxide-based semiconductor layers 203 and the sacrificial layer 201 will remain after the etching process. Sidewall recesses 218 and 220 are formed between corresponding first metal oxide-based semiconductor layers 202 and between a bottommost one of the first metal oxide-based semiconductor layers 202 and the substrate 200, respectively. In some embodiments where the sacrificial layer 201 include $SiO_2$ and the second metal oxide-based semiconductor layers 203 include IGZO, the wet etching process is performed using BOE and the wet etching process etches the second metal oxide-based semiconductor layers 203 at a faster etch rate than it etches the sacrificial layer 201. As a result, the etched sacrificial layer 201 has a width w1 greater than a width w2 of the etched second metal oxide-based semiconductor layers 203. It is noted that because the topmost one of second metal oxide-based semiconductor layers 203 (see FIG. 21B) has an exposed area larger than an exposed area of the other second metal oxide-based semiconductor layers 203, the topmost one of the second metal oxide-based semiconductor layers 203 is completely removed by the isotropic etching process.

Figure 23A:
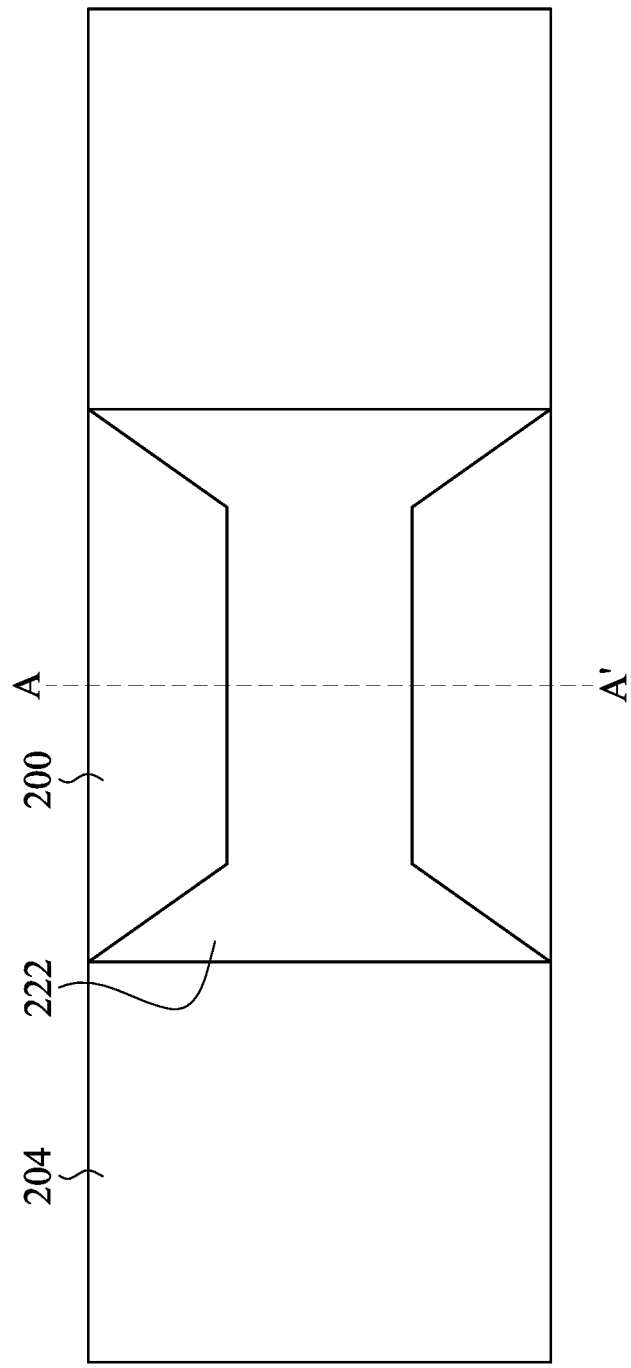
Figure 23B:
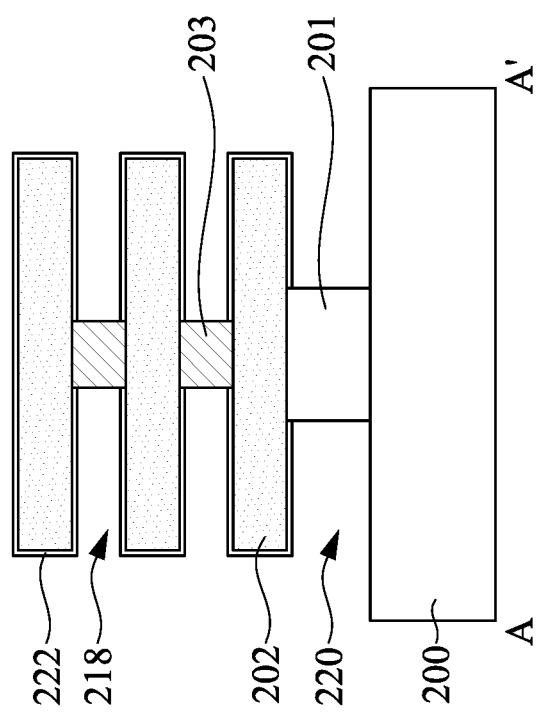

Referring to FIGS. 23A-23B, after the wet etching process, a surface treatment is performed to form a protective layer 222 surrounding the first metal oxide-based semiconductor layers 202 and the etched second metal oxide-based semiconductor layers 203. For example, the surface treatment is performed using chlorine-containing gas, for example, $Cl_2$, $BCl_3$, other suitable gases and/or plasmas, and/or combinations thereof, and thus the protective layer 222 is a chloride layer. In some embodiments where the first metal oxide-based semiconductor layers 202 include IGZO doped with nitrogen and the second metal oxide-based semiconductor layers 203 include IGZO free from nitrogen, the protective layer 222 is an IGZO chloride layer and is used to protect the first metal oxide-based semiconductor layers 202 and the second metal oxide-based semiconductor layers 203 from being damaged during a subsequent etching process.

Figure 24A:
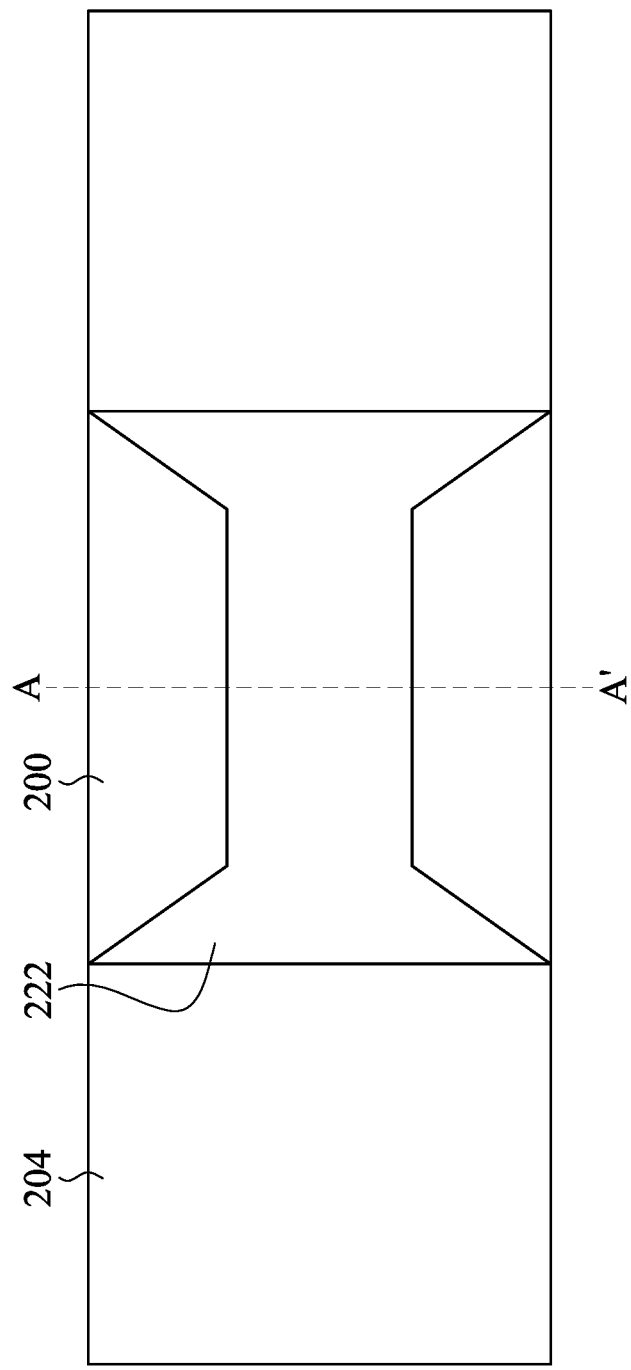
Figure 24B:
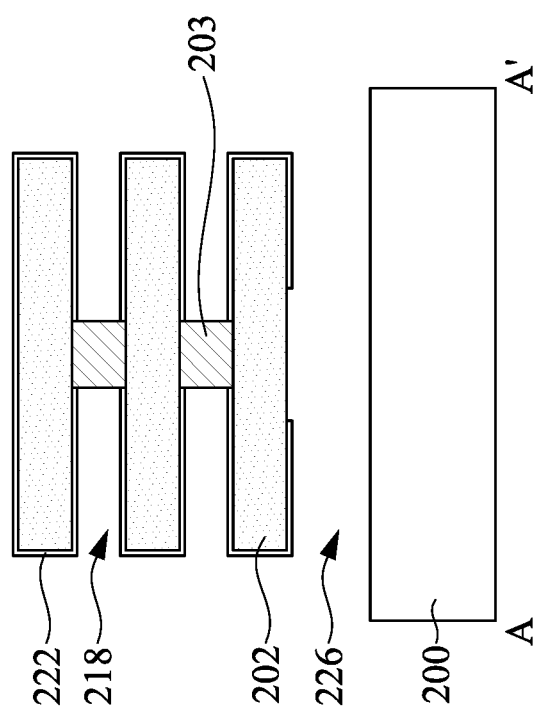

In FIGS. 24A-24B, a dry etching process is performed to remove the etched sacrificial layer 201, for example, using fluorine-containing gas. In furtherance of the example, the dry etching process is performed using sulfur hexafluoride ($SF_6$) plasma. A gap 226 is formed between the substrate 200 and the bottommost one of the first metal oxide-based semiconductor layers 202.

Figure 25A:
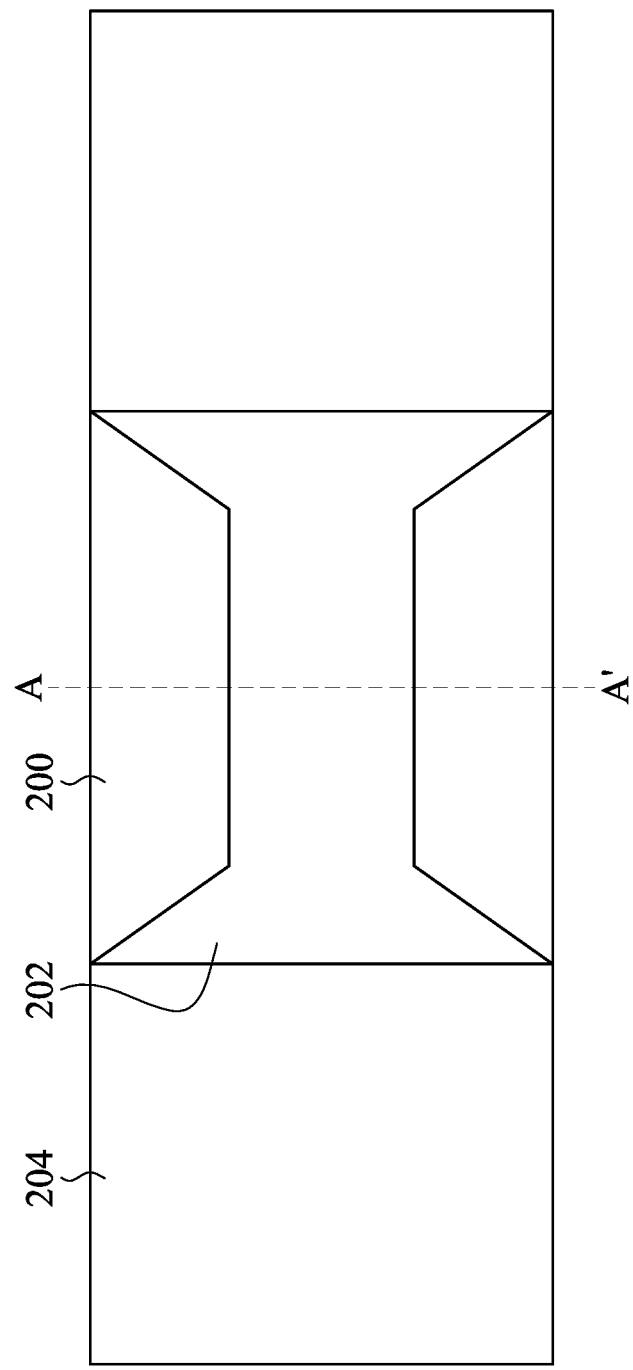
Figure 25B:
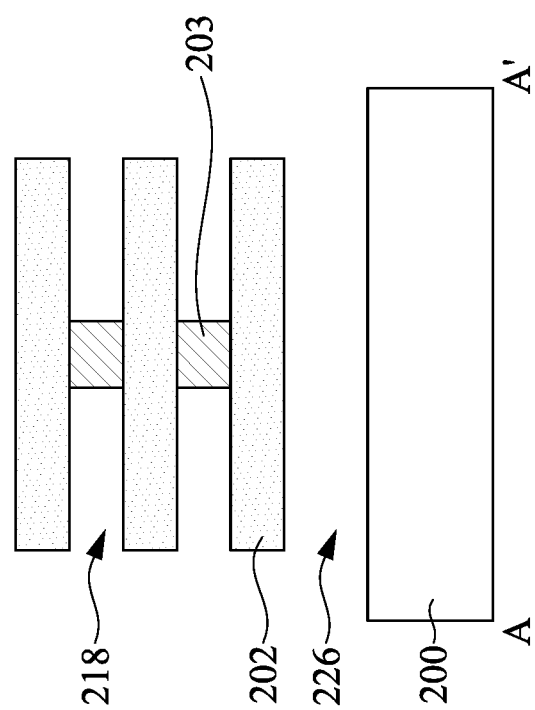
Figure 26A:
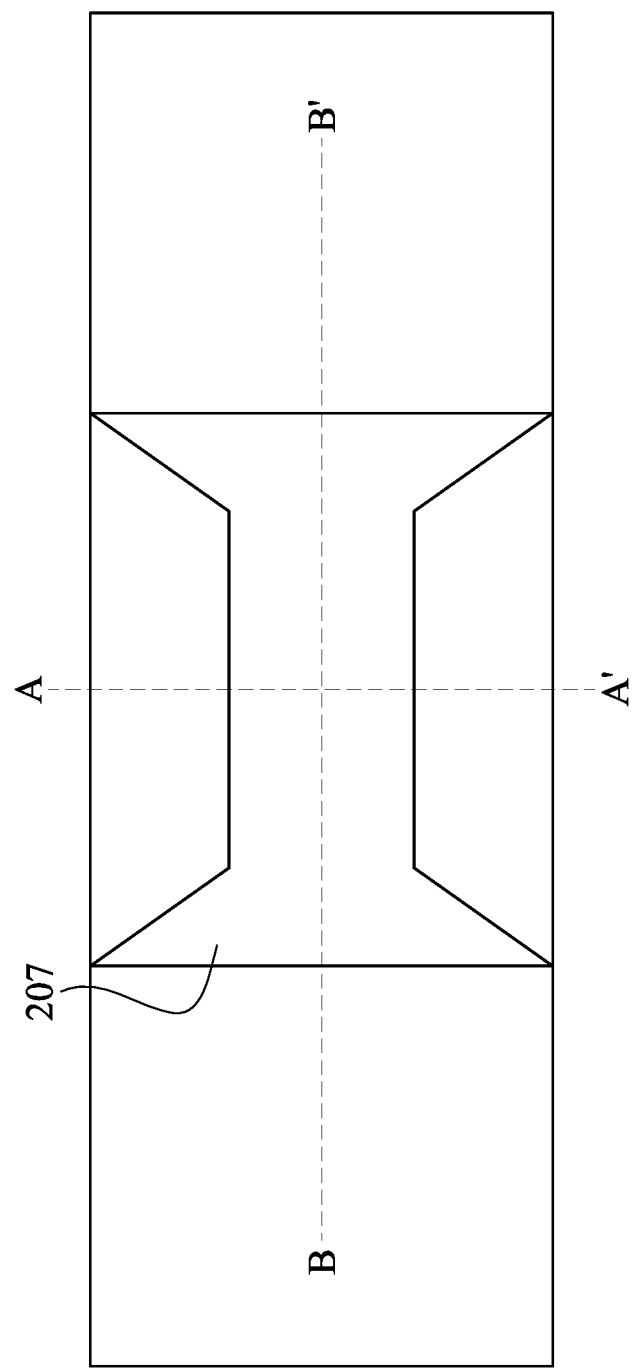
Figures 26B, 26C:
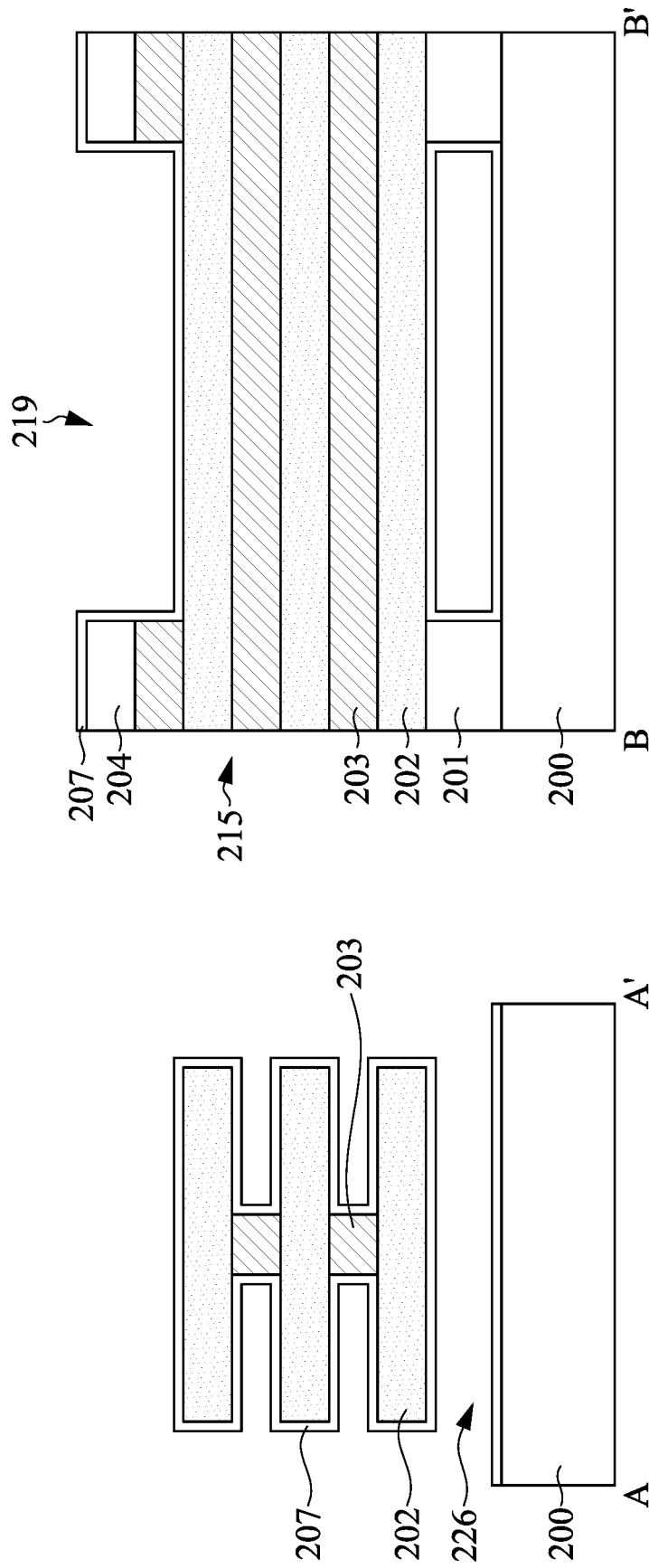

In FIGS. 25A-25B, the protective layer 222 is removed. In some embodiments where the protective layer 222 is a chloride layer, the protective layer 222 can be removed using an isopropyl alcohol (IPA) rinse because the chloride layer has high solubility in IPA. The first metal oxide-based semiconductor layers 202 and the etched second metal oxide-based semiconductor layers 203 have a tree-like cross-section (e.g., in cross-section A-A') and thus the GAA FET 20 is also called a tree-FET. The etched metal oxide-based semiconductor layers 203 are beneficial for providing extra on current.

A high-k/metal gate structure is then formed. For example, in FIGS. 26A-26B, a gate dielectric layer 207 is formed (e.g., conformally) in the gate trench 219. The gate dielectric layer 207 surrounds at least three sides of the first metal oxide-based semiconductor layers 202 and at least two sides of the second metal oxide-based semiconductor layers 204, and extends along an upper surface of the substrate 200. The composition and the formation method of the gate dielectric layer 207 are similar to the composition and the formation method of the gate dielectric layer 107 with regard to FIGS. 7A-7C, and the description thereof is omitted herein.

In an alternative embodiment, an interfacial layer (not shown) is deposited between the gate dielectric layer 207 and the second metal oxide-based semiconductor layers 203 and between the gate dielectric layer 207 and the first metal oxide-based semiconductor layers 202 and is formed of silicon oxide or silicon oxynitride grown by a thermal oxidation process. For example, the interfacial layer can be grown by a rapid thermal oxidation (RTO) process or by an annealing process using oxygen.

Figure 27A:
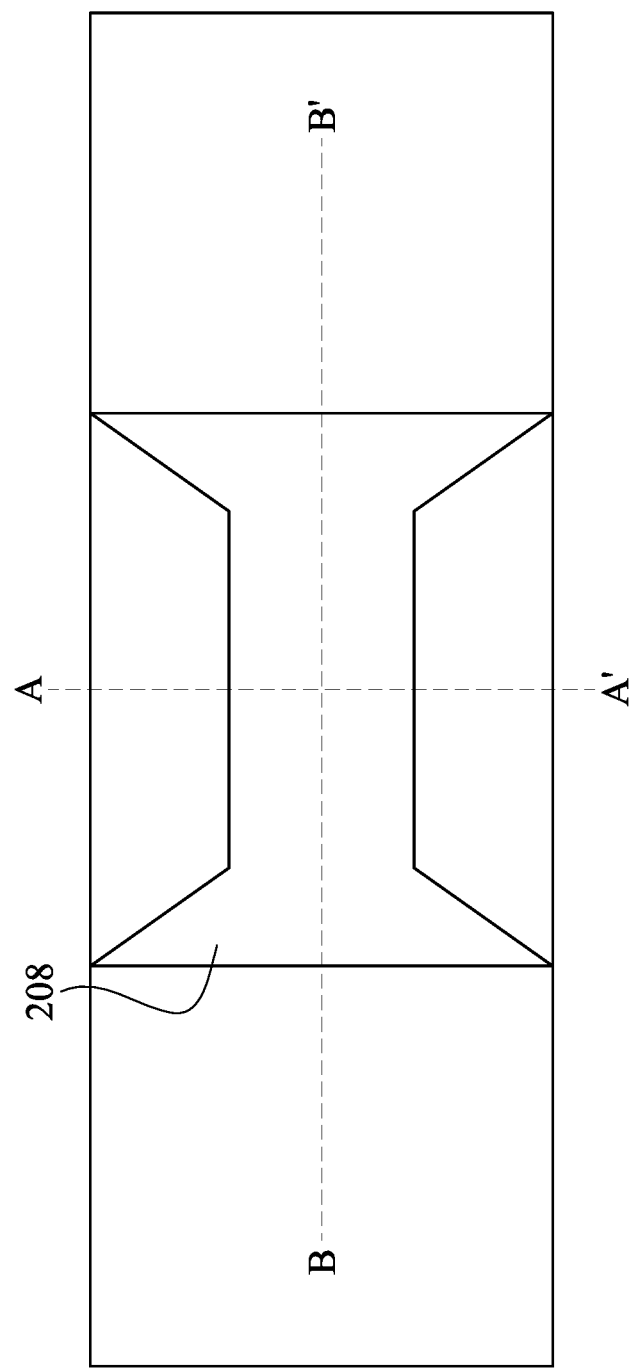
Figures 27B, 27C:
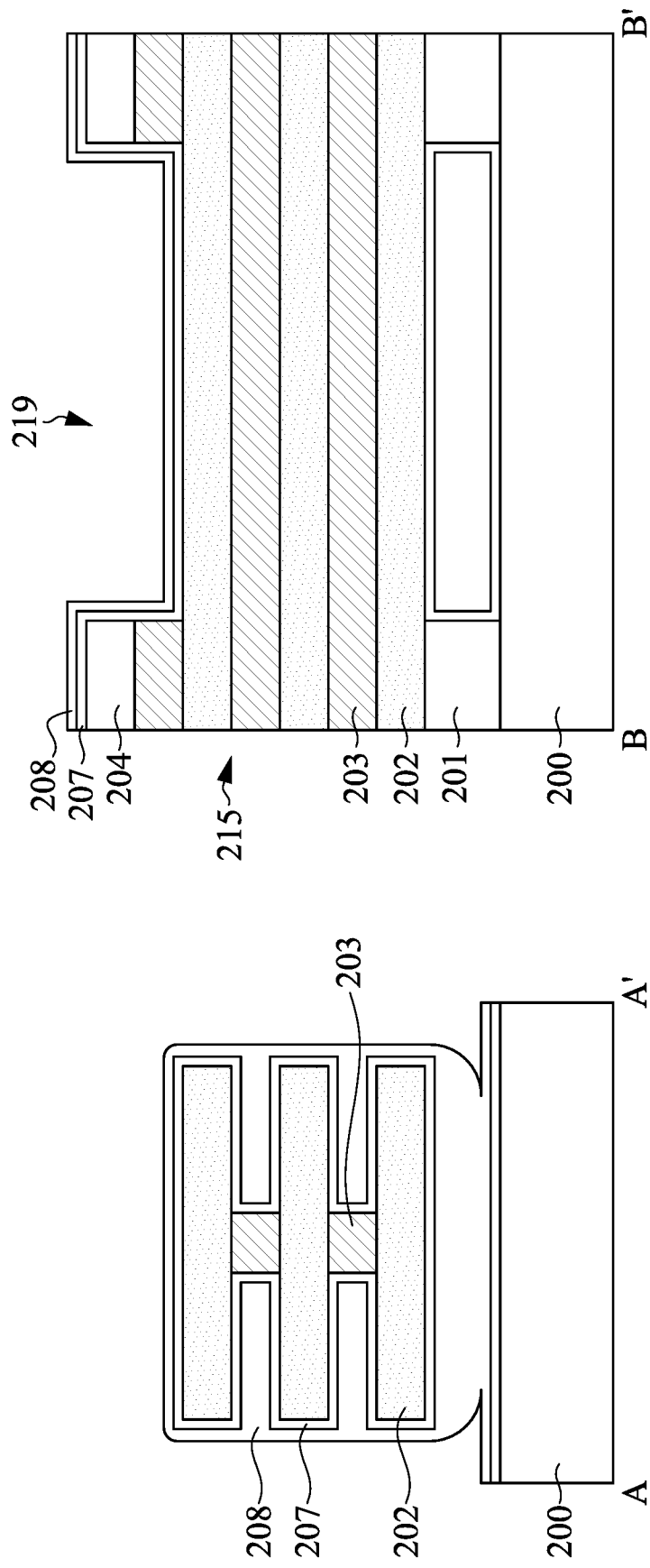

Referring to FIGS. 27A-27C, next, a first gate metal 208 is formed in the gate trench 219, the sidewall recesses 218 and the gap 226. The first gate metal 208 lines the gate trench 219 and fills remaining portions of the sidewall recesses 218 and the gap 226. The first gate metal 208 includes titanium nitride and may be deposited to surround each of the first metal oxide-based semiconductor layers 202 and extend along sidewalls of the second metal oxide-based semiconductor layers 203 by ALD in some embodiments. The first gate metal 208 may have a thickness in a range from 1 nm to 1 μm. A portion of the first gate metal 208 is formed vertically between adjacent first metal oxide-based semiconductor layers 202 and fills the gap 226 between the bottommost one of the first metal oxide-based semiconductor layers 202 and the substrate 200. The first gate metal 208 may have a composition similar to the composition of the first gate metal 108 and the description thereof is omitted herein.

Figure 28A:
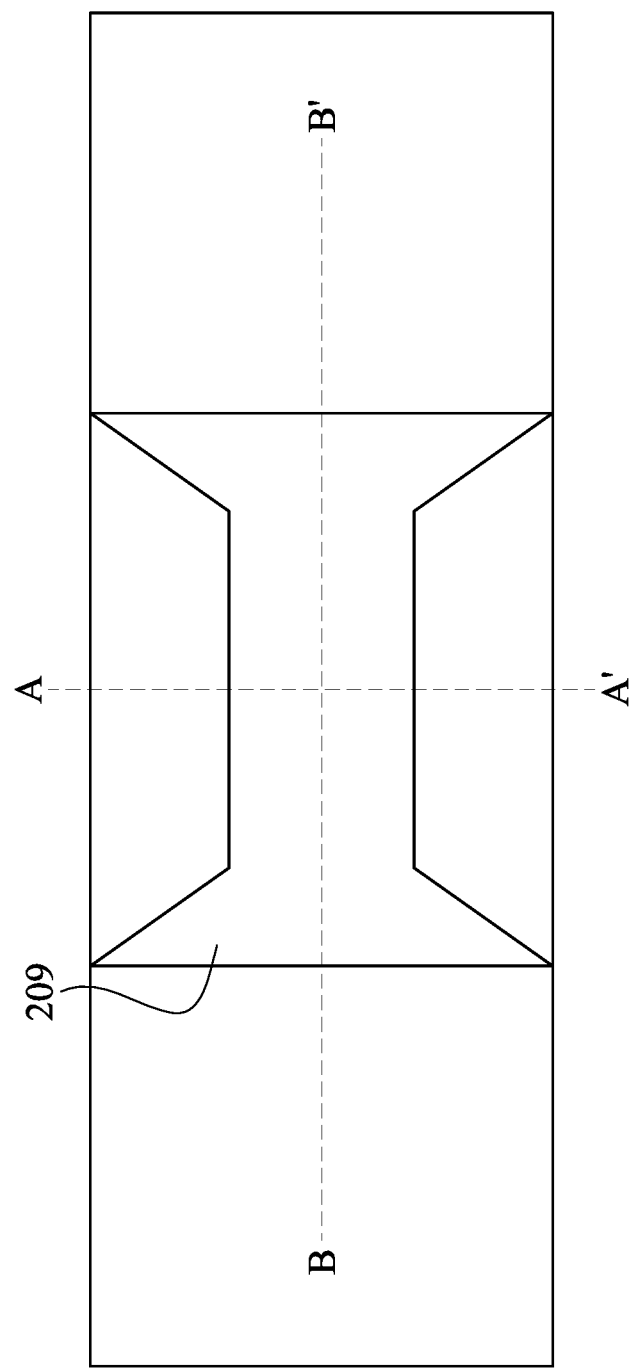
Figure 28C:
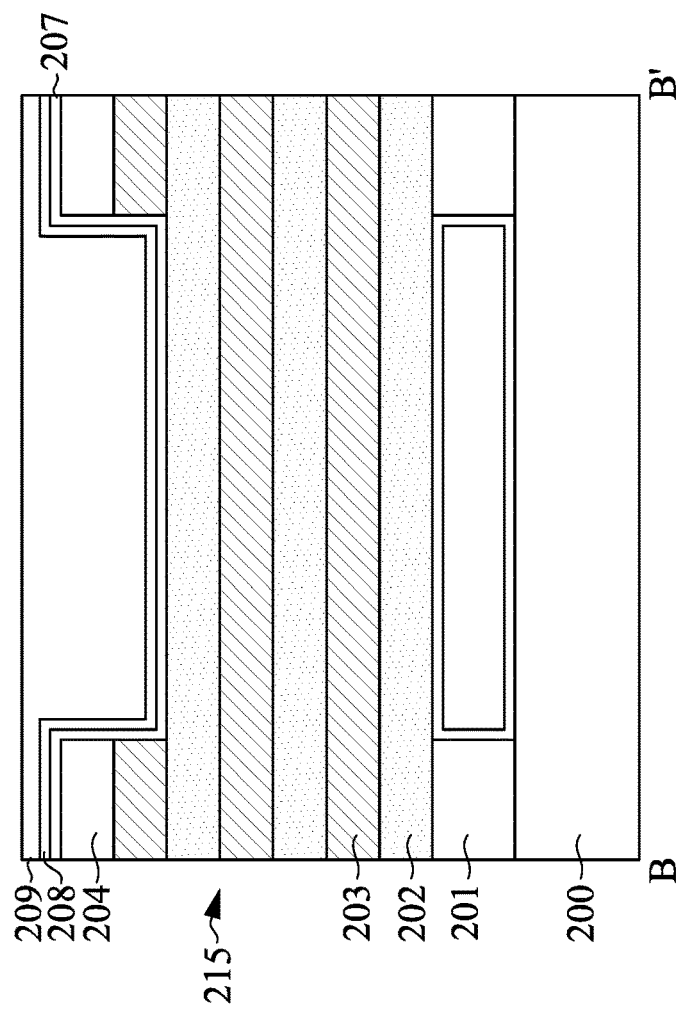
Figure 28B:
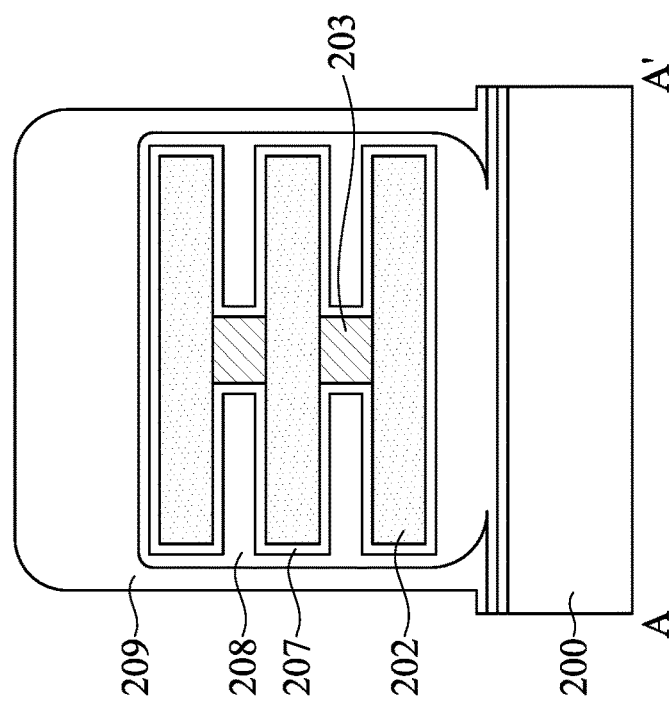

Referring to FIGS. 28A-28B, a second gate metal 209 is formed over the first gate metal 208. The second gate metal 209 fills a remaining portion of the gate trench 219. The second gate metal 209 may have a composition similar to the composition of the second gate metal 209 and the description thereof is omitted herein.

Figure 29A:
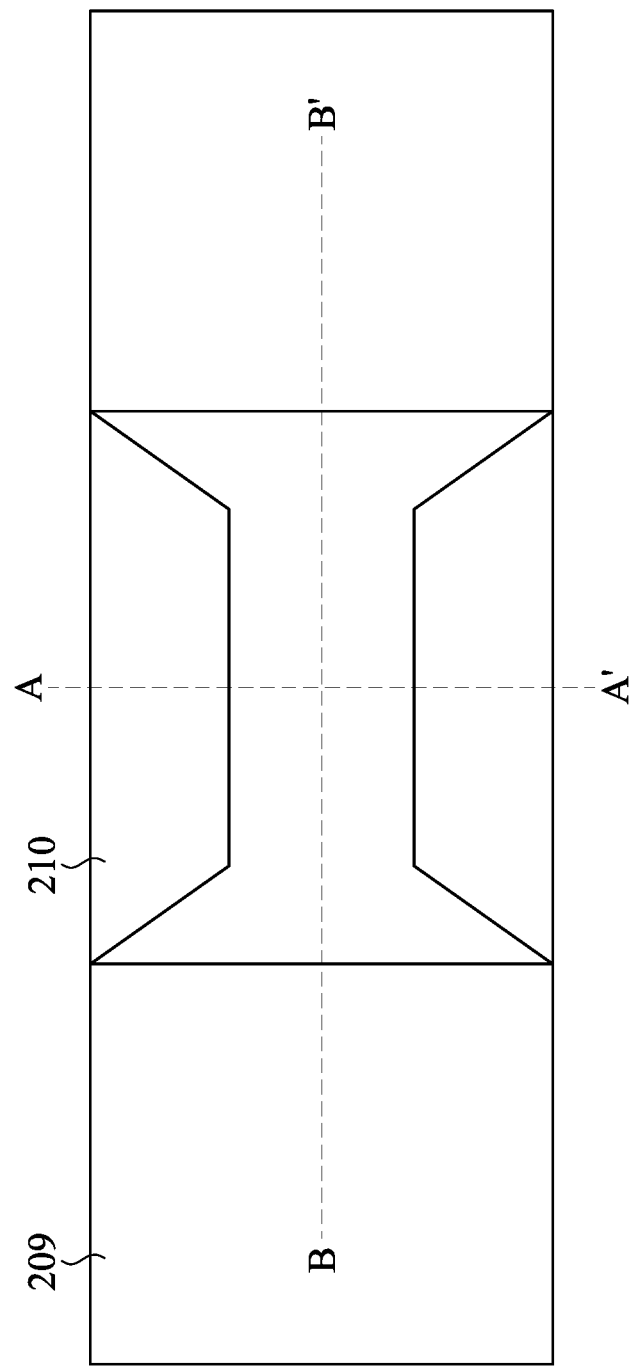
Figure 29C:
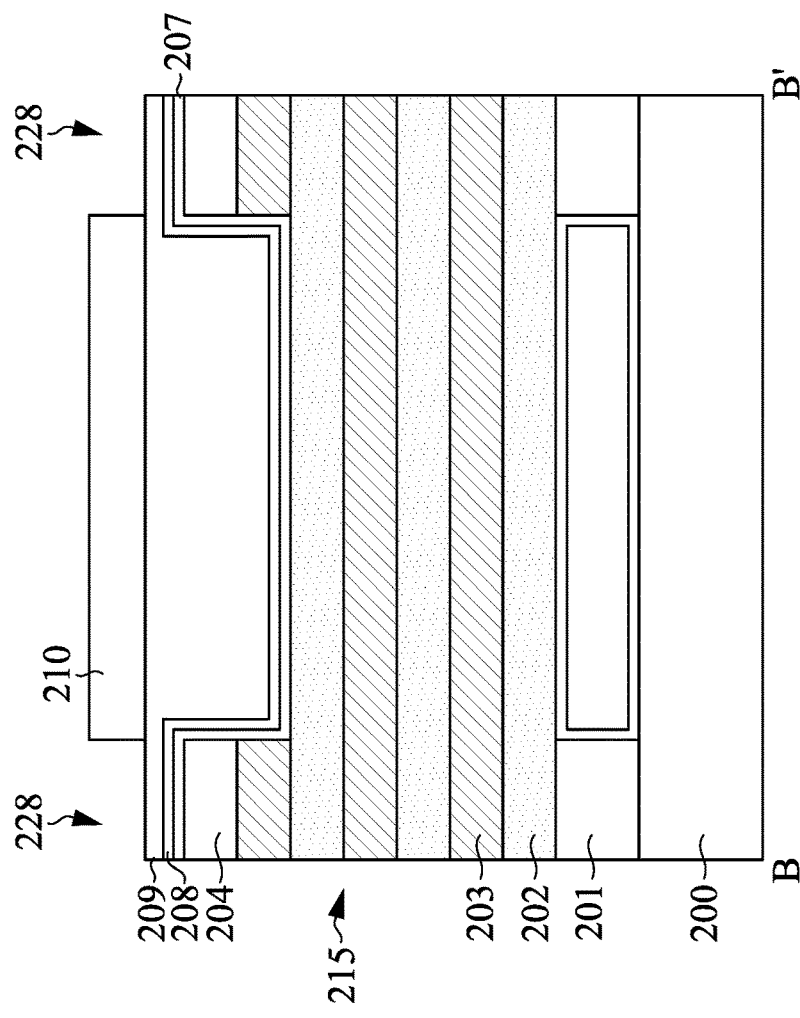
Figure 29B:
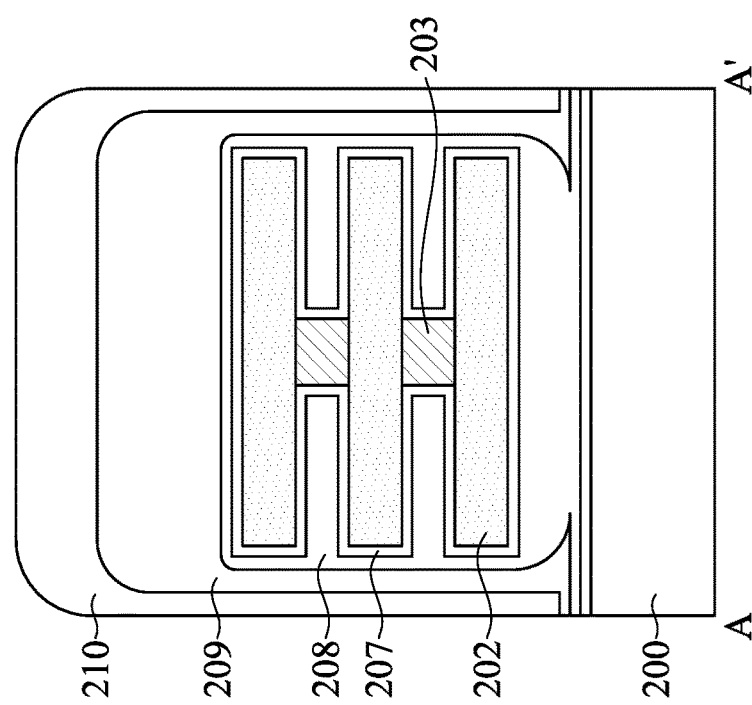

In FIGS. 29A-29B, a photoresist 210 or other masks including $SiN_x$ (not separately illustrated) is formed over the second gate metal 209. The photoresist 210 can be formed by using a spin-on technique and can be patterned using acceptable photolithography techniques, forming openings 228 in the photoresist 210. The second gate metal 209 is exposed by the openings 222.

Figure 30A:
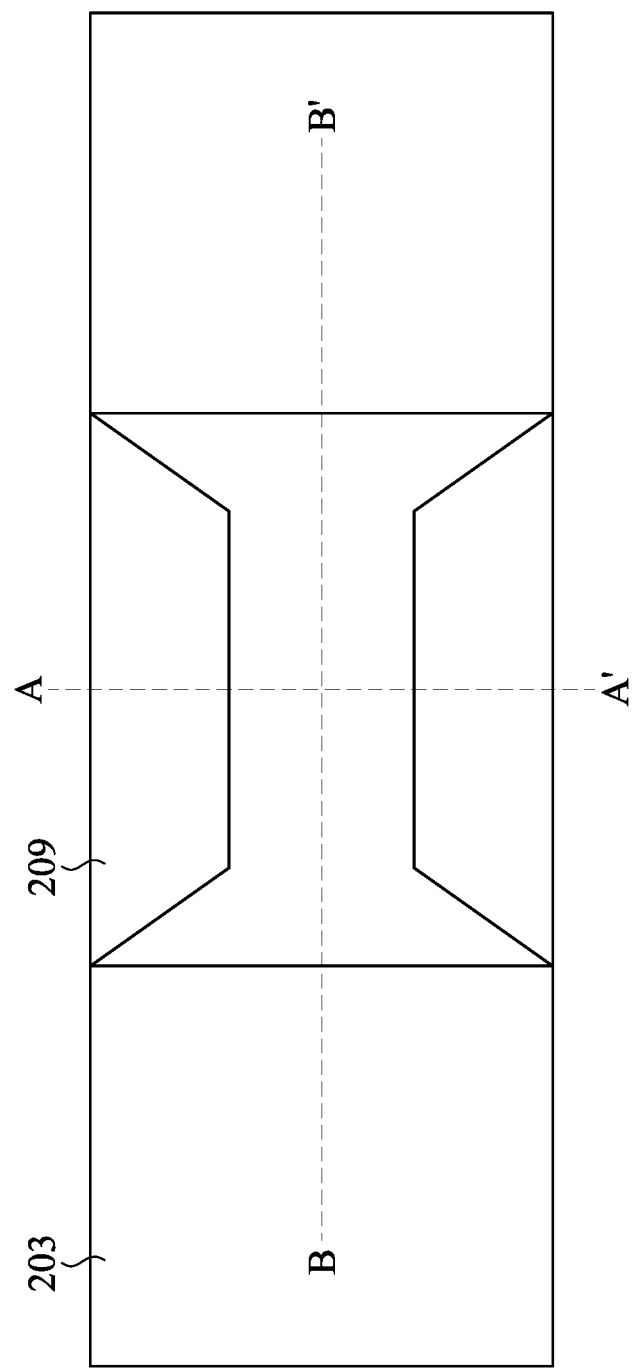
Figure 30C:
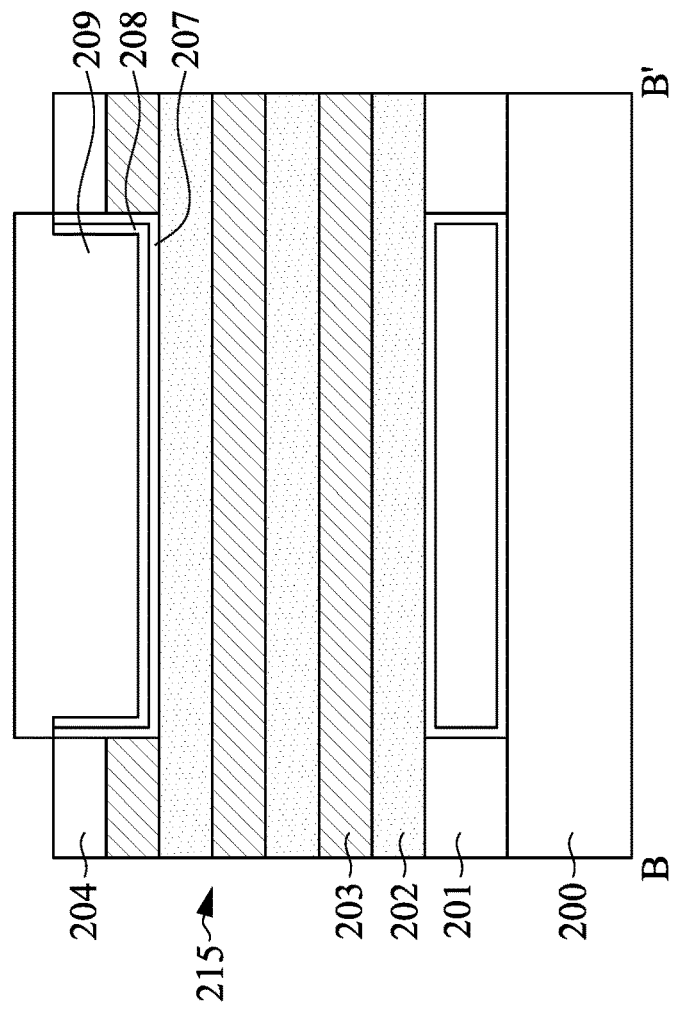
Figure 30B:
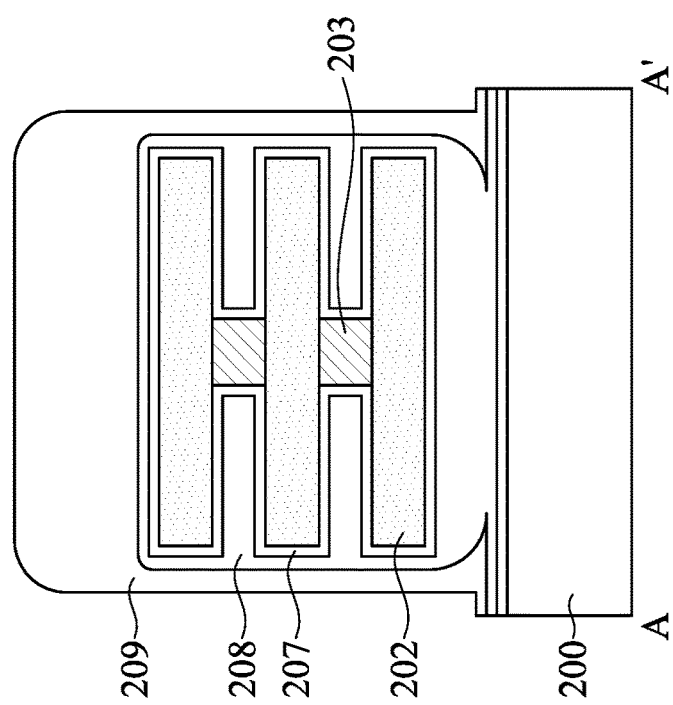

The second gate metal 209, the first gate metal 208 and the gate dielectric layer 207 are removed through the openings 228 by an etch process such that the underlying capping layer 204 is exposed, as shown in FIGS. 30A-30C. The photoresist 210 may then be removed, such as by an acceptable ashing process.

Figure 31A:
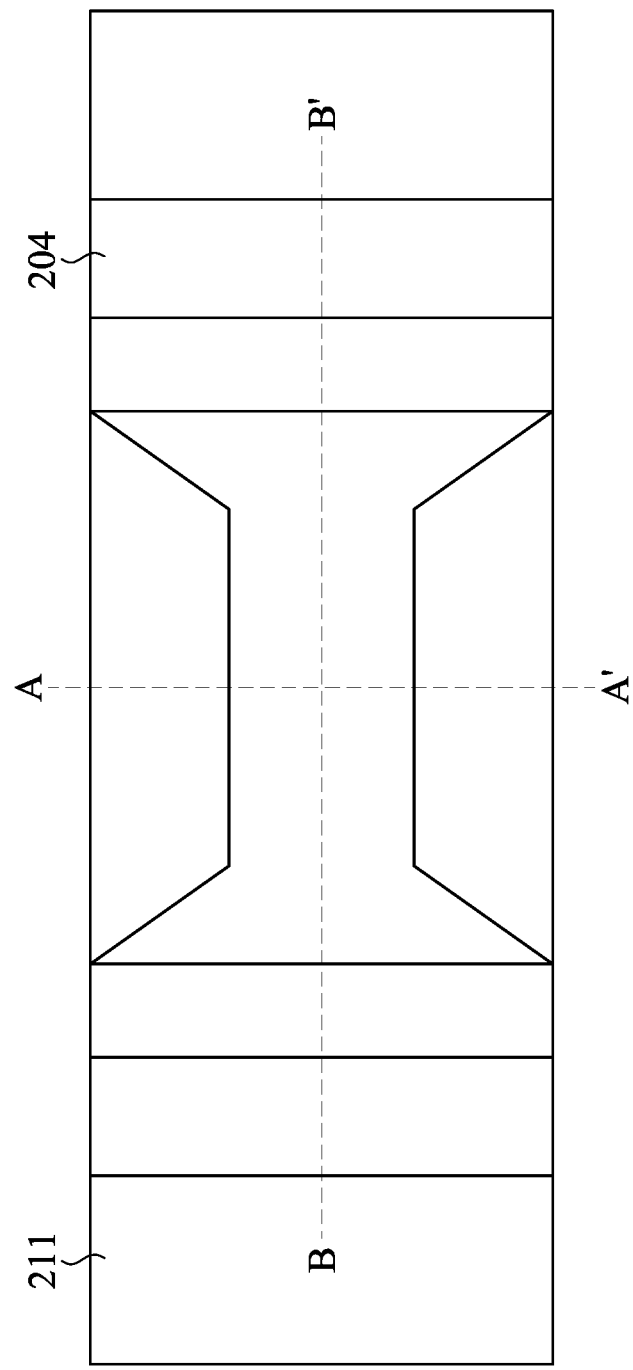
Figure 31C:
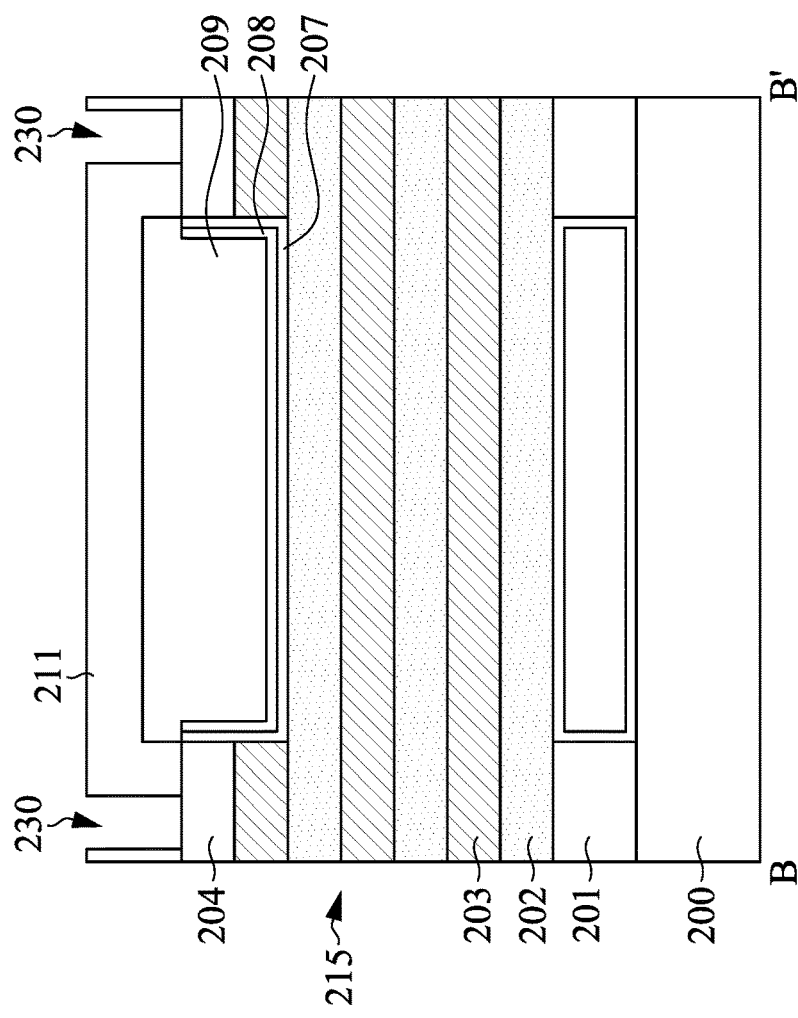
Figure 31B:
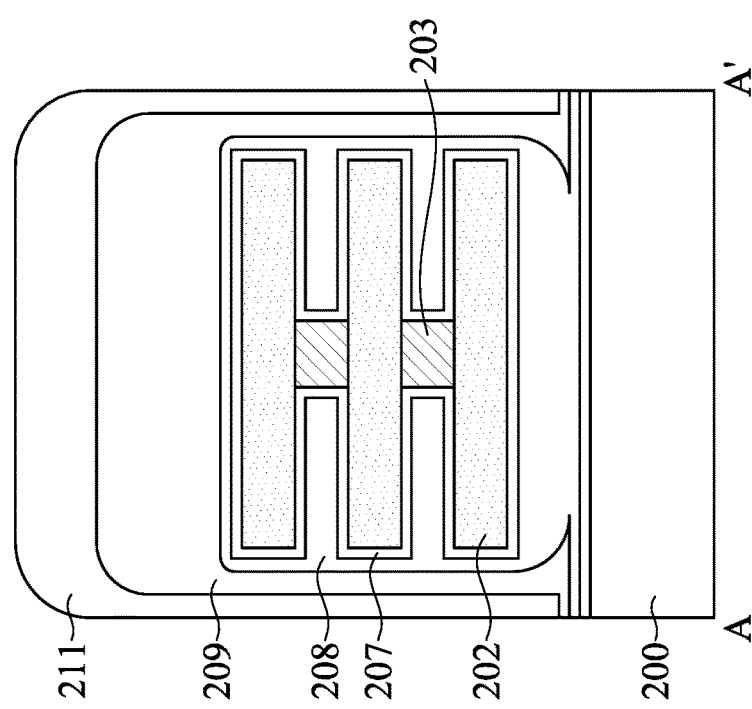

In FIGS. 31A-31C, a photoresist 211 or other masks including $SiN_x$ (not separately illustrated) is formed over the second gate metal 209 and the capping layer 204. The photoresist 211 can be formed by using a spin-on technique and can be patterned using acceptable photolithography techniques, forming openings 230 in the photoresist 211. The capping layer 204 is exposed by the openings 230.

Figure 32A:
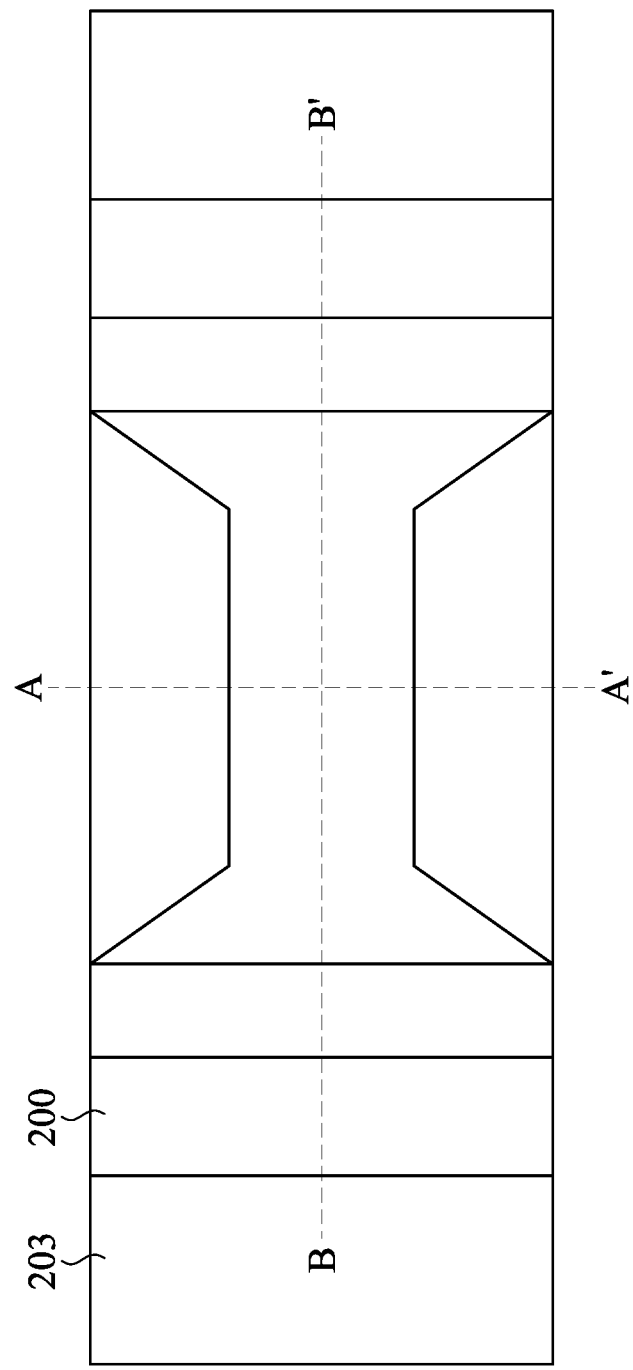
Figure 32C:
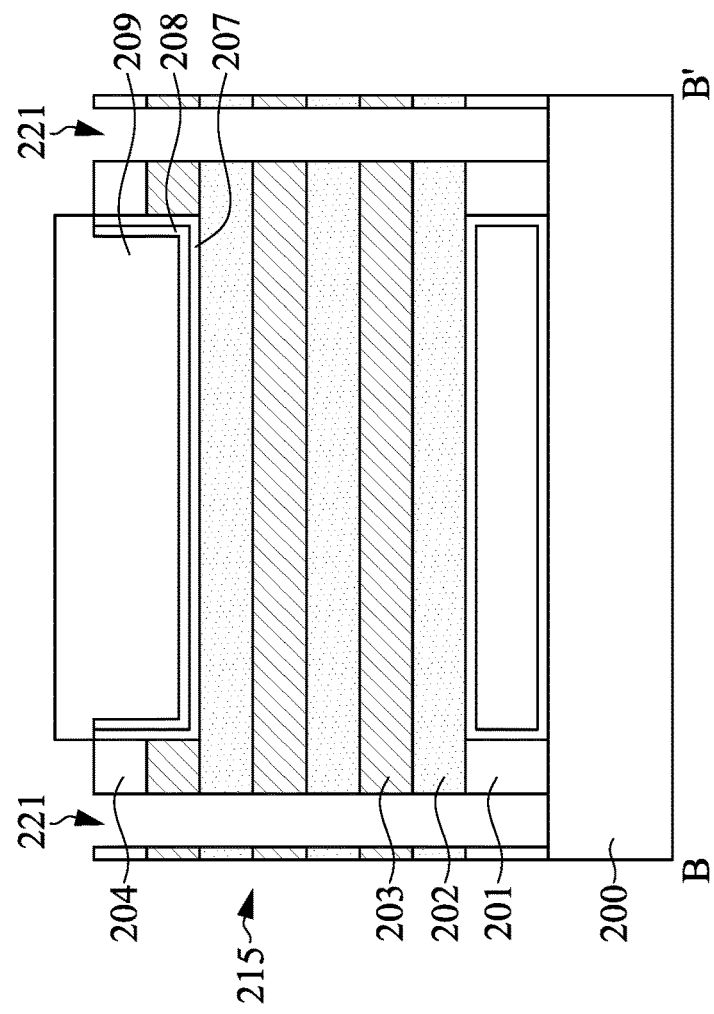
Figure 32B:
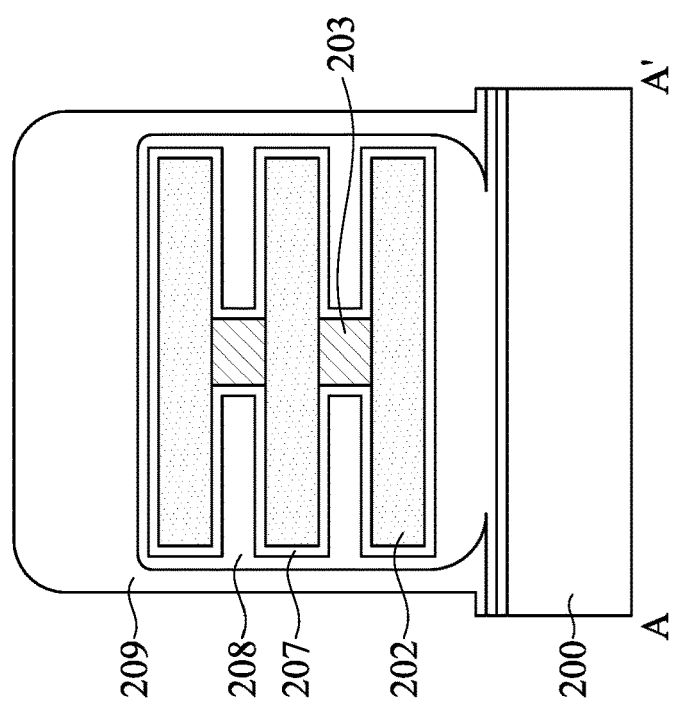

In FIGS. 32A-32C, the capping layer 204, the fin structure 215 and the sacrificial layer 201 are etched through the openings 230 by an etch process such that the underlying substrate 200 is exposed, forming trenches 221. After etching the fin structure 215 and the sacrificial layer 201, the photoresist 211 may be removed, such as by an acceptable ashing process.

Figure 33A:
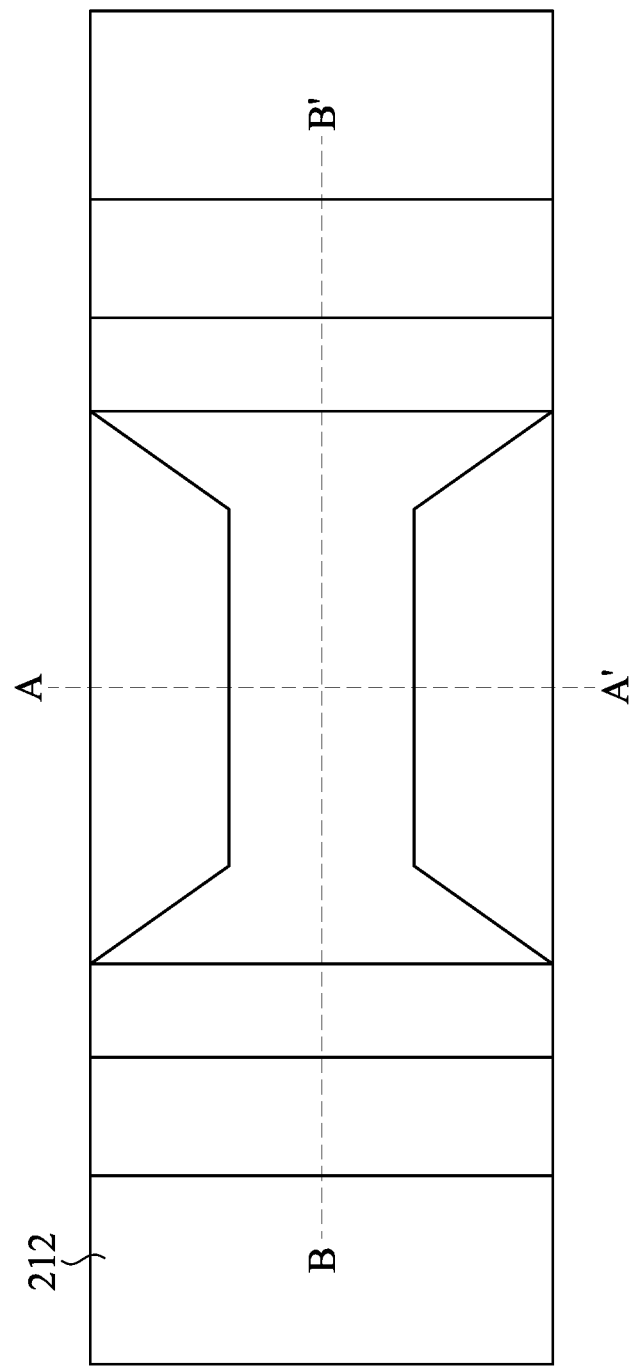

In FIGS. 33A-33C, a conductive material 212 is deposited on the second gate metal 209, the first gate metal 208, the gate dielectric layer 207 and the capping layer 204 and fills the trenches 221 (see FIG. 32C). In some embodiments, the conductive material 212 may include titanium nitride, tungsten, or the like and have a thickness in a range from 1 nm to 1 μm.

Figure 34A:
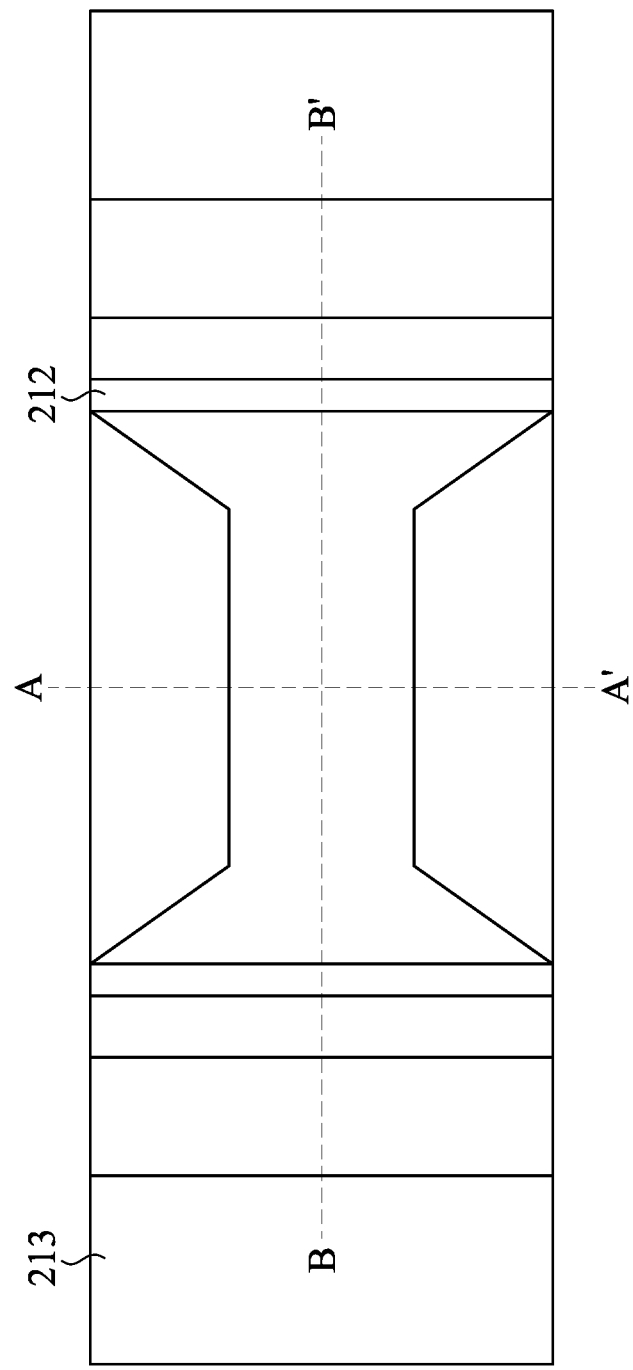
Figures 34B, 34C:
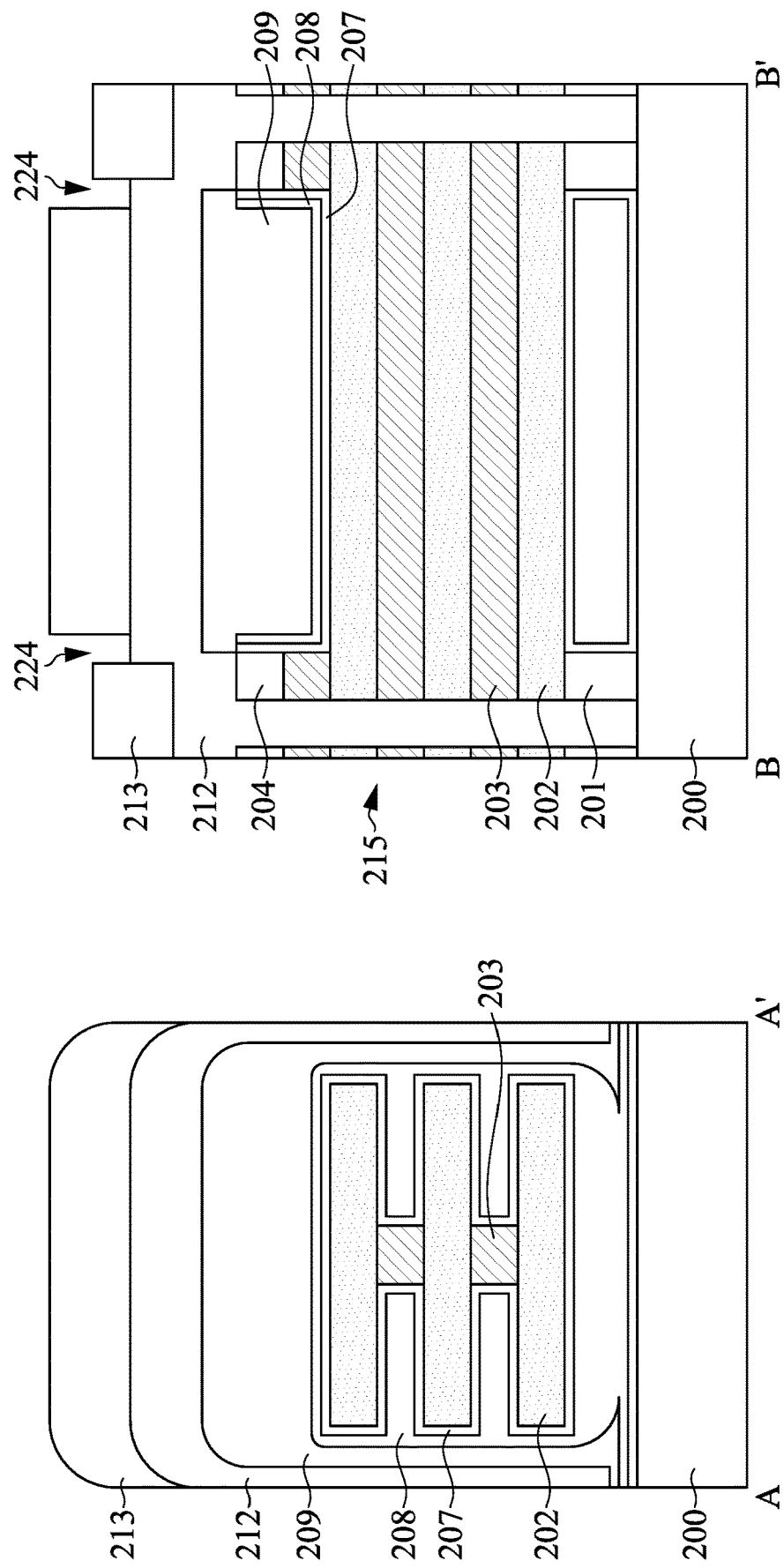

In FIGS. 34A-34C, a photoresist 213 or other masks including $SiN_x$ (not separately illustrated) is formed over the conductive material 212. The photoresist 213 can be formed by using a spin-on technique and can be patterned using acceptable photolithography techniques, forming openings 224 in the photoresist 213.

Figure 35A:
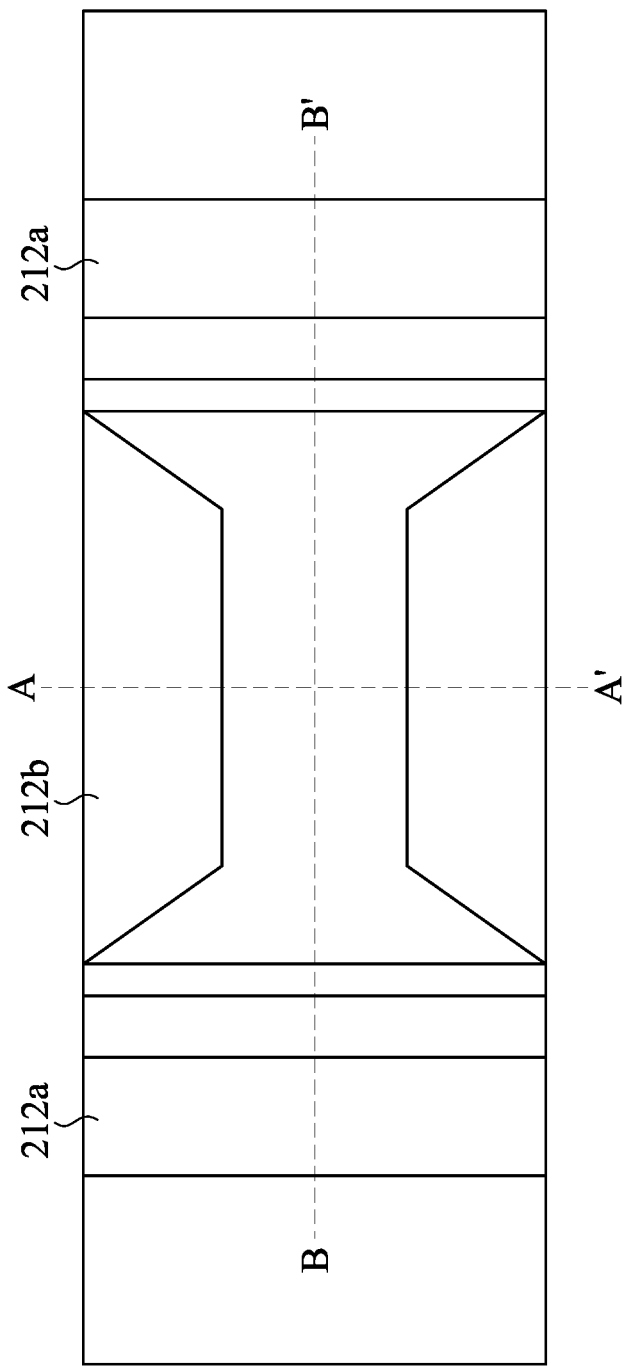
Figure 35C:
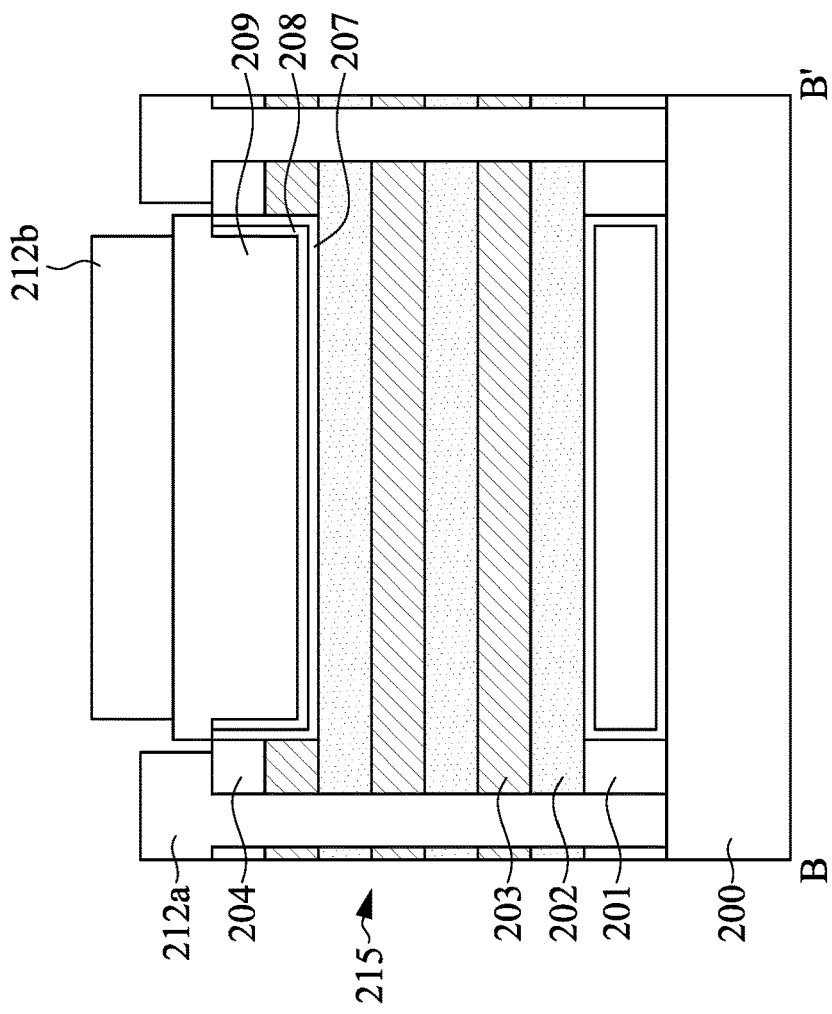
Figure 35B:
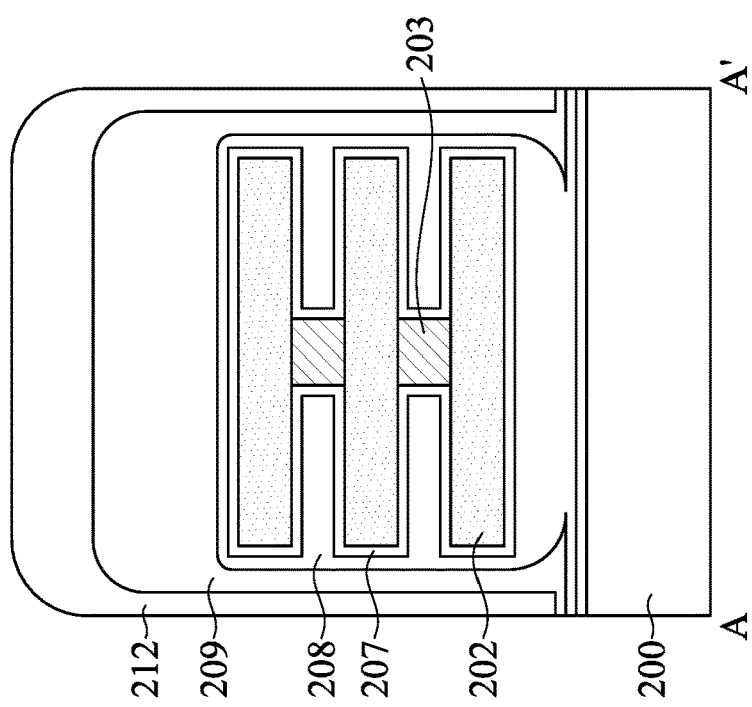

In FIGS. 35A-35C, the conductive material 212 is etched through the openings 224 to expose the capping layer 204, the gate dielectric layer 207 and the first gate metal 208, forming source/drain electrodes 212a and a gate electrode 212b. In particular, the conductive material 112 can form ohmic contact with opposite sides of the metal oxide-based semiconductor layers 202 and 203, and thus opposite sides of the metal oxide-based semiconductor layers 202 and 203 can serve as source/drain regions without n-type or p-type dopant as required in bulk silicon of CMOS transistors.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that, by using semiconductor oxide-based channel layer, GAA transistors can have increased on-current ($I_{on}$). Another advantage is that semiconductor oxide-based channel layer has lower processing temperature and thus is easier to fabricate as back-end transistors over front-end transistors (e.g., CMOS transistors formed on substrate) without negatively influencing the front-end transistors.

In some embodiments, a method including forming a fin over a substrate, the fin comprising alternately stacking first oxide-based semiconductor layers and second oxide-based semiconductor layers, removing the second oxide-based semiconductor layers to form a plurality of spaces each between corresponding ones of the first oxide-based semiconductor layers, and depositing in sequence a gate dielectric layer and a gate metal into the plurality of spaces each between corresponding ones of the second oxide-based semiconductor layers. In some embodiments, the first oxide-based semiconductor layers are nitrogen-doped IGZO, and the second oxide-based semiconductor layers are nitrogen-free IGZO. In some embodiments, removing the second oxide-based semiconductor layers includes performing a wet etch process using an etchant including a mixture of buffered oxide etch (BOE) and de-ionized (DI) water. In some embodiments, the first oxide-based semiconductor layers include IGZO, and the second oxide-based semiconductor layers include ZnO. In some embodiments, removing the second oxide-based semiconductor layers comprises performing a wet etch process using an oxalic acid-containing etchant. In some embodiments, removing the second oxide-based semiconductor layers comprises performing a wet etch process using a formic acid-containing etchant. In some embodiments, the first oxide-based semiconductor layers include IGZO, and the second oxide-based semiconductor layers include IZO. In some embodiments, removing the second oxide-based semiconductor layers comprises performing a wet etch process using an etchant including a mixture of formic acid and de-ionized water.

In some embodiments, a method comprising alternately depositing first oxide-based semiconductor layers and second oxide-based semiconductor layers on a substrate, patterning the first oxide-based semiconductor layers and the second oxide-based semiconductor layers to form a fin, performing an etching process to etch the second oxide-based semiconductor layers, and after performing the etching process, depositing in sequence a gate dielectric layer and a gate metal surrounding the first oxide-based semiconductor layers. In some embodiments, after the etching process stops, portions of the second oxide-based semiconductor layers remain. In some embodiments, the method further comprises depositing a silicon oxide layer on the substrate prior to alternately depositing the first oxide-based semiconductor layers and the second oxide-based semiconductor layers, and the etching process also etches the silicon oxide layer. In some embodiments, after the etching process stops, a remaining portion of the silicon oxide layer has a width greater than a width of the remaining portions of the second oxide-based semiconductor layers. In some embodiments, the method further comprises performing a surface treatment using chlorine-containing gas to form a chloride layer surrounding the first oxide-based semiconductor layers. In some embodiments, the method further comprises after performing the surface treatment, removing the silicon oxide layer. In some embodiments, the chloride layer also surrounds the remaining portions of the etched second oxide-based semiconductor layers. In some embodiments, the silicon oxide layer is removed using fluorine-containing gas. In some embodiments, the method further comprises removing the chloride layer using an isopropyl alcohol (IPA) rinse. In some embodiments, alternately depositing the first oxide-based semiconductor layers and the second oxide-based semiconductor layers comprises depositing one of the first oxide-based semiconductor layers by sputtering IGZO in an $Ar/O_2/N_2$ gas mixture ambient and depositing one of the second oxide-based semiconductor layers by sputtering IGZO in an $Ar/O_2$ gas mixture ambient.

In some embodiments, a semiconductor device comprises a plurality of first oxide-based semiconductor layers and a gate structure. The plurality of first oxide-based semiconductor layers extends in a first direction above a substrate and arranged in a second direction substantially perpendicular to the substrate. The gate structure extends in a third direction perpendicular to both the first and second directions, wherein the gate structure comprises a high-k gate dielectric layer surrounding the plurality of first oxide-based semiconductor layers and a gate metal over the high-k gate dielectric layer. In some embodiments, the semiconductor device further comprises a second oxide-based semiconductor layer between adjacent two of the plurality of first oxide-based semiconductor layers. The plurality of first oxide-based semiconductor layers includes nitrogen-containing IGZO, and the second oxide-based semiconductor layer is nitrogen-free IGZO.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a fin over a substrate, the fin comprising alternately stacking first oxide-based semiconductor layers and second oxide-based semiconductor layers;
   removing the second oxide-based semiconductor layers to form a plurality of spaces each between corresponding ones of the first oxide-based semiconductor layers; and
   depositing in sequence a gate dielectric layer and a gate metal into the plurality of spaces each between corresponding ones of the second oxide-based semiconductor layers.

2. The method of claim 1, wherein the first oxide-based semiconductor layers are nitrogen-doped IGZO, and the second oxide-based semiconductor layers are nitrogen-free IGZO.

3. The method of claim 2, wherein removing the second oxide-based semiconductor layers comprises:
   performing a wet etch process using an etchant including a mixture of buffered oxide etch (BOE) and de-ionized (DI) water.

4. A method, comprising:
   alternately depositing first oxide-based semiconductor layers and second oxide-based semiconductor layers on a substrate;
   patterning the first oxide-based semiconductor layers and the second oxide-based semiconductor layers to form a fin;
   performing an etching process to etch the second oxide-based semiconductor layers; and
   after performing the etching process, depositing in sequence a gate dielectric layer and a gate metal surrounding the first oxide-based semiconductor layers.

5. The method of claim 4, wherein after the etching process stops, portions of the second oxide-based semiconductor layers remain.

6. The method of claim 5, further comprising:
   depositing a silicon oxide layer on the substrate prior to alternately depositing the first oxide-based semiconductor layers and the second oxide-based semiconductor layers, and the etching process also etches the silicon oxide layer.

7. The method of claim 6, wherein after the etching process stops, a remaining portion of the silicon oxide layer has a width greater than a width of the remaining portions of the second oxide-based semiconductor layers.

8. The method of claim 6, further comprising:
   performing a surface treatment using chlorine-containing gas to form a chloride layer surrounding the first oxide-based semiconductor layers.

9. The method of claim 8, further comprising:
   after performing the surface treatment, removing the silicon oxide layer.

10. The method of claim 8, wherein the chloride layer also surrounds the remaining portions of the etched second oxide-based semiconductor layers.

11. The method of claim 10, wherein the silicon oxide layer is removed using fluorine-containing gas.

12. The method of claim 8, further comprising:
    removing the chloride layer using an isopropyl alcohol (IPA) rinse.

13. The method of claim 4, wherein alternately depositing the first oxide-based semiconductor layers and the second oxide-based semiconductor layers comprises:
    depositing one of the first oxide-based semiconductor layers by sputtering IGZO in an $Ar/O_2/N_2$ gas mixture ambient; and
    depositing one of the second oxide-based semiconductor layers by sputtering IGZO in an $Ar/O_2$ gas mixture ambient.

14. A method, comprising:
    forming a plurality of first oxide-based semiconductor layers extending in a first direction above a substrate and arranged in a second direction substantially perpendicular to the substrate;
    forming a second oxide-based semiconductor layer between adjacent two of the plurality of first oxide-based semiconductor layers, wherein the plurality of first oxide-based semiconductor layers include nitrogen-containing IGZO, and the second oxide-based semiconductor layer is nitrogen-free IGZO; and
    forming a gate structure extending in a third direction perpendicular to both the first and second directions, wherein the gate structure comprises:
      a high-k gate dielectric layer surrounding the plurality of first oxide-based semiconductor layers; and
      a gate metal over the high-k gate dielectric layer.

15. The method of claim 14, wherein the second oxide-based semiconductor layer has a width different from a width of each of the plurality of first oxide-based semiconductor layers.

16. The method of claim 14, wherein the second oxide-based semiconductor layer has a width greater than a width of each of the plurality of first oxide-based semiconductor layers.

17. The method of claim 14, wherein the high-k gate dielectric layer surrounds the second oxide-based semiconductor layer.

18. The method of claim 14, wherein the gate metal has a topmost surface higher than a topmost surface of the high-k gate dielectric layer.

19. The method of claim 14, wherein the gate metal is titanium nitride.

20. The method of claim 14, further comprising:
    a conductive material surrounding the gate metal, wherein the conductive material comprises titanium nitride, tungsten, or a combination thereof.

* * * * *